United States Patent
Yon et al.

(10) Patent No.: US 10,658,375 B2
(45) Date of Patent: *May 19, 2020

(54) THREE-DIMENSIONAL SEMICONDUCTOR MEMORY DEVICE AND METHOD OF FABRICATING THE SAME

(71) Applicant: Samsung Electronics Co., Ltd., Suwon-si, Gyeonggi-do (KR)

(72) Inventors: Gukhyon Yon, Hwaseong-si (KR); Dongwoo Kim, Incheon (KR); Kihyun Hwang, Seongnam-si (KR); Dongkyum Kim, Suwon-si (KR); Dongchul Yoo, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/975,861

(22) Filed: May 10, 2018

(65) Prior Publication Data

US 2018/0261626 A1 Sep. 13, 2018

Related U.S. Application Data

(63) Continuation of application No. 14/708,477, filed on May 11, 2015, now Pat. No. 9,997,530.

(30) Foreign Application Priority Data

Jun. 23, 2014 (KR) .................. 10-2014-0076514

(51) Int. Cl.
*H01L 27/11582* (2017.01)
*H01L 27/11573* (2017.01)
(Continued)

(52) U.S. Cl.
CPC .. *H01L 27/11582* (2013.01); *H01L 27/11556* (2013.01); *H01L 27/11573* (2013.01);
(Continued)

(58) Field of Classification Search
CPC ......... H01L 27/11582; H01L 27/11578; H01L 27/11556
See application file for complete search history.

(56) References Cited

U.S. PATENT DOCUMENTS

| 5,716,864 A | 2/1998 | Abe |
| 6,100,568 A | 8/2000 | Lage |

(Continued)

FOREIGN PATENT DOCUMENTS

| KR | 10-0512169 B1 | 9/2005 |
| KR | 1020060088637 A | 8/2006 |
| KR | 10-0645572 B1 | 11/2006 |

*Primary Examiner* — Thao X Le
*Assistant Examiner* — Xia L Cross
(74) *Attorney, Agent, or Firm* — Myers Bigel, P.A.

(57) ABSTRACT

A three-dimensional semiconductor memory device includes a peripheral circuit structure on a substrate, a horizontal active layer on the peripheral circuit structure, stacks provided on the horizontal active layer to include a plurality of electrodes, a vertical structure vertically penetrating the stacks, a common source region between ones of the stacks and in the horizontal active layer, and pick-up regions in the horizontal active layer. The horizontal active layer includes first, second, and third active semiconductor layers sequentially stacked on the peripheral circuit structure. The first and third active semiconductor layers are doped to have high and low impurity concentrations, respectively, and the second active semiconductor layer includes an impurity diffusion restraining material.

12 Claims, 34 Drawing Sheets

(51) Int. Cl.
  *H01L 27/24* (2006.01)
  *H01L 27/11578* (2017.01)
  *H01L 27/11556* (2017.01)
  *H01L 27/11575* (2017.01)
  *H01L 45/00* (2006.01)

(52) U.S. Cl.
  CPC .. *H01L 27/11575* (2013.01); *H01L 27/11578* (2013.01); *H01L 27/249* (2013.01); *H01L 27/2436* (2013.01); *H01L 45/04* (2013.01); *H01L 45/06* (2013.01); *H01L 45/1226* (2013.01); *H01L 45/144* (2013.01); *H01L 45/146* (2013.01); *H01L 45/147* (2013.01); *H01L 2924/0002* (2013.01)

(56) References Cited

U.S. PATENT DOCUMENTS

| | | |
|---|---|---|
| 6,351,406 B1 | 2/2002 | Johnson et al. |
| 7,049,248 B2 | 5/2006 | Lee et al. |
| 7,393,748 B2 | 7/2008 | Arai et al. |
| 1,010,144 A1 | 5/2011 | Huo et al. |
| 8,212,233 B2 | 7/2012 | Wang et al. |
| 8,288,222 B2 | 10/2012 | Gluschenkov et al. |
| 8,324,680 B2 | 12/2012 | Izumi et al. |
| 8,426,284 B2 | 4/2013 | Yen et al. |
| 8,598,644 B2 | 12/2013 | Sakamoto |
| 2008/0304308 A1 | 12/2008 | Stipe |
| 2010/0289084 A1 | 11/2010 | Yoon et al. |
| 2012/0112171 A1* | 5/2012 | Hattori ............... H01L 27/1157 257/40 |
| 2012/0112260 A1 | 5/2012 | Kim et al. |
| 2012/0146125 A1* | 6/2012 | Kim ................ H01L 27/11524 257/321 |
| 2013/0056818 A1* | 3/2013 | Iino ..................... H01L 27/1157 257/324 |
| 2013/0094294 A1* | 4/2013 | Kwak ................ H01L 27/1157 365/185.03 |
| 2014/0021525 A1 | 1/2014 | Masuoka |
| 2014/0071758 A1 | 3/2014 | Maejima |

* cited by examiner

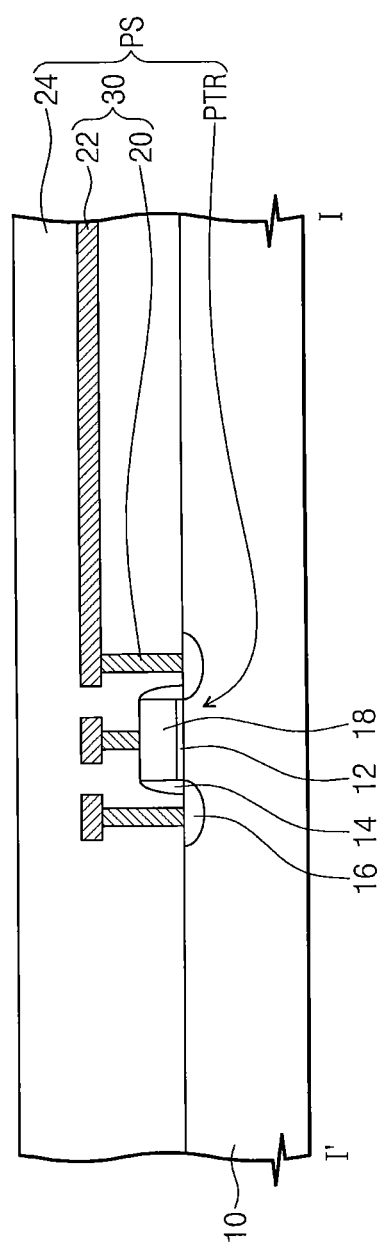

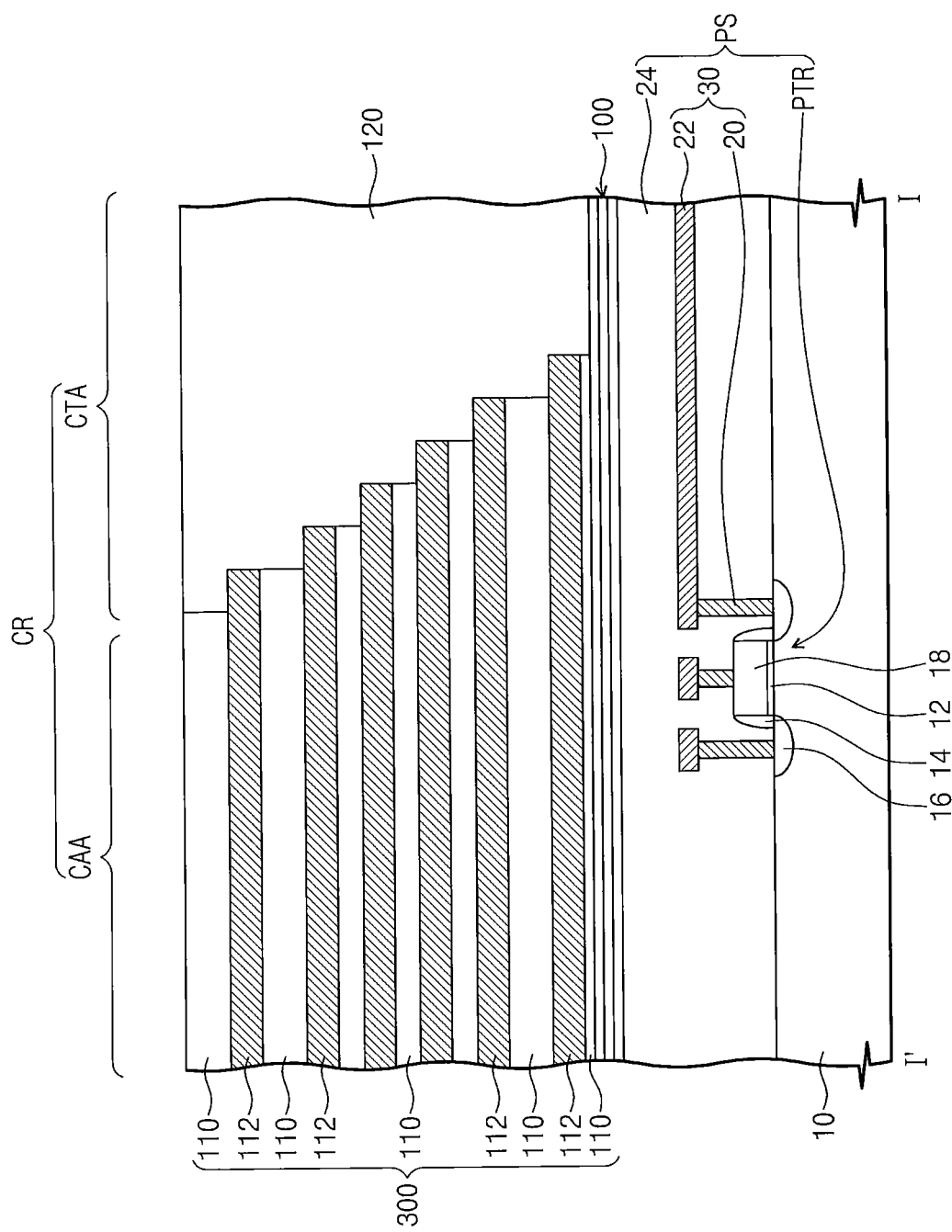

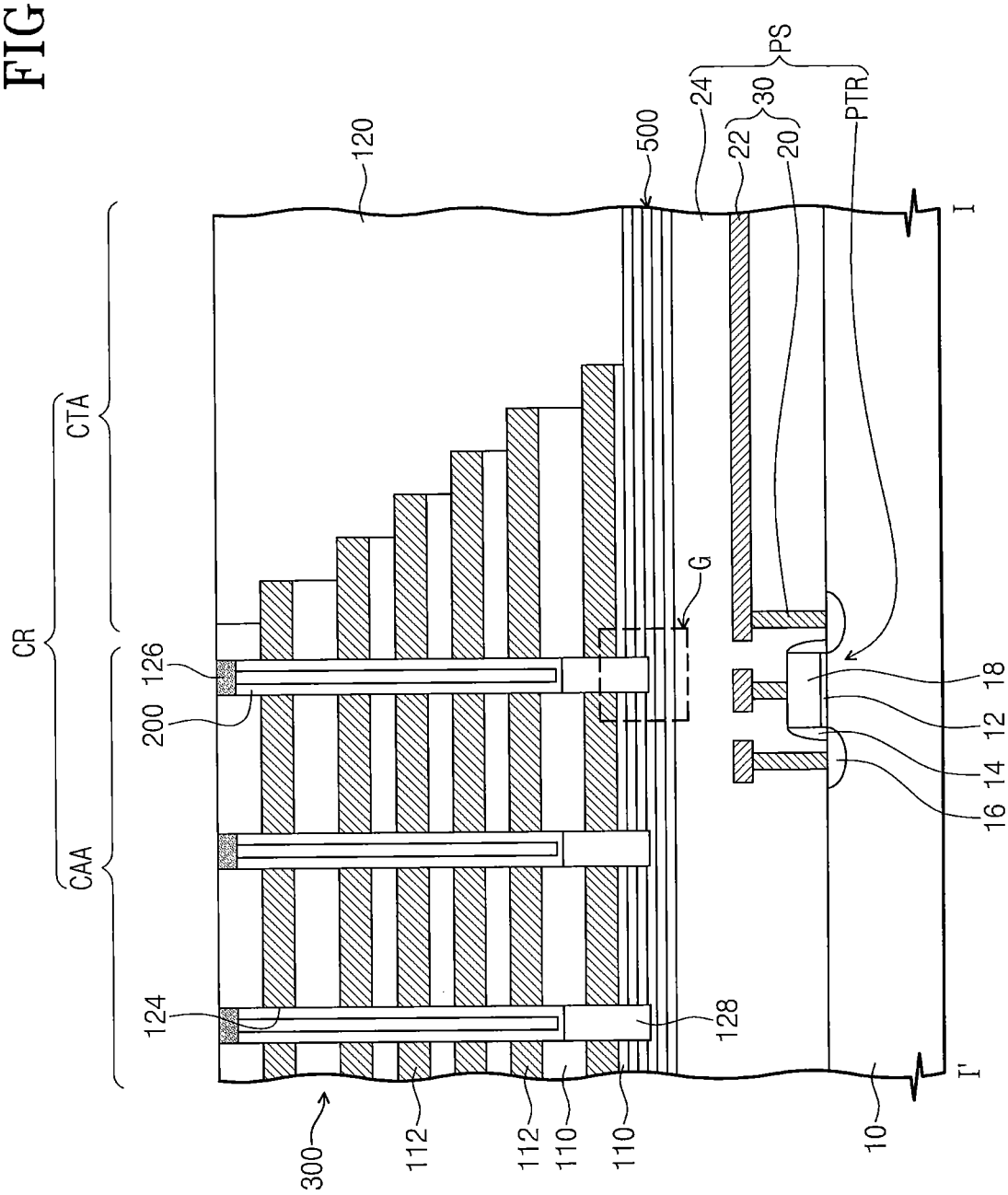

THREE-DIMENSIONAL SEMICONDUCTOR MEMORY DEVICE AND METHOD OF FABRICATING THE SAME

CROSS-REFERENCE TO RELATED APPLICATIONS

The present application is a continuation application of and claims priority from U.S. patent application Ser. No. 14/708,477, filed on May 11, 2015, which claims priority under 35 U.S.C. § 119 to Korean Patent Application No. 10-2014-0076514, filed on Jun. 23, 2014, in the Korean Intellectual Property Office, the entire contents of which are hereby incorporated by reference.

BACKGROUND

Example embodiments of the inventive concept relate to a three-dimensional semiconductor memory device and a method of fabricating the same, and in particular, to a three-dimensional semiconductor memory device with improved reliability and increased integration density and a method of fabricating the same.

In semiconductor devices, increased integration is an important factor in realizing high-performance low-cost devices. Currently, in a two-dimensional memory semiconductor device or a planar memory semiconductor device, integration is largely affected by a technique of forming a fine pattern, because integration is mainly determined by an area that a unit memory cell occupies. However, because ultrahigh-priced equipment is typically required to foam a fine pattern, increasing integration of a two-dimensional memory semiconductor device is still economically limited.

To overcome such a limitation, three-dimensional memory devices (including three-dimensionally arranged memory cells) have been proposed.

SUMMARY

Example embodiments of the inventive concept provide a three-dimensional semiconductor memory device with improved reliability and increased integration density.

Other example embodiments of the inventive concept provide a method of fabricating a three-dimensional semiconductor memory device with improved reliability and increased integration density.

According to example embodiments of the inventive concept, a three-dimensional semiconductor memory device may include a substrate, a peripheral circuit structure on the substrate, a horizontal active layer on the peripheral circuit structure, the horizontal active layer including first, second, and third active semiconductor layers sequentially stacked on the substrate, a plurality of stacks provided parallel to a first direction on the horizontal active layer, and vertical structures penetrating the stacks. Here, the first active semiconductor layer may be doped with p-type impurities to have a first concentration, and the third active semiconductor layer may be doped with p-type impurities to have a second concentration lower than the first concentration or may be in an undoped state. The second active semiconductor layer may include an impurity diffusion restraining material. Further, each of the stacks may include a plurality of electrodes vertically stacked on the horizontal active layer.

According to example embodiments of the inventive concept, a three-dimensional semiconductor memory device may include a substrate, a peripheral circuit device on the substrate, a lower mold insulating layer covering the peripheral circuit device, a horizontal active layer provided on the lower mold insulating layer, and a cell array structure on the horizontal active layer. The cell array structure may include a plurality of stacks parallel to each other, vertical structures penetrating the stacks, and a common source region of a second conductivity type being provided between ones of the stacks and extending parallel to the stacks. Here, the horizontal active layer may include a first active semiconductor layer, an impurity diffusion barrier layer, and a second active semiconductor layer sequentially stacked on the lower mold insulating layer. The first active semiconductor layer may be doped with impurities to have a first conductivity type and a first concentration, the second active semiconductor layer may be doped with impurities to have the first conductivity type and a second concentration lower than the first concentration or may be in an undoped state, and the impurity diffusion barrier layer may contain a material preventing the impurities doped in the first active semiconductor layer from being diffused into the second active semiconductor layer.

According to example embodiments of the inventive concept, a three-dimensional semiconductor memory device may include a substrate, a peripheral circuit structure on the substrate, and a horizontal active layer on the peripheral circuit structure and electrically connected to the peripheral circuit structure, the horizontal active layer comprising carbon.

According to example embodiments of the inventive concept, a method of fabricating a three-dimensional semiconductor memory device may include forming a peripheral circuit device and a peripheral interconnection structure on a substrate, forming a lower mold insulating layer to cover the peripheral circuit device and the peripheral interconnection structure, forming a horizontal active layer including first, second, and third active semiconductor layers sequentially stacked on the lower mold insulating layer, and forming a cell array structure on the horizontal active layer. The first active semiconductor layer may be doped with impurities to have a first conductivity type and a first concentration, the second active semiconductor layer may include an impurity diffusion restraining material inhibiting diffusion of the impurities in the first active semiconductor layer into the second active semiconductor layer, and the third active semiconductor layer may be doped with impurities to have the first conductivity type and a second concentration different from the first concentration or may be in an undoped state.

According to example embodiments of the inventive concept, a method of fabricating a three-dimensional semiconductor memory device may include forming a peripheral circuit structure on a substrate, forming a horizontal active layer with a layer including carbon on the peripheral circuit structure, and forming an interconnection structure including a first contact connected to the horizontal active layer.

According to example embodiments of the inventive concept, a three-dimensional semiconductor memory device may include a substrate, a peripheral circuit structure on the substrate, and a horizontal active layer on the peripheral circuit structure and electrically connected to the peripheral circuit structure. The horizontal active layer may include a first active semiconductor layer on the peripheral circuit structure and comprising p-type dopants, a second active semiconductor layer on the first active semiconductor layer, and a third active semiconductor layer on the second active semiconductor layer. The third active semiconductor layer may have a thickness greater than a thickness of the first active semiconductor layer in a direction normal to the substrate.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 10, 11A, 12, 13, 14A, and 15 through 19 are sectional views taken along line I-I' of FIG. 1 to exemplarily illustrate some intermediate steps of a fabrication process for fabricating the three-dimensional semiconductor memory device of FIG. 2.

FIGS. 25A, 26A, 27 and 28 are sectional views taken along line I-I' of FIG. 1 to exemplarily illustrate some intermediate steps of a fabrication process for fabricating the three-dimensional semiconductor memory device of FIG. 7.

Figure 1:
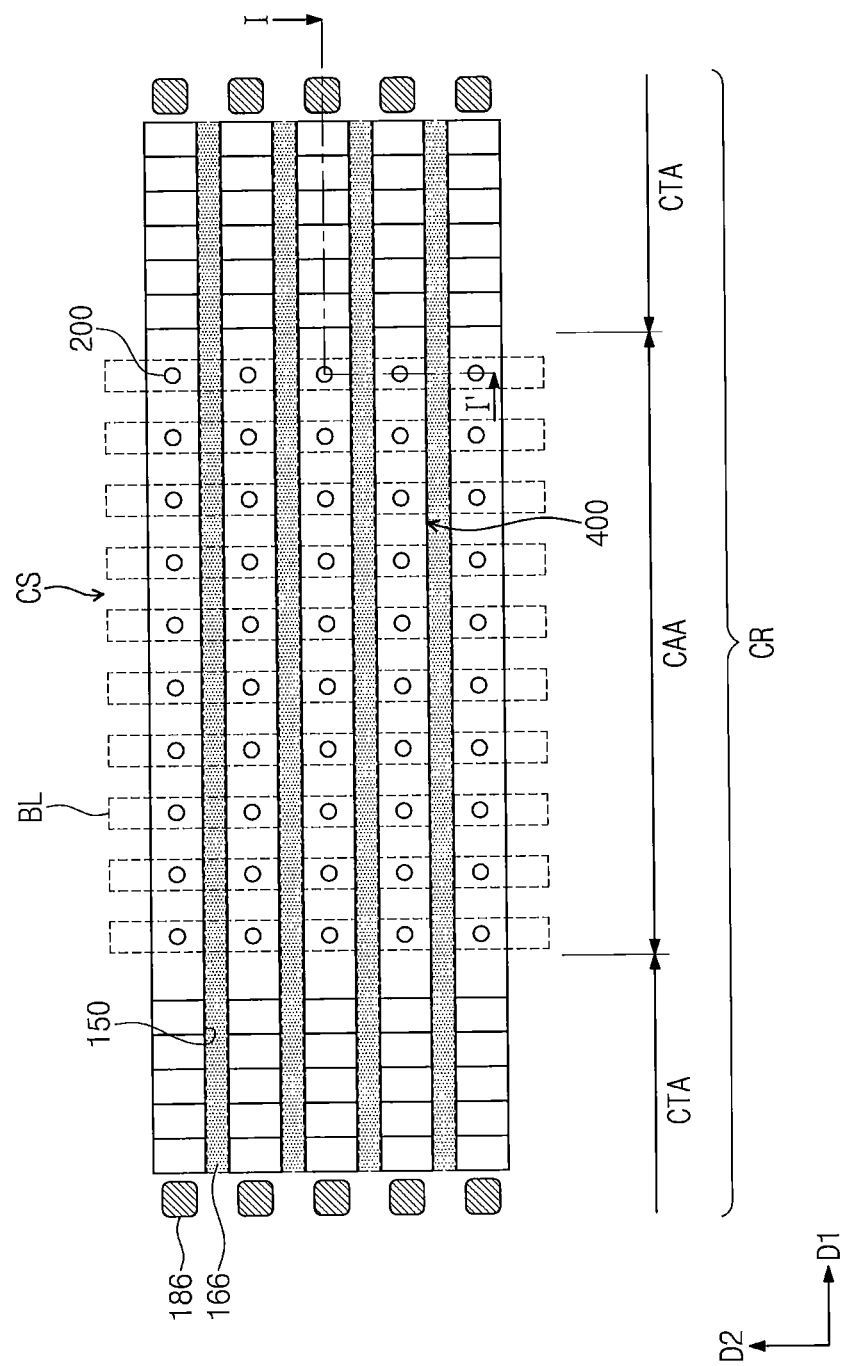
FIG. 1 is a schematic plan view illustrating a three-dimensional semiconductor memory device according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and this specification and will not be interpreted in an idealized or overly formal sense unless expressly so defined herein.

Figure 2:
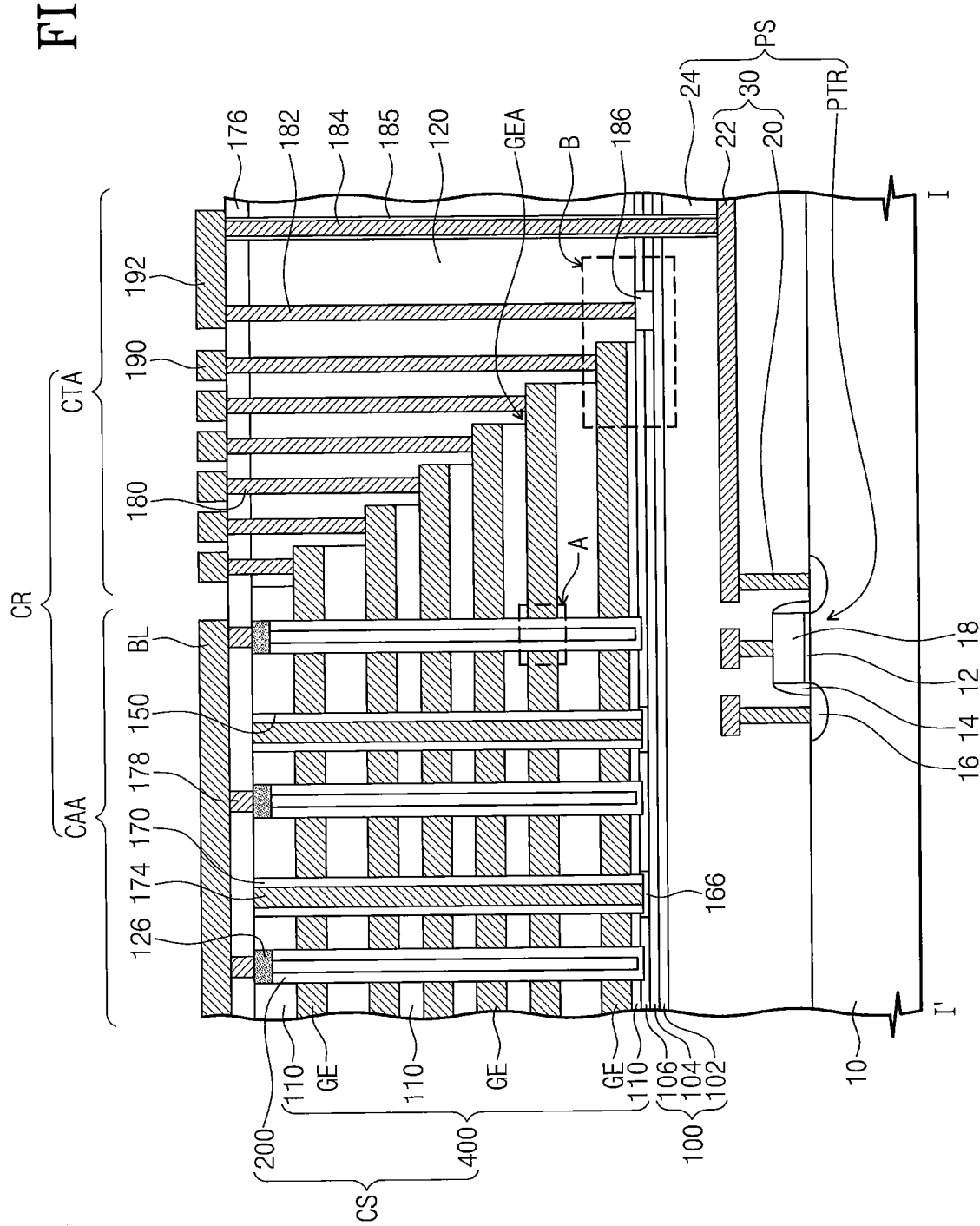
FIG. 2 is a sectional view taken along line I-I' of FIG. 1 to illustrate a three-dimensional semiconductor memory device according to example embodiments of the inventive concept.
Figure 3A:
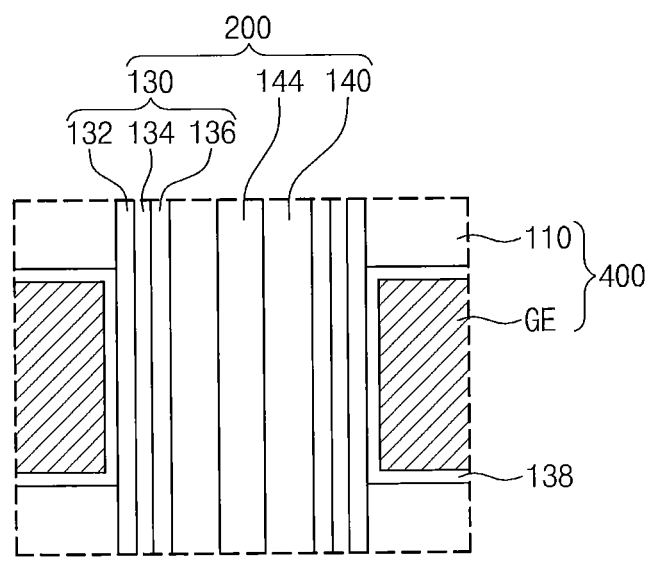
FIGS. 3A and 3B are enlarged sectional views of a portion A of FIG. 2 and illustrate some examples of a vertical structure of a three-dimensional semiconductor memory device according to example embodiments of the inventive concept.
Figure 3B:
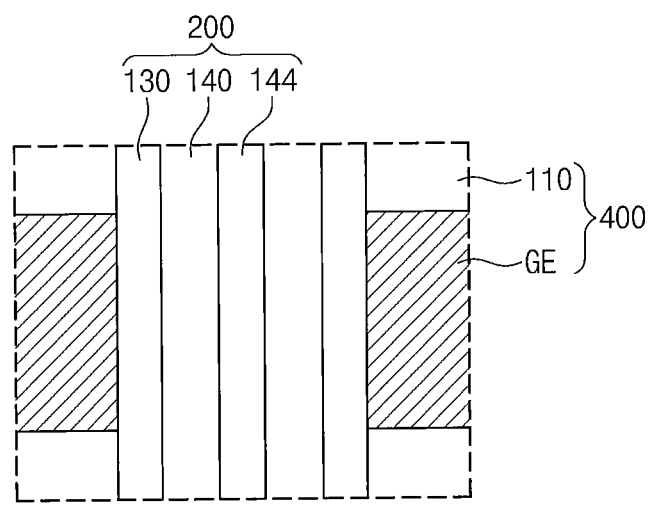
Figure 4A:
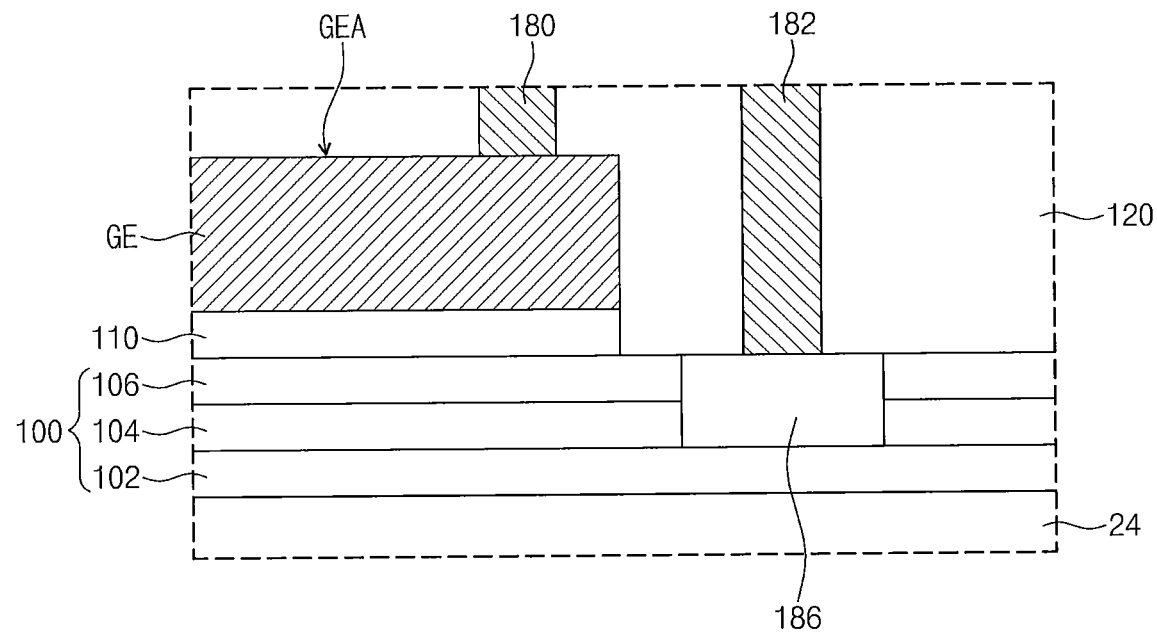
FIGS. 4A through 4C are enlarged sectional views of a portion B of FIG. 2 and illustrate some examples of a pick-up region of a three-dimensional semiconductor memory device according to example embodiments of the inventive concept.
Figure 4B:
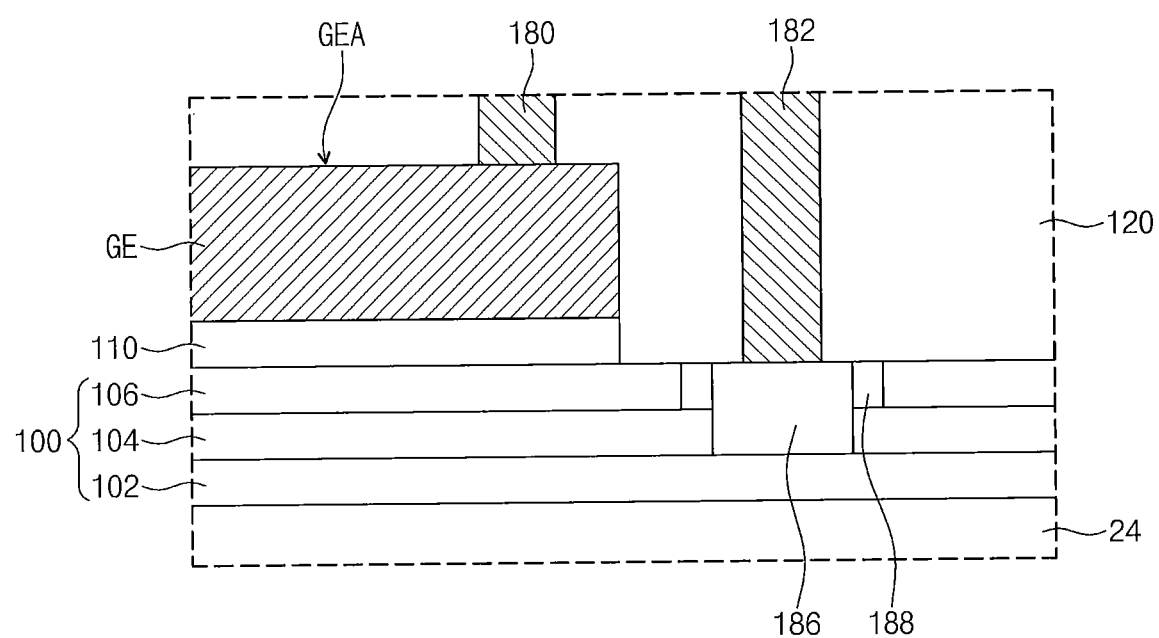
Figure 4C:
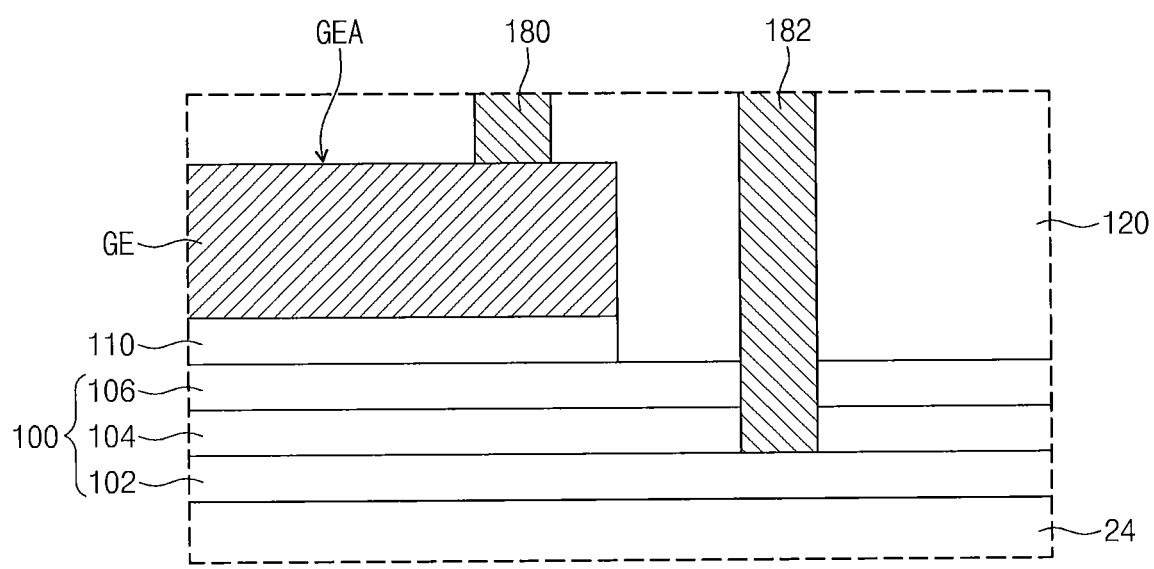

FIG. 1 is a schematic plan view illustrating a three-dimensional semiconductor memory device according to example embodiments of the inventive concept, and FIG. 2 is a sectional view taken along line I-I' of FIG. 1 to illustrate a three-dimensional semiconductor memory device according to example embodiments of the inventive concept. FIGS. 3A and 3B are enlarged sectional views of a portion A of FIG. 2 and illustrate some examples of a vertical structure of a three-dimensional semiconductor memory device according to example embodiments of the inventive concept, and FIGS. 4A through 4C are enlarged sectional views of a portion B of FIG. 2 and illustrate some examples of a pick-up region of a three-dimensional semiconductor memory device according to example embodiments of the inventive concept.

Referring to FIGS. 1 through 4C, according to example embodiments of the inventive concept, a three-dimensional semiconductor memory device may include a peripheral circuit structure PS, a horizontal active layer 100, and a cell array structure CS disposed on a substrate 10. For example, the peripheral circuit structure PS may be provided on the substrate 10, and the horizontal active layer 100 and the cell array structure CS may be sequentially stacked on the peripheral circuit structure PS. The substrate 10 may include a cell region CR, and the cell region CR may include a cell array region CAA and a connection region CTA provided around the cell array region CAA. The cell array structure CS may be provided on the cell array region CAA, and contacts 180, 182, and 184 and a pick-up region 186 may be provided on the connection region CTA. The horizontal active layer 100 may be provided over the cell array region CAA and the connection region CTA.

The peripheral circuit structure PS may constitute a part of a peripheral circuit configured to control operations of the cell array structure CS. In other words, the peripheral circuit structure PS may include at least a portion of the peripheral circuit. The peripheral circuit may include, for example, row and column decoders, page buffer, and control circuits. In example embodiments, the peripheral circuit may include a well bias driver. The well bias driver may be configured to provide an erase voltage, which is used for an erase operation of the cell array structure CS, to the cell array structure CS.

The peripheral circuit structure PS may include a peripheral circuit device PTR formed on the substrate 10, a peripheral interconnection structure 30, and a lower mold insulating layer 24. Here, the peripheral interconnection structure 30 may include peripheral circuit contacts 20 and peripheral interconnection lines 22.

The substrate 10 may be formed of or include a semiconductor material. For example, the substrate 10 may be a single-crystalline silicon wafer, a single-crystalline germanium wafer, or a single-crystalline silicon-germanium wafer.

The substrate 10 may be, for example, a p-type semiconductor substrate, but example embodiments of the inventive concepts may not be limited thereto. Further, the substrate 10 may include a well region (not shown).

The peripheral circuit device PTR may include a peripheral gate insulating layer 12, a peripheral gate electrode 18, and source/drain regions 16 at both sides of the peripheral gate electrode 18. The peripheral gate insulating layer 12 may be formed of or include an oxide material (e.g., silicon oxide) or a high-k dielectric material. The peripheral gate electrode 18 may be formed of or include at least one of, for example, silicon (e.g., polysilicon), metal silicides (e.g., tungsten silicide (WSi), nickel silicide (NiSi), cobalt silicide (CoSi), or titanium silicide (TiSi), tantalum silicide (TaSi)), or metals (e.g., tungsten or aluminum). The peripheral circuit device PTR may be, for example, a high voltage transistor. Peripheral gate spacers 14 may be formed on side surfaces of the peripheral gate electrode 18.

The peripheral interconnection lines 22 may be coupled to the peripheral circuit device PTR via the peripheral circuit contacts 20. The lower mold insulating layer 24 may be provided to cover the peripheral circuit device PTR and the peripheral interconnection structure 30. In some embodiments, the lower mold insulating layer 24 may include a plurality of insulating layers sequentially stacked on the peripheral circuit device PTR.

The peripheral circuit contacts 20 may be formed of or include at least one of silicon (e.g., polysilicon) or metals (e.g., tungsten or copper). In some embodiments, the peripheral circuit contacts 20 may further include a barrier metal layer. For example, the barrier metal layer for the peripheral circuit contacts 20 may be formed of or include at least one of transition metals (e.g., titanium or tantalum) or conductive metal nitrides (e.g., titanium nitride or tantalum nitride). The peripheral interconnection lines 22 may include a metal (e.g., copper or aluminum). The lower mold insulating layer 24 may be formed of or include an oxide or nitride layer.

The horizontal active layer 100 may be provided on the peripheral circuit structure PS. For example, the horizontal active layer 100 may extend in first and second directions D1 and D2 and may cover the lower mold insulating layer 24. The first and second directions D1 and D2 may be parallel to a top surface of the substrate 10 and may cross each other. When viewed in plan view, the horizontal active layer 100 may be overlapped with not only the cell array region CAA but also the connection region CTA. The horizontal active layer 100 may include a semiconductor material. For example, the horizontal active layer 100 may include at least one of silicon (Si), germanium (Ge), silicon germanium (SiGe), gallium arsenic (GaAs), indium gallium arsenic (InGaAs), aluminum gallium arsenic (AlGaAs), or mixtures thereof. The horizontal active layer 100 may include, for example, a semiconductor material doped with p-type impurities and/or an undoped or intrinsic semiconductor material. The horizontal active layer 100 may have a polycrystalline or single-crystalline structure. Further, the horizontal active layer 100 may have a thickness ranging from about 300 nm to about 600 nm.

In some embodiments, the horizontal active layer 100 may include a first active semiconductor layer 102, a second active semiconductor layer 104, and a third active semiconductor layer 106, which are stacked on the lower mold insulating layer 24 along a vertical direction normal to the top surface of the substrate 10. On the cell array region CAA and the connection region CTA, each of the first to third active semiconductor layers 102, 104, and 106 may be provided in the form of a horizontal layer extending parallel to the first and second directions D1 and D2. In example embodiments, the first to third active semiconductor layers 102, 104, and 106 may be patterned to have end portions on the connection region CTA.

The first active semiconductor layer 102 may be a highly-doped p-type layer and have a thickness ranging from about 100 nm to 200 nm. For example, the first active semiconductor layer 102 may be a highly-boron-doped semiconductor layer. In the first active semiconductor layer 102, the impurity concentration of the p-type dopants (e.g., boron (B)) may range from, for example, about $1\times10^{19}$ ions/cm$^3$ to about $1\times10^{21}$ ions/cm$^3$. In example embodiments, the first active semiconductor layer 102 may be a polycrystalline semiconductor layer (e.g., polysilicon layer) highly doped with boron (B).

The third active semiconductor layer 106 may be a lightly-doped or undoped semiconductor layer. For example, the third active semiconductor layer 106 may have a p-type dopant concentration that is lower than that of the first active semiconductor layer 102. As an example, in the third active semiconductor layer 106, the impurity concentration of the p-type dopants (e.g., boron (B)) may range from about $1\times10^{15}$ ions/cm$^3$ to about $1\times10^{18}$ ions/cm$^3$. Alternatively, the third active semiconductor layer 106 may be provided not to contain p-type dopants such as boron (B). In example embodiments, the third active semiconductor layer 106 may be a lightly-boron-doped or boron-free polycrystalline semiconductor layer. For example, the third active semiconductor layer 106 may be a lightly-boron-doped or boron-free polysilicon layer. The third active semiconductor layer 106 may be provided to have a thickness ranging from about 100 nm to about 200 nm. In some embodiments, the third active semiconductor layer 106 may be thicker than the first active semiconductor layer 102.

The second active semiconductor layer 104 may include an impurity diffusion restraining material preventing impurities from being diffused from the first active semiconductor layer 102 to the third active semiconductor layer 106. In other words, the second active semiconductor layer 104 may serve as an impurity diffusion barrier layer. In example embodiments, the second active semiconductor layer 104 may contain carbon serving as the impurity diffusion restraining material. For example, the second active semiconductor layer 104 may be a carbon-doped semiconductor layer. In the second active semiconductor layer 104, a doping concentration of carbon may range from about $5\times10^{18}$ ions/cm$^3$ to about $1\times10^{21}$ ions/cm$^3$. In example embodiments, the second active semiconductor layer 104 may be a carbon-containing polysilicon layer. The second active semiconductor layer 104 may have a thickness ranging from about 10 nm to about 200 nm. In example embodiments, the second active semiconductor layer 104 may be thinner than the first or third active semiconductor layer 102 or 106.

In example embodiments, the first to third active semiconductor layers 102, 104, and 106 may have a single-crystalline structure. For example, the first to third active semiconductor layers 102, 104, and 106 may be formed of or include a single-crystalline silicon layer.

In the case where the horizontal active layer 100 includes, for example, polysilicon, it may be highly doped with boron (B). This may make it possible to reduce resistance of the horizontal active layer 100 and thereby improve mobility of electric charges flowing through the horizontal active layer 100. Due to high diffusivity of boron, boron (B) atoms may be accumulated or segregated near a grain boundary of polysilicon layer, thereby forming a pn junction in conjunction with an n-type common source region 166, which will be described below. This may serve as a source of a junction leakage current. In example embodiments, the presence of the second active semiconductor layer 104 makes it possible to reduce or prevent the technical issues, such as the boron segregation and the consequent junction leakage current, from occurring. In other words, the use of the first active semiconductor layer 102 highly doped with boron (B) makes it possible to reduce the electric resistance of the horizontal active layer 100, and the use of the second active semiconductor layer 104 serving as the impurity diffusion barrier layer makes it possible to reduce or prevent the technical issues, which may occur in this case. For example, the second active semiconductor layer 104 may reduce or prevent boron atoms from being diffused from the first active semiconductor layer 102 to the third active semiconductor layer 106. As the result of the lowered resistance of the horizontal active layer 100, an erase voltage can be quickly and/or effectively delivered to the cell array structure CS via the pick-up region 186 and the first active semiconductor layer 102, and, thus, an erase operation on the cell array structure CS can be more effectively performed. Furthermore, as the result of the reduction in resistance and junction leakage current, it is possible to reduce electric power required for an erase operation of the cell array structure CS and improve reliability of the erase operation. That is, during the erase operation, holes can be effectively supplied to vertical structures 200 via the pick-up region 186 and the first active semiconductor layer 102, and this makes it possible to improve performance of the erase operation. In addition, the reduction of the junction leakage current allows for improvement in reliability of the three-dimensional semiconductor memory device.

The cell array structure CS may be disposed on the horizontal active layer 100. The cell array structure CS may include a plurality of vertical structures 200, which stand vertically on the horizontal active layer 100, and stacks 400 provided to surround the vertical structures 200. The vertical structures 200 may be provided to penetrate the stacks 400. Further, the cell array structure CS may include a common source region 166, which is provided between the stacks 400 and extends parallel to the first direction D1. The common source region 166 may be formed in or on the horizontal active layer 100.

On the horizontal active layer 100, the stacks 400 may be parallel to the first direction D1 and may be spaced apart from each other in the second direction D2. Each of the stacks 400 may include electrodes GE and insulating layers 110 that are alternatingly and repeatedly stacked on the horizontal active layer 100. In each stack 400, thicknesses of the insulating layers 110 may be changed in consideration of technical requirements for the semiconductor memory device. For example, the lowermost one of the insulating layers 110 may be thinner than the others of the insulating layers 110. Further, at least one of the insulating layers 110 may be thicker than the remaining ones of the insulating layers 110. The insulating layers 110 may be formed of or include a silicon oxide layer. The electrodes GE may include a conductive material. For example, the electrodes GE may be formed of or include at least one of a semiconductor layer, a metal silicide layer, a metal layer, a metal nitride layer, or any combination thereof. In some embodiments, the semiconductor layer for the electrodes GE may be a doped silicon layer. The metal silicide layer for the electrodes GE may include at least one of cobalt silicide, titanium silicide, tungsten silicide, or tantalum silicide. The metal layer for the electrodes GE may include at least one of tungsten, nickel, cobalt, titanium, or tantalum. The metal nitride layer for the electrodes GE may include at least one of titanium nitride, tungsten nitride, or tantalum nitride.

In example embodiments, the three-dimensional semiconductor memory device may be a vertical-type NAND FLASH memory device, and in this case, the electrodes GE may be used as control gate electrodes of memory cells. For example, the electrodes GE, other than the uppermost and lowermost ones of the electrodes GE, may be used as the control gate electrodes and word lines connecting the control gate electrodes horizontally to each other. The electrodes GE may be coupled with the vertical structures 200 to constitute the memory cells. Accordingly, vertical memory cell strings, each of which includes vertically-stacked memory cells, may be provided on the horizontal active layer 100. The lowermost and uppermost ones of the electrodes GE may be used as gate electrodes of selection transistors SST and GST. For example, the uppermost one of the electrodes GE may serve as a gate electrode of a string selection transistor SST for controlling the electrical connection between a bit line BL and the vertical structures 200, and the lowermost one of the electrodes GE may serve as a gate electrode of a ground selection transistor GST for controlling the electrical connection between the common source region 166 and the vertical structures 200.

In example embodiments, the three-dimensional semiconductor memory device may be a vertical-type resistive memory device, and in this case, the electrodes GE may be used as control electrodes of memory cells. For example, the electrodes GE may be coupled with the vertical structures 200 to constitute memory cells vertically arranged on the horizontal active layer 100.

The vertical structures 200 may be connected to the horizontal active layer 100 through the stacks 400. When viewed in plan view, the vertical structures 200 may be arranged to form a plurality of rows parallel to the first direction D1 and a plurality of columns parallel to the second direction D2. For example, the vertical structures 200 may constitute a plurality of groups, each of which includes a plurality of vertical structures 200 commonly penetrating a corresponding one of the stacks 400. As shown in FIG. 1, the vertical structures 200 of each group may be arranged along the first direction D1. In certain embodiments, each group may include one row of the vertical structures 200 arranged in the first direction D1, as shown in FIG. 1, but example embodiments of the inventive concepts may not be limited thereto. For example, each group may include a plurality of rows of the vertical structures 200 arranged in the first direction D1. Each of the vertical structures 200 in each group may be connected to a corresponding one of the bit lines BL, as shown in FIG. 1.

Each of the vertical structures 200 may include a vertical pillar 140. In example embodiments, the vertical pillars 140 of the vertical structures 200 may be vertical channel patterns. As shown in FIG. 3A, each of the vertical structures 200 may include a vertical pillar 140, which is connected to the horizontal active layer 100 and serves as a vertical channel pattern, and a memory pattern 130. In addition, each of the vertical structures 200 may further include an insulating gap-filling pattern 144. The vertical pillar 140 may have a top-open structure. In some embodiments, the vertical pillar 140 may be a top- and bottom-open structure, a hollow cylindrical structure, or a macaroni-shaped structure. In example embodiments, the vertical pillar 140 may be provided in the form of a solid pillar, and in this case, the insulating gap-filling pattern 144 may not be provided in the vertical structure 200. The vertical pillar 140 may be formed of or include a poly-crystalline, amorphous, or single-crystalline semiconductor material. The vertical pillar 140 may include at least one of silicon (Si), germanium (Ge), silicon germanium (SiGe), gallium arsenic (GaAs), indium gallium arsenic (InGaAs), aluminum gallium arsenic (AlGaAs), or mixtures thereof. The vertical pillar 140 may include an undoped semiconductor material or a doped semiconductor material having the same conductivity type as the horizontal active layer 100. The memory pattern 130 may be disposed between the stack 400 and the vertical pillar (i.e., the vertical channel pattern) 140. The memory pattern 130 may be a top- and bottom-open structure. The memory pattern 130 may include a thin layer in which data can be stored. For example, the memory pattern 130 may be configured in such a way that data therein can be changed using a voltage difference between the vertical structure 200 and the electrodes GE (e.g., gate electrodes) or using a Fowler-Nordheim tunneling effect caused by such a voltage difference.

The memory pattern 130 may include a first blocking insulating layer 132 adjacent to the electrodes GE (e.g., gate electrode), a tunnel insulating layer 136 adjacent to and the vertical pillar 140 (i.e., the vertical channel pattern) 140, and a charge storing layer 134 therebetween. The tunnel insulating layer 136 may be, for example, a silicon oxide layer. The charge storing layer 134 may be a trap insulating layer or an insulating layer with conductive nano dots. The trap insulating layer may include, for example, silicon nitride. The first blocking insulating layer 132 may include a silicon oxide layer and/or a high-k dielectric (e.g., aluminum oxide or hafnium oxide). The first blocking insulating layer 132 may be provided in the form of a single layer or a plurality of layers. As an example, the first blocking insulating layer 132 may be a single layer made of silicon oxide. As another example, the first blocking insulating layer 132 may be provided to have a multi-layered structure including at least one of a silicon oxide layer, an aluminum oxide layer, and/or a hafnium oxide layer.

In addition, a second blocking insulating layer 138 may be provided between the electrode GE and the vertical pillar 140 and between the insulating layers 110 and the electrode GE. For example, the second blocking insulating layer 138 may include a portion interposed between the electrode GE and the vertical pillar 140 and other portions covering top and bottom surfaces of the electrode GE. The second blocking insulating layer 138 may be provided in the form of a single layer or a plurality of layers. Furthermore, the second blocking insulating layer 138 may be formed of or include a high-k dielectric (e.g., aluminum oxide or hafnium oxide). In some embodiments, the formation of the second blocking insulating layer 138 may be omitted.

The insulating gap-filling pattern 144 may be provided in the vertical structure 200. The insulating gap-filling pattern 144 may be formed of or include a silicon oxide layer or a silicon nitride layer.

As another example, the vertical pillars 140 of the vertical structures 200 may be used as vertical-pillar-shaped electrodes. As shown in FIG. 3B, each of the vertical structures 200 may include the vertical pillar 140 and the memory pattern 130. Here, the vertical pillar 140 may be connected to the horizontal active layer 100 and may serve as a vertical-pillar-shaped electrode. In addition, the vertical structures 200 may be configured to include the insulating gap-filling pattern 144.

The vertical pillar 140 may be formed of or include a conductive material. For example, the vertical pillar 140 may be formed of or include at least one of doped semiconductor materials, metals, conductive metal nitrides, silicides, or nano structures (e.g., carbon nanotube).

The memory pattern 130 may be provided between the electrodes GE and the vertical pillar 140. The memory pattern 130 may be a variable resistive pattern. For example, the memory pattern 130 may be formed of or include at least one of materials exhibiting a variable resistance property.

As an example, the memory pattern 130 may include a material (for example, a phase-changeable material), whose electric resistance can be changed using thermal energy applied thereto. Here, the thermal energy may be generated by an electric current passing through an electrode adjacent to the memory pattern 130. The phase-changeable material may include at least one of antimony (Sb), tellurium (Te), or selenium (Se). For example, the phase-changeable material may include a chalcogenide formed of tellurium (Te) having about 20-80 atomic percent concentration, antimony (Sb) having about 5-50 atomic percent concentration, and germanium (Ge) having the remaining concentration. In addition, the phase-changeable material may further include at least one of N, O, C, Bi, In, B, Sn, Si, Ti, Al, Ni, Fe, Dy, or La as an impurity.

As another example, the memory pattern 130 may be configured to have a layered structure whose electrical resistance can be changed using a spin transferring phenomenon of an electric current flowing therethrough. The memory pattern 130 may be a layered structure exhibiting a magneto-resistance property and may be configured to include at least one ferromagnetic material and/or at least one antiferromagnetic material.

As other example, the memory pattern 130 may include at least one of perovskite compounds or transition metal oxides. For example, the memory pattern 130 may be formed of or include at least one of niobium oxide, titanium oxide, nickel oxide, zirconium oxide, vanadium oxide, $PCMO((Pr, Ca)MnO_3)$, strontium-titanium oxide, barium-strontium-titanium oxide, strontium-zirconium oxide, barium-zirconium oxide, or barium-strontium-zirconium oxide. The insulating gap-filling pattern 144 may be provided to fill an internal space of the vertical structure 200. The insulating gap-filling pattern 144 may be formed of or include a silicon oxide layer or a silicon nitride layer.

Conductive pads 126 may be provided on the vertical structures 200, respectively. The conductive pads 126 may include a conductive material. The conductive pad 126 may be provided in the form of a pattern doped with impurities. In example embodiments, an end portion of the vertical structure 200 in contact with the conductive pad 126 may serve as a drain region.

A trench 150 may be provided between the stacks 400 and may separate the stacks 400 from each other. For example, the trench 150 may be provided parallel to the first direction D1, thereby separating the stacks 400 from each other in the second direction D2. Accordingly, when viewed in plan view, the stacks 400 and the common source regions 166 may be alternatingly and repeatedly arranged in the second direction D2. The trench 150 may be provided to partially expose the top surface of the horizontal active layer 100. A portion of the horizontal active layer 100 or the third active semiconductor layer 106, which is exposed by the trench 150, may be partially recessed.

The common source region 166 may be formed in a portion of the horizontal active layer 100 exposed by the trench 150. In other words, the common source region 166 may be disposed between the stacks 400 and may be positioned within the third active semiconductor layer 106. Further, the common source region 166 may extend parallel to the first direction D1. The common source region 166 may be doped with n-type dopants (e.g., arsenic (As) or phosphorus (P)). In the common source region 166, the dopant concentration may range from about $1 \times 10^{19}$ ions/cm$^3$ to about $1 \times 10^{21}$ ions/cm$^3$.

A common source plug 174 may be provided in the trench 150 and may be connected to the common source region 166. The common source plug 174 may be a line-shaped structure extending parallel to the first direction D1, when viewed in plan view. An insulating isolation spacer 170 may be provided between the stacks 400 and the common source plug 174. The insulating isolation spacer 170 may be provided to cover the sidewalls of the stacks 400. In example embodiments, the insulating isolation spacer 170 may be provided to fill a gap between adjacent ones of the stacks 400, and the common source plug 174 may be provided to penetrate the insulating isolation spacer 170 and be in contact with a portion of the common source region 166. In example embodiments, when a read or programming operation is performed on the three-dimensional semiconductor memory device, a ground voltage may be applied to the common source region 166 through the common source plug 174. The insulating isolation spacer 170 may be formed of or include at least one of silicon oxide, silicon nitride, silicon oxynitride, or low-k materials. The common source plug 174 may include at least one of metal (e.g., tungsten, copper, or aluminum) In some embodiments, the common source plug 174 may further include a barrier metal layer. For example, the barrier metal layer for the common source plug 174 may be formed of or include at least one of transition metal (e.g., titanium or tantalum) or conductive metal nitride (e.g., titanium nitride or tantalum nitride).

To make an electrical connection between the electrodes GE and the peripheral circuit, each of the stacks 400 may be provided to have a stepwise sidewall structure on the connection region CTA. For example, the electrodes GE may have pad portions GEA that are stacked on the connection region CTA in a stepwise manner. On the connection region CTA, a vertical thickness of the stack 400 may decrease stepwise in a direction away from the cell array region CAA. For example, the stack 400 may have a stepwise sidewall profile on the connection region CTA.

The pick-up region 186 may be provided near or around, the cell array structure CS. For example, the pick-up region 186 may be provided on the connection region CTA and in a portion of the horizontal active layer 100 adjacent to the sidewall of the stack 400. In other words, the pick-up region 186 may be disposed in the horizontal active layer 100 adjacent to the pad portions GEA of the electrodes GE of the stack 400. The pick-up region 186 may include a plurality of regions spaced apart from each other in the second direction D2. For example, when viewed in plan view, the pick-up region 186 may be located between the common source regions 166 in the second direction D2 and in the horizontal active layer 100 adjacent to the stacks 400 in the first direction D1. As shown in FIG. 4A, the pick-up region 186 may be disposed in the second and third active semiconductor layers 104 and 106 and may be coupled to the first active semiconductor layer 102. The pick-up region 186 may be formed by doping the horizontal active layer 100 with impurities and may have a first conductivity type, for example, a p-type. In example embodiments, the pick-up region 186 may contain p-type impurities (e.g., boron (B)) of high concentration. As an example, in the pick-up region 186, an impurity concentration (e.g., of boron (B)) may range from about $1 \times 10^{19}$ ions/cm$^3$ to about $1 \times 10^{21}$ ions/cm$^3$.

In example embodiments, as shown in FIG. 4B, a pick-up diffusion barrier region 188 may be provided on a side surface of the pick-up region 186. The pick-up diffusion barrier region 188 may be formed in the third active semiconductor layer 106 to surround at least a portion of the side surface of the pick-up region 186 and may be in contact with the second active semiconductor layer 104. The pick-up diffusion barrier region 188 may be configured to reduce or prevent the impurities (e.g., boron (B)) in the pick-up region 186 from being diffused into the third active semiconductor layer 106. Further, the pick-up diffusion barrier region 188 may reduce or prevent the impurities in the pick-up region 186 from being diffused into a neighboring one of the common source regions 166. In example embodiments, the pick-up region 186 may contain carbon. For example, a carbon concentration of the pick-up region 186 may be substantially the same as that of the second active semiconductor layer 104.

An upper mold insulating layer 120 may be provided on the connection region CTA to cover the pad portions GEA of the electrodes GE. The upper mold insulating layer 120 may be disposed on the horizontal active layer 100. In some embodiments, the upper mold insulating layer 120 may be disposed on a portion of the lower mold insulating layer 24 to cover the end portions of the horizontal active layer 100. A capping insulating layer 176 may be formed on the stacks 400 and the upper mold insulating layer 120. The capping insulating layer 176 and the upper mold insulating layer 120 may include at least one of a nitride layer or an oxide layer.

Bit line contacts 178 may be provided on the cell array region CAA and may be connected to the conductive pads 126, respectively, through the capping insulating layer 176. Bit lines BL may be provided on the capping insulating layer 176 to extend parallel to the second direction D2 or cross the stacks 400. Each of the bit lines BL may be electrically connected to the vertical structures 200 via the bit line contacts 178.

A cell interconnection structure may be provided on the connection region CTA to connect the cell array structure CS and the horizontal active layer 100 electrically to the peripheral circuit. For example, the cell interconnection structure may include first and second upper interconnection lines 190 and 192, in addition to the first to third contacts 180, 182, and 184.

The first contacts 180 may be provided to penetrate the capping insulating layer 176 and the upper mold insulating layer 120 on the connection region CTA and may be connected to the pad portions GEA of the electrodes GE, respectively. Vertical lengths of the first contacts 180 may increase in a direction away from the cell array region CAA. The first upper interconnection line 190 may be provided on the capping insulating layer 176 and may be connected to the first contacts 180.

The second contact 182 may be connected to the horizontal active layer 100 through the capping insulating layer 176 and the upper mold insulating layer 120. For example, the second contact 182 may be coupled to the pick-up region 186. Because the pick-up region 186 is coupled to the first active semiconductor layer 102, a voltage applied to the second contact 182 may be effectively delivered to the first active semiconductor layer 102. In some embodiments, as shown in FIG. 4C, the pick-up region 186 may not be provided in the horizontal active layer 100, and the second contact 182 may be formed to penetrate the second and third active semiconductor layers 104 and 106 and may be directly coupled to the first active semiconductor layer 102.

The cell array structure CS and the peripheral circuit structure PS may be electrically connected to each other through the third contact 184. The third contact 184 may be connected to the peripheral interconnection lines 22 of the peripheral circuit structure PS through the upper mold insulating layer 120, the horizontal active layer 100, and the lower mold insulating layer 24. Further, an insulating spacer 185 may be provided to enclose the third contact 184. The second upper interconnection line 192 may be provided on the capping insulating layer 176 and may be connected to the second and third contacts 182 and 184. As shown, the third contact 184 may be connected to the second upper interconnection line 192, but example embodiments of the inventive concepts may not be limited thereto. For example, the third contact 184 may be connected to the bit line BL or the first upper interconnection line 190.

In some embodiments, as described above, the peripheral circuit structure PS may include the well bias driver, and in this case, the well bias driver may be connected to the pick-up region 186 and/or the first active semiconductor layer 102 of the horizontal active layer 100 via the third contact 184, the second upper interconnection line 192, and the second contact 182. Accordingly, when an erase operation is performed on the cell array structure CS, an erase voltage can be applied to the first active semiconductor layer 102 via the second contact 182 and/or the pick-up region 186. Because the first active semiconductor layer 102 has generally low electric resistivity, the erase voltage can be effectively or uniformly applied to the cell array structure CS.

The bit line contact 178 and the first to third contacts 180, 182, and 184 may be formed of or include a metallic material (e.g., tungsten, copper, or aluminum). In addition, the bit line contact 178 and the first contact to third contacts 180, 182, and 184 may further include a barrier metal layer, which may be formed of or include at least one of transition metals (e.g., titanium or tantalum) or conductive metal nitrides (e.g., titanium nitride or tantalum nitride). The bit line BL and the first and second upper interconnection lines 190 and 192 may be formed of or include a metallic material (e.g., aluminum or copper).

Figure 5:
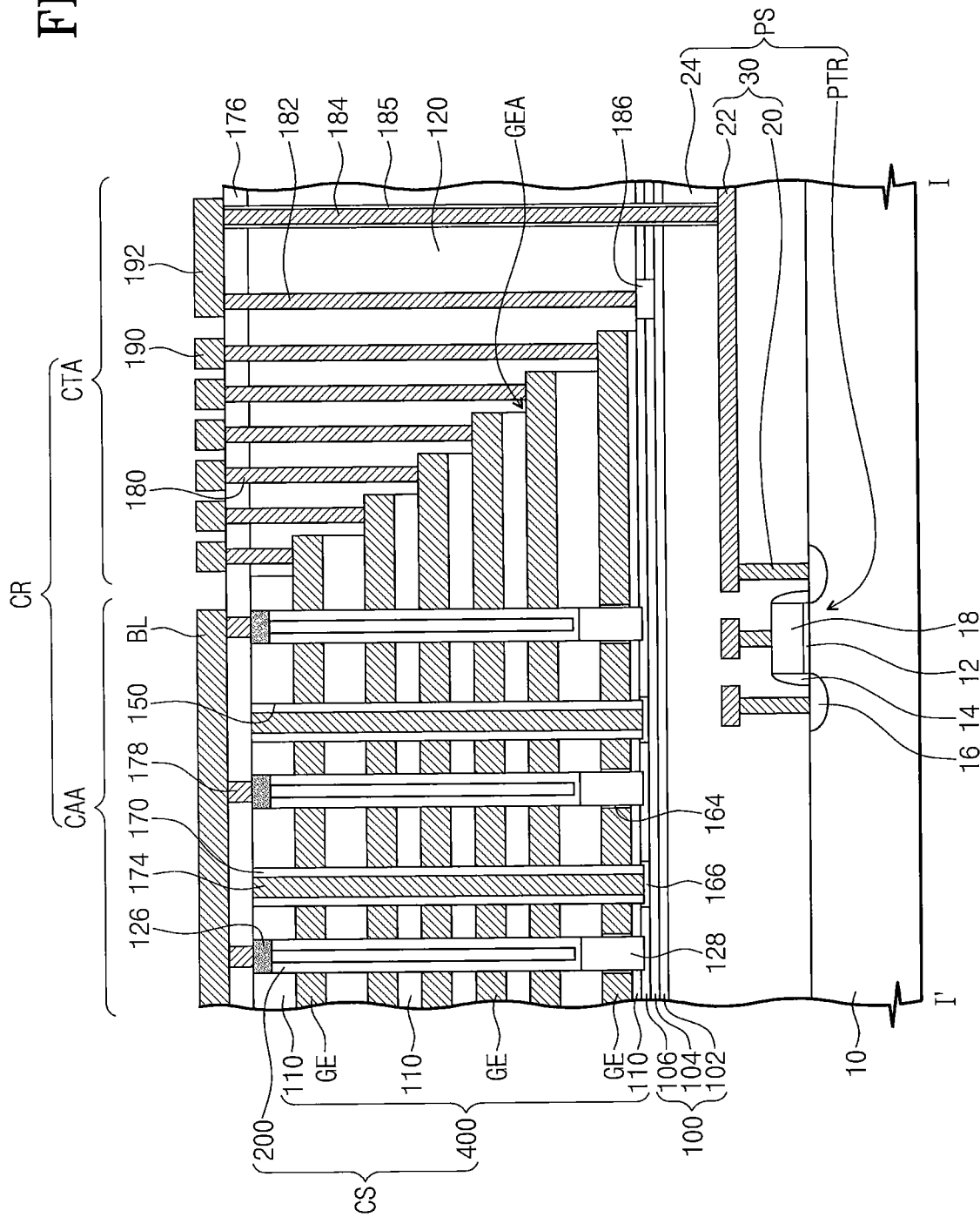
FIGS. 5 through 7 are sectional views taken along line I-I' of FIG. 1 to illustrate a three-dimensional semiconductor memory device according to other example embodiments of the inventive concept.
Figure 6:
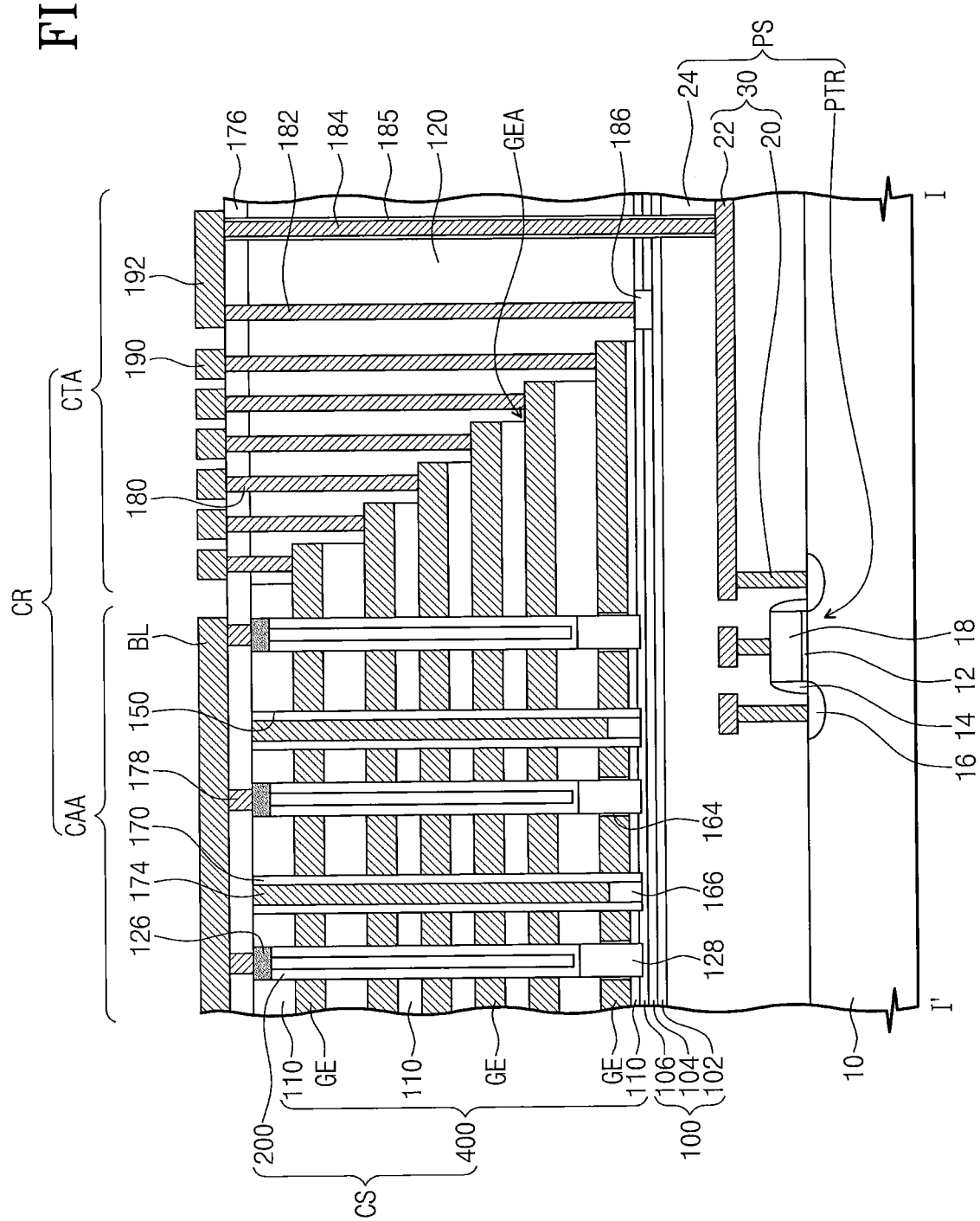
Figure 7:
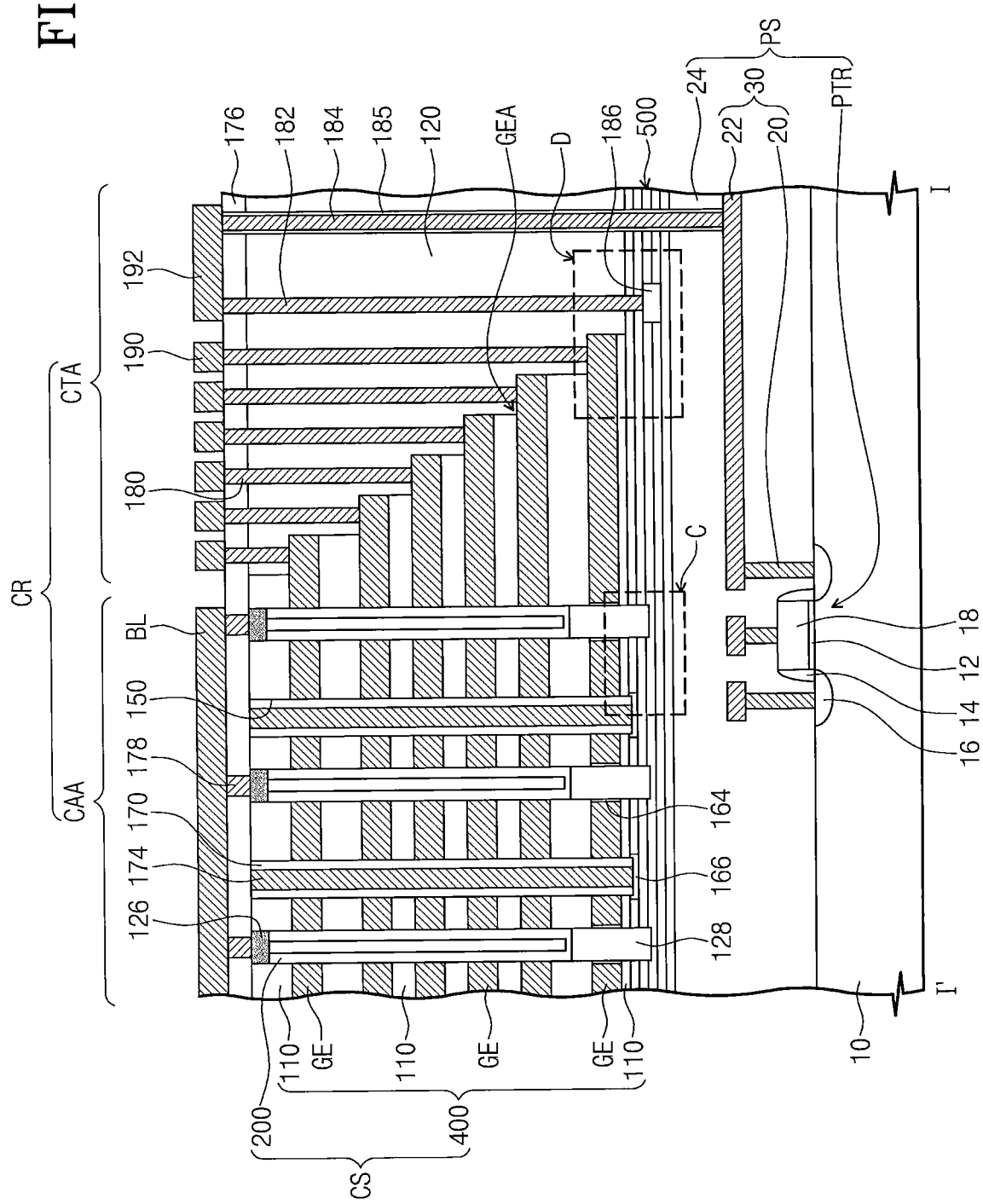
Figure 8:
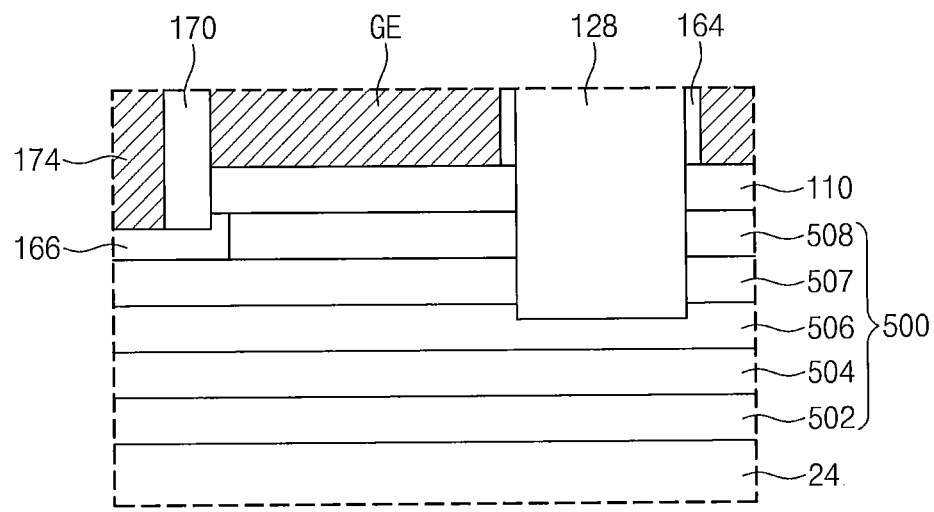
FIGS. 8 and 9 are enlarged views of portions C and D, respectively, of FIG. 7.
Figure 9:
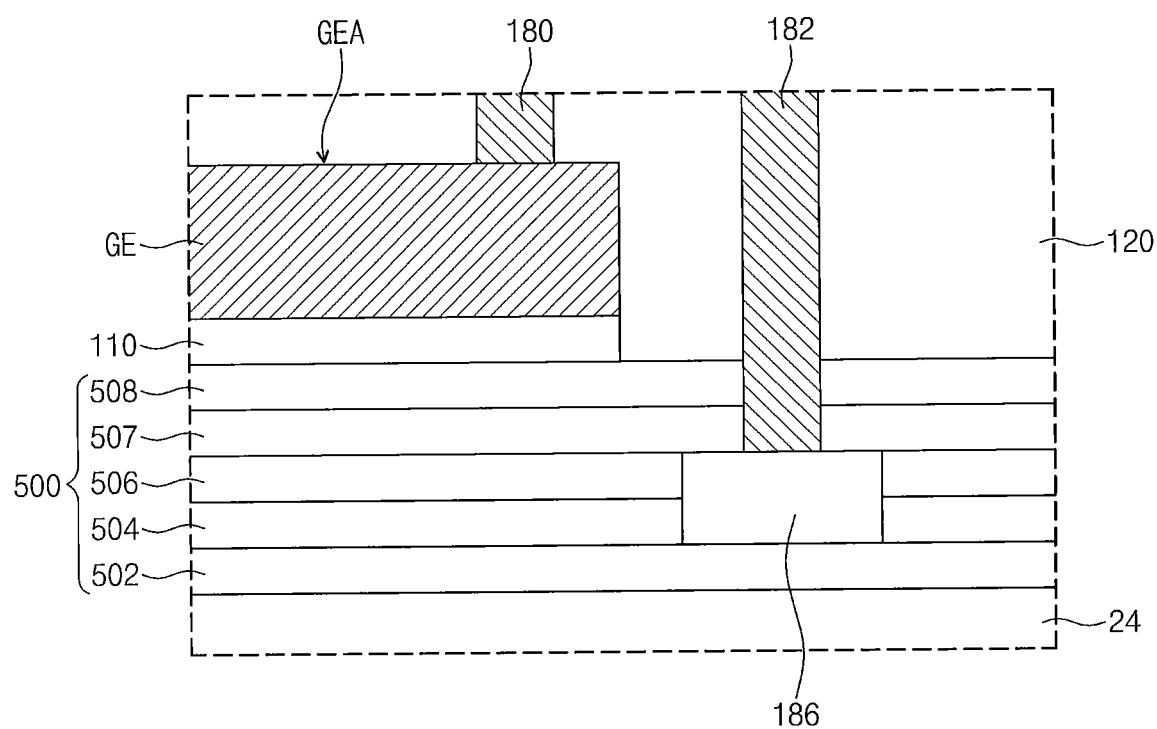

FIGS. 5 through 7 are sectional views taken along line I-I' of FIG. 1 to illustrate a three-dimensional semiconductor memory device according to other example embodiments of the inventive concept, and FIGS. 8 and 9 are enlarged views of portions C and D, respectively, of FIG. 7.

Hereinafter, for concise description, an element previously described with reference to FIGS. 1, 2, and 4A-4C may be identified by a similar or identical reference number without repeating an overlapping description thereof.

Referring to FIG. 5, first semiconductor patterns 128 may be provided below the vertical structures 200, respectively. The first semiconductor patterns 128 may be provided to penetrate a lower portion of the stack 400 and may be connected to the horizontal active layer 100. The first semiconductor pattern 128 may be connected to the vertical pillar (i.e., the vertical channel pattern) 140 of FIG. 3A or the vertical pillar (i.e., the vertical-pillar-shaped electrode) 140 of FIG. 3B.

The first semiconductor pattern 128 may be a pillar-shaped pattern vertically extending from the horizontal active layer 100 and having a top surface higher than that of the lowermost one of the electrodes GE relative to the substrate 10. For example, the first semiconductor pattern 128 may be an epitaxial pattern that is formed by an epitaxial growth process using the third active semiconductor layer 106 of the horizontal active layer 100 as a seed layer. Here, the third active semiconductor layer 106 may be an undoped or intrinsic semiconductor layer. In this case, the first semiconductor pattern 128 may have a poly-crystalline structure and may have a grain size larger than that of a layer formed using a chemical vapor deposition technique. Further, the first semiconductor patterns 128 provided on the cell array region CAA may have substantially the same shape and thickness. The first semiconductor pattern 128 may include at least one of silicon (Si), germanium (Ge), silicon germanium (SiGe), gallium arsenic (GaAs), indium gallium arsenic (InGaAs), aluminum gallium arsenic (AlGaAs), or mixtures thereof. In some embodiments, the first semiconductor pattern 128 may be formed of a single-crystalline semiconductor material.

The first semiconductor pattern 128 may be used as a channel region of, for example, the ground selection transistor GST, which is controlled by the lowermost one of the electrodes GE. In this case, to adjust a threshold voltage of the ground selection transistor GST, the first semiconductor pattern 128 may be doped with impurities (e.g., boron (B)). An electrode insulating layer 164 may be provided on a sidewall of the first semiconductor pattern 128 to separate the lowermost one of the electrodes GE electrically from the first semiconductor pattern 128. In some embodiments, the electrode insulating layer 164 may be formed to be thinner than the peripheral gate insulating layer 12.

Referring to FIG. 6, the first semiconductor patterns 128 may be provided below the vertical structures 200, respectively. The first semiconductor patterns 128 may be provided to penetrate the lower portion of the stack 400 and may be connected to the horizontal active layer 100. Further, the common source regions 166 may be provided below the common source plugs 174, respectively. The common source regions 166 may be provided to penetrate the lower portion of the stack 400 and may be connected to the horizontal active layer 100. The first semiconductor pattern 128 may be connected to the vertical pillar (i.e., the vertical channel pattern) 140 of FIG. 3A or the vertical pillar (i.e., the ivertical-pillar-shaped electrode) 140 of FIG. 3B. In some embodiments, the common source region 166 may be a second semiconductor pattern formed in the trench 150. As shown, the first semiconductor pattern 128 and the common source region 166 may be formed to have different thicknesses, but example embodiments of the inventive concepts may not be limited thereto. For example, the first semiconductor pattern 128 and the common source region 166 may be formed to have the same thickness.

The first semiconductor patterns 128 and the common source regions 166 may be epitaxial patterns that are formed by an epitaxial growth process using the third active semiconductor layer 106 of the horizontal active layer 100 as a seed layer. Here, the third active semiconductor layer 106 may be an undoped or intrinsic semiconductor layer. In this case, the first semiconductor patterns 128 and the common source region 166 may have a poly-crystalline structure and may have a grain size larger than that of a layer formed using a chemical vapor deposition technique. Further, the first semiconductor patterns 128 provided on the cell array region CAA may have substantially the same shape and thickness, and the common source regions 166 provided on the cell array region CAA may have substantially the same shape and thickness. In some embodiments, the first semiconductor patterns 128 and the common source regions 166 may be formed to have a single-crystalline structure. The first semiconductor pattern 128 and the common source region 166 may include at least one of silicon (Si), germanium (Ge), silicon germanium (SiGe), gallium arsenic (GaAs), indium gallium arsenic (InGaAs), aluminum gallium arsenic (AlGaAs), or mixtures thereof.

The first semiconductor pattern 128 may be used as a channel region of, for example, the ground selection transistor GST, which is controlled by the lowermost one of the electrodes GE. In this case, to adjust a threshold voltage of the ground selection transistor GST, the first semiconductor pattern 128 may be doped with impurities (e.g., boron (B)). The common source region 166 may contain n-type impurities (e.g., arsenic (As) or phosphorus (P)) of high concentration. In the common source region 166, the dopant concentration may range from about $1 \times 10^{19}$ ions/cm$^3$ to about $1 \times 10^{21}$ ions/cm$^3$.

The common source region 166 may extend parallel to the first direction D1. According to the present embodiment, because the common source region 166 is formed on the horizontal active layer 100, a length of an impurity diffusion path between the first active semiconductor layer 102 and the common source region 166 can be increased, when compared with the common source region 166 formed in the horizontal active layer 100. Accordingly, it is possible to more effectively reduce the junction leakage current. The first semiconductor pattern 128 may be electrically separated from the lowermost one of the electrodes GE by the electrode insulating layer 164, and the common source region 166 may be electrically separated from the lowermost one of the electrodes GE by the insulating isolation spacer 170.

Referring to FIGS. 7 through 9, a horizontal active layer 500 may be provided on the lower mold insulating layer 24. The horizontal active layer 500 may include a first active semiconductor layer 502, a second active semiconductor layer 504, a third active semiconductor layer 506, a buffer insulating layer 507, and a fourth active semiconductor layer 508 sequentially formed on the lower mold insulating layer 24. In some embodiments, the horizontal active layer 500 may be patterned to have an end portion on the connection region CTA. According to the present embodiment, the first to third active semiconductor layers 502, 504, and 506 may be configured to have substantially the same material and structure as the first to third active semiconductor layers 102, 104, and 106 of the horizontal active layer 100 described with reference to FIGS. 1 through 4C, except that the third active semiconductor layer 506 is formed an undoped semiconductor material.

The buffer insulating layer 507 may be formed on the third active semiconductor layer 506. The buffer insulating layer 507 may be formed of or include at least one of oxide, nitride, or oxynitride. In some embodiments, the buffer insulating layer 507 may have a thickness ranging from about 10 nm to about 200 nm.

The fourth active semiconductor layer 508 may be formed on the buffer insulating layer 507. The fourth active semiconductor layer 508 may have a thickness ranging from, for example, 100 nm to 200 nm. Thicknesses of the third and fourth active semiconductor layers 506 and 508 may be equal to or different from each other. For example, the fourth active semiconductor layer 508 may be thicker than the third active semiconductor layer 506. The fourth active semiconductor layer 508 may include at least one of silicon (Si), germanium (Ge), silicon germanium (SiGe), gallium arsenic (GaAs), indium gallium arsenic (InGaAs), aluminum gallium arsenic (AlGaAs), or mixtures thereof.

The fourth active semiconductor layer 508 may contain, for example, p-type impurities. The fourth active semiconductor layer 508 may be doped with p-type impurities (e.g., boron (B)) of low concentration, and in the fourth active semiconductor layer 508, the dopant concentration may range from about $1 \times 10^{15}$ ions/cm$^3$ to about $1 \times 10^{18}$ ions/cm$^3$. However, in some embodiments, the fourth active semiconductor layer 508 may be formed of an undoped semiconductor layer. The fourth active semiconductor layer 508 may be provided to have a poly- or single-crystalline structure.

The first semiconductor patterns 128 may be provided to penetrate the lower portion of the stack 400, which is provided on the horizontal active layer 500. The first semiconductor patterns 128 may be provided below the vertical structures 200, respectively. The first semiconductor pattern 128 may penetrate the fourth active semiconductor layer 508 and the buffer insulating layer 507 and may extend into the third active semiconductor layer 506. That is, the first semiconductor pattern 128 may be connected to the third active semiconductor layer 506. As described with reference to FIG. 6, the first semiconductor pattern 128 may be an epitaxial pattern.

In some embodiments, the first semiconductor patterns 128 may be respectively connected to the vertical pillars (i.e., the vertical channel patterns) 140 of FIG. 3A. In other embodiments, the vertical structures 200 may be respectively connected to the vertical pillars (i.e., the verticalpillar-shaped electrodes) 140 of FIG. 3B. For example, the first semiconductor pattern 128 may be used as a channel region of the ground selection transistor GST, which is controlled by the lowermost one of the electrodes GE. In this case, to adjust a threshold voltage of the ground selection transistor GST, the first semiconductor pattern 128 may be doped with impurities (e.g., boron (B)).

The common source region 166 may be formed in the fourth active semiconductor layer 508. The common source region 166 may contain n-type impurities (e.g., arsenic (As) or phosphorus (P)) of high concentration. In the common source region 166, the dopant concentration may range from about $1 \times 10^{19}$ ions/cm$^3$ to about $1 \times 10^{21}$ ions/cm$^3$. The common source region 166 may be provided in a region which may be formed by recessing a portion of the fourth active semiconductor layer 508. The electrode insulating layer 164 may be provided on the sidewall of the first semiconductor pattern 128 to separate the electrode GE electrically from the first semiconductor pattern 128. In some embodiments, as shown in FIG. 3A, the second blocking insulating layer 138 may be further provided to cover the top, bottom, and side surfaces of the electrode GE.

On the connection region CTA, the pick-up region 186 may be formed in the second and third active semiconductor layers 504 and 506 and may be coupled to the first active semiconductor layer 502. The second contact 182 may be coupled to the pick-up region 186 through the capping insulating layer 176, the upper mold insulating layer 120, the fourth active semiconductor layer 508, and the buffer insulating layer 507. In example embodiments, as shown in FIG. 4B, the pick-up diffusion barrier region 188 may be formed in the third active semiconductor layer 506 and may be disposed on the side surface of the pick-up region 186. For example, the pick-up diffusion barrier region 188 may be disposed to surround the side surface of the pick-up region 186. Alternatively, similar to FIG. 4C, the pick-up region 186 may not be formed in the horizontal active layer 500. For example, the second contact 182 may be formed to penetrate the second to fourth active semiconductor layer 504, 506, and 508 and the buffer insulating layer 507, thereby being in direct contact with the first active semiconductor layer 502.

Figure 11A:
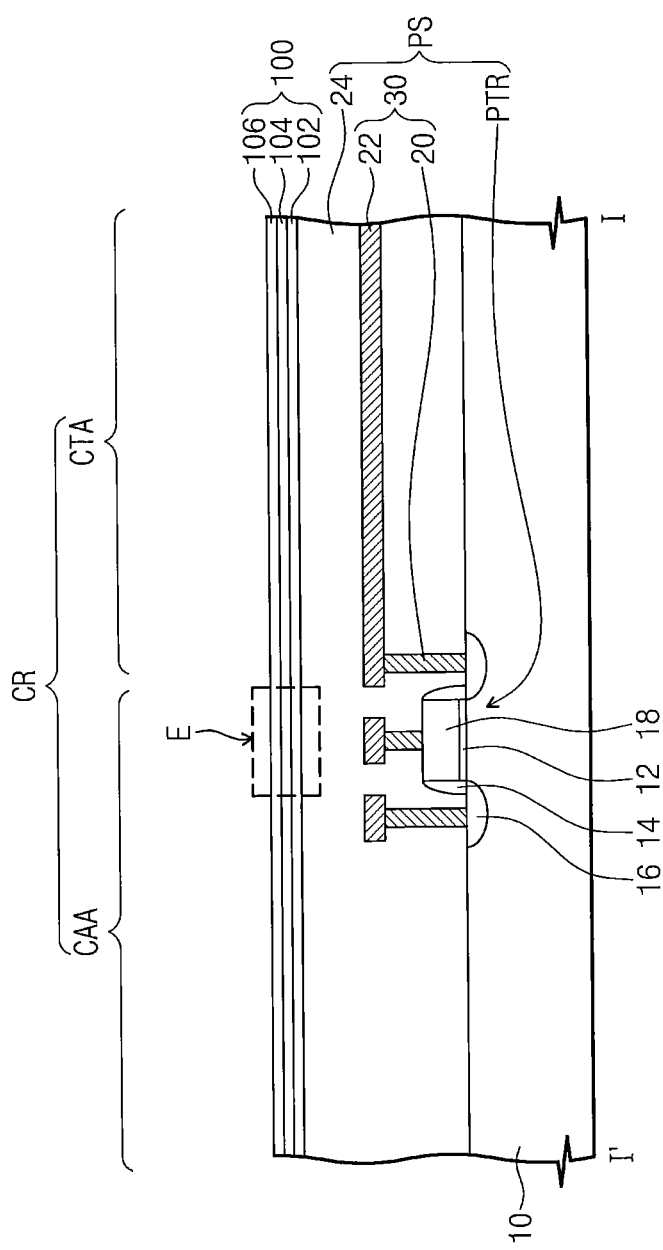
Figure 11B:
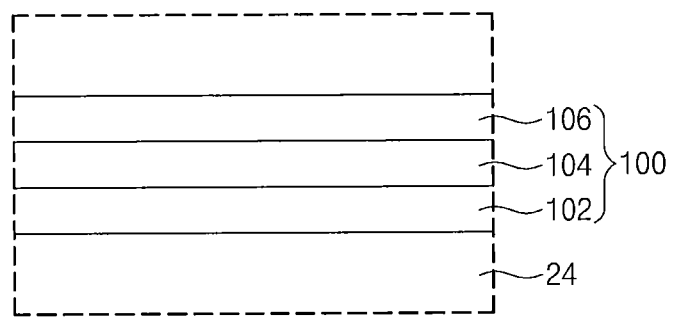
FIG. 11B is an enlarged view of a portion E of FIG. 11A.

FIGS. 10, 11A, 12, 13, 14A, and 15 through 19 are sectional views taken along line I-I' of FIG. 1 to exemplarily illustrate some intermediate steps of a fabrication process for fabricating the three-dimensional semiconductor memory device of FIG. 2. FIG. 11B is an enlarged view of a portion E of FIG. 11A, and FIGS. 14B and 14C are enlarged views of a portion A' of FIG. 14A to illustrate some examples of a vertical structure of a three-dimensional semiconductor memory device according to example embodiments of the inventive concept.

Referring to FIG. 10, the peripheral circuit structure PS may be formed on the substrate 10. The peripheral circuit structure PS may include the peripheral circuit device PTR and the peripheral interconnection structure 30 electrically connected to the peripheral circuit device PTR. The peripheral interconnection structure 30 may include the peripheral circuit contact 20 and the peripheral interconnection lines 22. The substrate 10 may be formed of or include a semiconductor material. For example, the substrate 10 may be a single-crystalline silicon wafer, a single-crystalline germanium wafer, or a single-crystalline silicon-germanium wafer. The substrate 10 may be, for example, a semiconductor substrate with the first conductivity type (e.g., p-type). A well region (not shown) may be formed in the substrate 10.

The peripheral circuit device PTR may include the peripheral gate insulating layer 12, the peripheral gate electrode 18, and the source/drain regions 16 at both sides of the peripheral gate electrode 18. The formation of the peripheral circuit device PTR may include, for example, sequentially forming the peripheral gate insulating layer 12 and the peripheral gate electrode 18 on the substrate 10, and forming the source/drain regions 16 by injecting impurities into the substrate 10 at both sides of the peripheral gate electrode 18. The peripheral circuit device PTR may be formed to serve as, for example, a high voltage transistor. The peripheral gate spacers 14 may be formed on both sidewalls of the peripheral gate electrode 18.

The peripheral gate insulating layer 12 may be formed of or include an oxide material (e.g., silicon oxide) or a high-k dielectric material. The peripheral gate electrode 18 may be formed of or include at least one of silicon (e.g., polysilicon), metal silicides (e.g., tungsten silicide (WSi), nickel silicide (NiSi), cobalt silicide (CoSi), or titanium silicide (TiSi), or tantalum silicide (TaSi)), or metals (e.g., tungsten or aluminum).

The peripheral circuit contacts 20 may be connected to the peripheral gate electrode 18 and the source/drain regions 16 of the peripheral circuit device PTR, and the peripheral interconnection lines 22 may be connected to the peripheral circuit contacts 20. The lower mold insulating layer 24 may be formed on the substrate 10 to cover the peripheral interconnection lines 22 and the peripheral circuit device PTR. The peripheral circuit contacts 20 may be formed to penetrate a portion of the lower mold insulating layer 24. The lower mold insulating layer 24 may be formed to include a plurality of vertically-stacked insulating layers.

The peripheral circuit contacts 20 may be formed of or include silicon (e.g., polysilicon) or metal (e.g., tungsten or copper). In addition, the peripheral circuit contacts 20 may be formed to further include a barrier metal layer, which may be formed of or include at least one of transition metal (e.g., titanium or tantalum) or conductive metal nitride (e.g., titanium nitride or tantalum nitride). The peripheral interconnection lines 22 may be formed of or include metal (e.g., copper or aluminum). The lower mold insulating layer 24 may be formed of or include an oxide or nitride layer.

Referring to FIGS. 11A and 11B, the horizontal active layer 100 may be formed to cover the peripheral circuit structure PS. When viewed in plan view, the horizontal active layer 100 may be formed in such a way that it is overlapped with at least the cell array region CAA and the connection region CTA. For example, the horizontal active layer 100 may be formed on the lower mold insulating layer 24 to have a shape extended in both the first and second directions D1 and D2. The horizontal active layer 100 may include a semiconductor material. For example, the horizontal active layer 100 may include at least one of silicon (Si), germanium (Ge), silicon germanium (SiGe), gallium arsenic (GaAs), indium gallium arsenic (InGaAs), aluminum gallium arsenic (AlGaAs), or mixtures thereof. The horizontal active layer 100 may include, for example, a doped semiconductor material of the first conductivity type or p-type and/or an undoped or intrinsic semiconductor material. The horizontal active layer 100 may be formed to have a poly- or single-crystalline structure. The horizontal active layer 100 may be formed to have a thickness of about 300-600 nm.

In example embodiments, the horizontal active layer 100 may include the first, second, and third active semiconductor layers 102, 104, and 106 which are sequentially formed on the lower mold insulating layer 24. Each of the first to third active semiconductor layers 102, 104, and 106 may be a horizontal layer extending in both the first and second directions D1 and D2. In some embodiments, the first to third active semiconductor layers 102, 104, and 106 may be patterned to have end portions on the connection region CTA.

The first active semiconductor layer 102 may be formed on the lower mold insulating layer 24. The first active semiconductor layer 102 may be doped with impurities to have, for example, a conductivity type of p-type. The first active semiconductor layer 102 may be formed to have a thickness of, for example, about 100-200 nm. In example embodiments, the first active semiconductor layer 102 may be a polysilicon layer that is highly doped with boron (B). The first active semiconductor layer 102 may be formed by a chemical vapor deposition (CVD) process, which is performed at a temperature of about 400° C.-600° C. and under a pressure of about 1 Torr-4 Torr using a silicon source gas (e.g., $SiH_4$ or $Si_2H_6$) and a high-concentration boron source gas (e.g., $BCl_3$ or $B_2H_6$). The first active semiconductor layer 102 may be formed to have a doping concentration of p-type impurities (e.g., boron (B)) ranging from about $1\times10^{19}$ ions/cm$^3$ to about $1\times10^{21}$ ions/cm$^3$.

The second active semiconductor layer 104 may be formed on the first active semiconductor layer 102. The second active semiconductor layer 104 may include an impurity diffusion restraining material preventing impurities from being diffused from the first active semiconductor layer 102 to the third active semiconductor layer 106. In other words, the second active semiconductor layer 104 may be used as an impurity diffusion barrier layer. The second active semiconductor layer 104 may contain, for example, carbon serving as the impurity diffusion restraining material. For example, the second active semiconductor layer 104 may be a carbon-doped semiconductor layer. The second active semiconductor layer 104 may be formed to have a thickness of about 10 nm-200 nm. In example embodiments, the second active semiconductor layer 104 may be formed to be thinner than the first or third active semiconductor layer 102 or 106.

In some embodiments, the second active semiconductor layer 104 may be a carbon-doped polysilicon layer with high carbon concentration. For example, the second active semiconductor layer 104 may be formed by a chemical vapor deposition (CVD) process, which is performed at a temperature of about 400° C.-600° C. and under a pressure of about 1 Torr-4 Torr using the silicon source gas (e.g., $SiH_4$ or $Si_2H_6$) and a high-concentration carbon source gas (e.g., $C_2H_4$). The second active semiconductor layer 104 may be formed to have a carbon doping concentration ranging from about $5 \times 10^{18}$ ions/$cm^3$ to about $1 \times 10^{21}$ ions/$cm^3$.

The third active semiconductor layer 106 may be formed on the second active semiconductor layer 104. The third active semiconductor layer 106 may be formed to have a thickness of about 100-200 nm. In example embodiments, the third active semiconductor layer 106 may be formed to be thicker than the first active semiconductor layer 102. The third active semiconductor layer 106 may be a p-type semiconductor layer (e.g., doped with boron (B)), whose doping concentration is lower than the first active semiconductor layer 102, or may be an undoped semiconductor layer. As an example, the third active semiconductor layer 106 may be a doped layer with a doping concentration of p-type impurities (e.g., boron) ranging from about $1 \times 10^{15}$ ions/$cm^3$ to about $1 \times 10^{18}$ ions/$cm^3$.

In example embodiments, the third active semiconductor layer 106 may be a lightly-doped or undoped polysilicon layer. The third active semiconductor layer 106 may be formed by a chemical vapor deposition (CVD) process, which is performed at a temperature of about 400° C.-600° C. and under a pressure of about 1 Torr-4 Torr using the silicon source gas (e.g., $SiH_4$ or $Si_2H_6$) and a low-concentration boron source gas (e.g., $BCl_3$ or $B_2H_6$). Alternatively, the third active semiconductor layer 106 may be formed by a chemical vapor deposition (CVD) process, which is performed at a temperature of about 400° C.-600° C. and under a pressure of about 1 Torr-4 Torr using only the silicon source gas (e.g., $SiH_4$ or $Si_2H_6$).

In some embodiments, each of the first to third active semiconductor layers 102, 104, and 106 may be formed by performing a CVD process using the silicon source gas (e.g., $SiH_4$ or $Si_2H_6$) to form a silicon layer (e.g., a polysilicon layer) on the lower mold insulating layer 24, and then, performing an ion implantation process on the silicon layer. For example, the first active semiconductor layer 102 may be or include a highly-doped layer, which may be formed by implanting p-type impurities (e.g., B or $BF_2$) at a dose of about $1 \times 10^{14}$ ions/$cm^2$ to about $1 \times 10^{16}$ ions/$cm^2$. The second active semiconductor layer 104 may be or include a diffusion barrier layer, which may be formed by implanting carbon ions at a dose of about $1 \times 10^{14}$ ions/$cm^2$ to about $1 \times 10^{16}$ ions/$cm^2$. The third active semiconductor layer 106 may be or include a lightly-doped layer, which may be formed by implanting p-type impurities (e.g., B or $BF_2$) at a dose of about $1 \times 10^{12}$ ions/$cm^2$ to about $1 \times 10^{14}$ ions/$cm^2$. Alternatively, the implantation of p-type impurities may be omitted, and in this case, the third active semiconductor layer 106 may be in an undoped state.

In example embodiments, first to third active semiconductor layers 102, 104, and 106 may be formed to have a single-crystalline structure.

Referring to FIG. 12, an insulating structure 300 may be formed on the cell array region CAA and the connection region CTA.

The insulating structure 300 may be formed on the horizontal active layer 100. The insulating structure 300 may include the insulating layers 110 and sacrificial layers 112 that are alternatingly and repeatedly stacked on the horizontal active layer 100. In other words, the insulating structure 300 may include a plurality of insulating layers 110 and a plurality of sacrificial layers 112. The sacrificial layers 112 may be formed of a material having an etch selectivity with respect to the insulating layers 110. For example, the sacrificial layers 112 may be formed of a material having a much higher etch rate than the insulating layers 110 in a wet etching process for removing the sacrificial layers 112. In example embodiments, each of the insulating layers 110 may be a silicon oxide layer or a silicon nitride layer, and the sacrificial layers 112 may be formed of one of a silicon oxide layer, a silicon nitride layer, a silicon carbide layer, a silicon layer, or a silicon germanium layer. As an example, the insulating layers 110 may be formed of the silicon oxide layer, and the sacrificial layers 112 may be formed of the silicon nitride layer.

The insulating layers 110 and the sacrificial layers 112 may be formed using a thermal chemical vapor deposition (Thermal CVD) process, a plasma enhanced CVD process, or an atomic layer deposition (ALD) process.

The sacrificial layers 112 may be formed to have substantially the same thickness. In example embodiments, the lowermost one of the insulating layers 110 may be in contact with the horizontal active layer 100. The lowermost one of the insulating layers 110 may be a silicon oxide layer formed by a thermal oxidation process or a deposition process and may be thinner than the others of the insulating layers 110 provided thereon. In some embodiments, the second lowermost one and the uppermost one of the insulating layers 110 may be formed to be thicker than the others of the insulating layers 110 or the sacrificial layers 112.

The insulating structure 300 may be patterned to have a stepwise profile on the connection region CTA. In other words, the insulating structure 300 may be patterned to have a stepwise sidewall structure. For example, the insulating structure 300 may be formed in such a way that on the connection region CTA a vertical thickness thereof decreases stepwise in a direction away from the cell array region CAA. The insulating structure 300 may be formed to expose a portion of the horizontal active layer 100.

The upper mold insulating layer 120 may be formed on the connection region CTA to cover the horizontal active layer 100. In some embodiments, the upper mold insulating layer 120 may be formed on a portion of the lower mold insulating layer 24 to cover the end portions of the horizontal active layer 100. The upper mold insulating layer 120 may be formed of or include, for example, an oxide or nitride layer.

Figure 13:
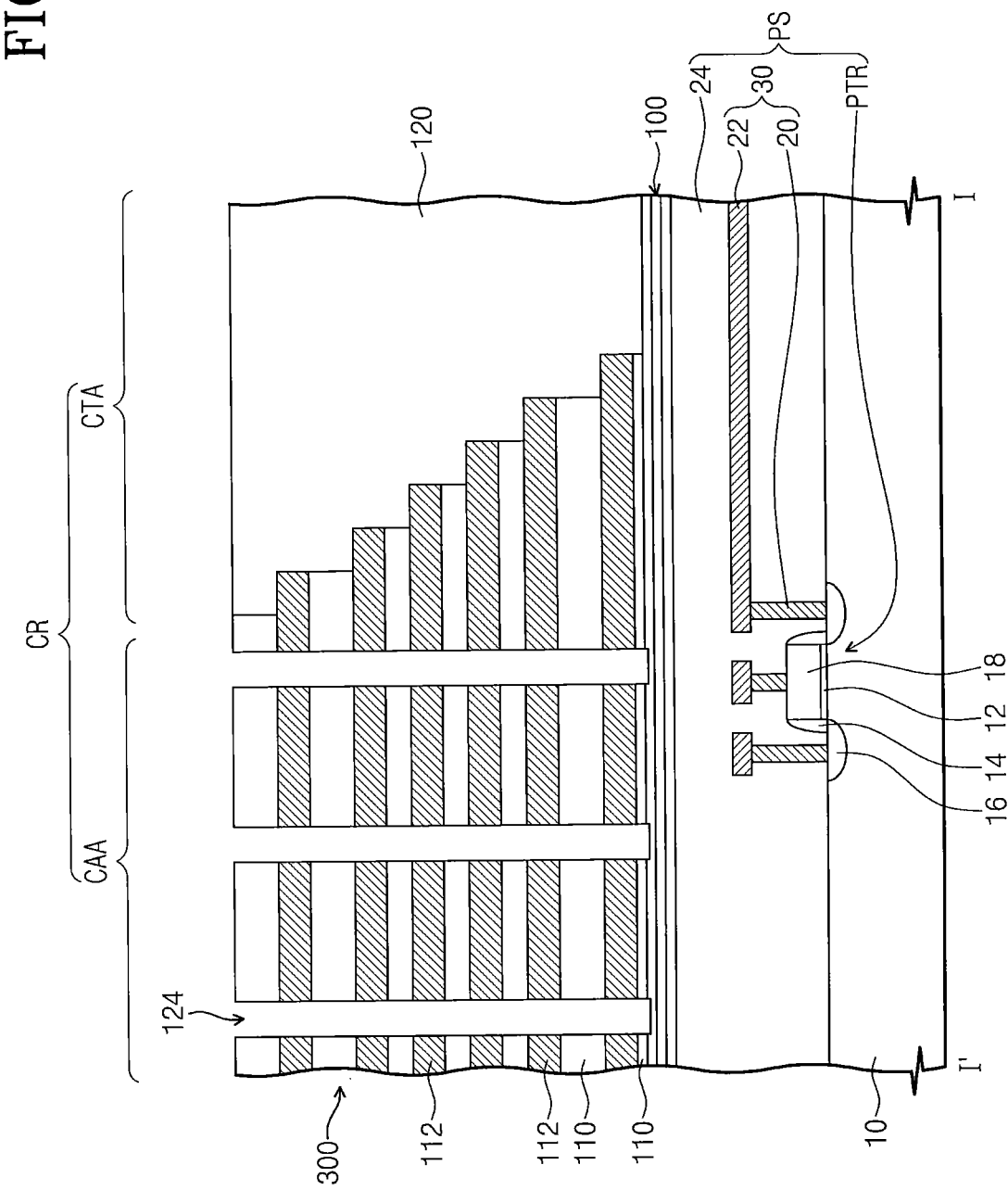

Referring to FIG. 13, vertical holes 124 may be formed to penetrate the insulating structure 300 on the cell array region CAA. The vertical holes 124 may be formed by anisotropically etching the insulating structure 300. When viewed in plan view, the vertical holes 124 may be formed to have the same arrangement as that of the vertical structures 200 of FIG. 1. For example, the vertical holes 124 may be arranged to form a plurality of rows parallel to the first direction D1 and a plurality of columns parallel to the second direction D2. When the vertical holes 124 are formed, a portion (e.g., the third active semiconductor layer 106) of the horizontal active layer 100 may be over-etched to have a recessed profile.

Figure 14A:
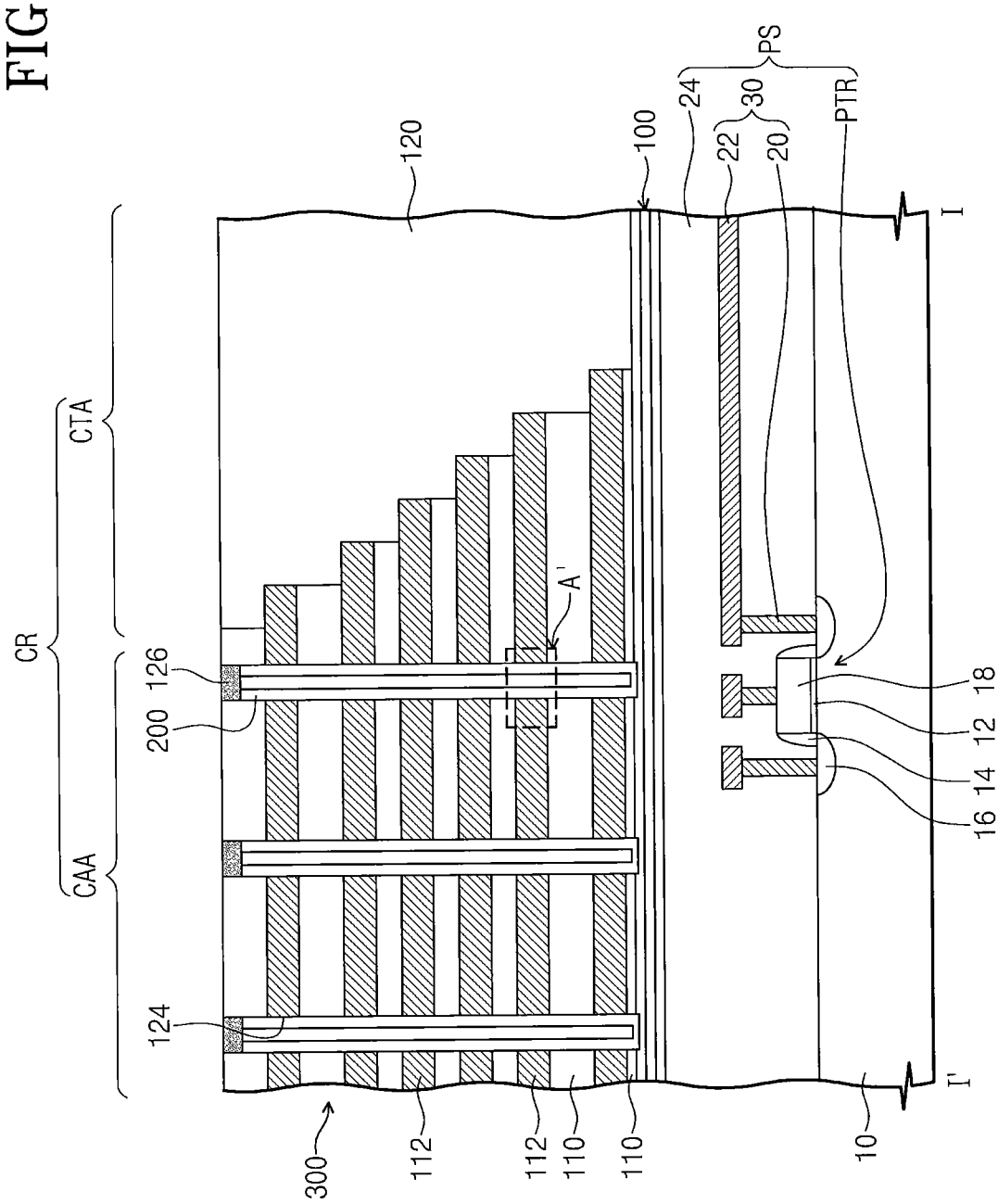
Figure 14B:
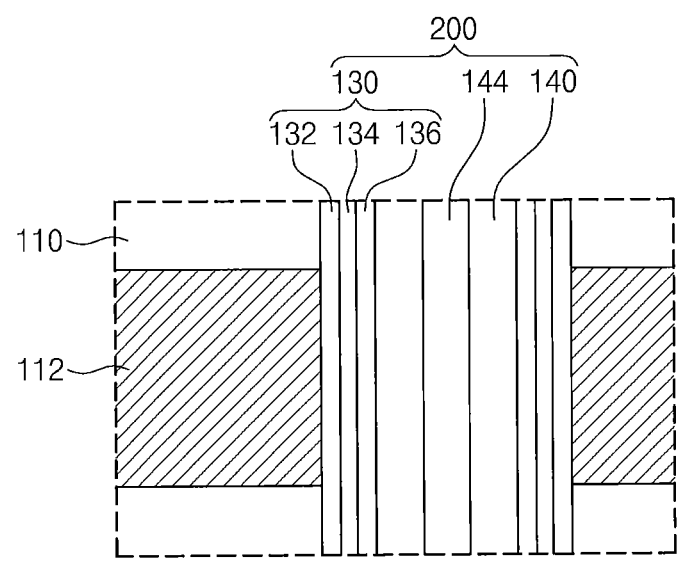
FIGS. 14B and 14C are enlarged views of a portion A' of FIG. 14A to illustrate some examples of a vertical structure of a three-dimensional semiconductor memory device according to example embodiments of the inventive concept.
Figure 14C:
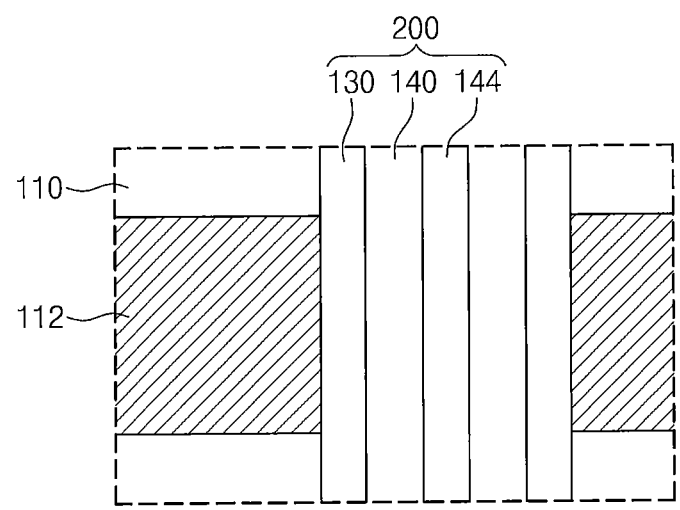

Referring to FIGS. 14A through 14C, the vertical structures 200 may be formed on the horizontal active layer 100. The vertical structures 200 may vertically penetrate the insulating structure 300 and may be in contact with a top surface of the horizontal active layer 100. For example, the vertical structures 200 may be formed to fill the vertical holes 124, respectively, and may vertically stand on the top surface of the horizontal active layer 100. Each of the vertical structures 200 may include the vertical pillar 140 vertically standing on or extending from the top surface of the horizontal active layer 100.

According to example embodiments of the inventive concept, the vertical pillar 140 may be configured to serve as a vertical channel pattern. For example, as shown in FIG. 14B, each of the vertical structures 200 may include the vertical pillar 140 serving as the vertical channel pattern, the memory pattern 130, and the insulating gap-filling pattern 144.

The memory pattern 130 may be formed to cover an inner side surface of the vertical hole 124. For example, the memory pattern 130 may be a spacer-shaped structure provided on the inner side surface of the vertical hole 124 and may extend from a top portion of the vertical hole 124 to the top surface of the third active semiconductor layer 106. As an example, the memory pattern 130 may be a top- and bottom-open structure. The memory pattern 130 may be in contact with the insulating and sacrificial layers 110 and 112 of the insulating structure 300. The memory pattern 130 may include a layer in which data can be stored. For example, the memory pattern 130 may have a layer structure, allowing for the Fowler-Nordheim (FN) tunneling phenomenon. In example embodiments, the memory pattern 130 may include a plurality of thin layers.

For example, the memory pattern 130 may include the first blocking insulating layer 132, the charge storing layer 134, and the tunnel insulating layer 136, which may be sequentially formed on the inner side surface of the vertical hole 124. The first blocking insulating layer 132 may be formed of or include a silicon oxide layer and/or a high-k dielectric (e.g., aluminum oxide or hafnium oxide). Further, the first blocking insulating layer 132 may be provided in the form of a single layer or a plurality of layers. For example, the first blocking insulating layer 132 may be a single silicon oxide layer. Alternatively, the first blocking insulating layer 132 may include a plurality of thin layers including at least one of a silicon oxide layer, an aluminum oxide layer, and/or a hafnium oxide layer.

The charge storing layer 134 may be a trap insulating layer or an insulating layer with conductive nano dots. The trap insulating layer may include, for example, a silicon nitride layer. The tunnel insulating layer 136 may be, for example, a silicon oxide layer. The first blocking insulating layer 132 and the charge storing layer 134 may be formed using a plasma enhanced CVD process or an atomic layer deposition (ALD) process. The tunnel insulating layer 136 may be formed using a plasma enhanced CVD process, an atomic layer deposition (ALD) process, or a thermal CVD process. The tunnel insulating layer 136 may be in contact with the vertical channel pattern 140.

The vertical pillar 140 may be formed to be in contact with the memory pattern 130. The vertical pillar 140 may be formed to conformally cover an inner surface of each of the vertical holes 124. For example, the vertical pillar 140 may be a liner structure vertically standing on the horizontal active layer 100. The vertical pillar 140 may have a top-open structure. In some embodiments, the vertical pillar 140 may be formed to have a top- and bottom-open structure, a hollow cylindrical structure, or a macaroni-shaped structure. In other embodiments, the vertical pillar 140 may be formed to have a solid pillar structure, and in this case, the insulating gap-filling pattern 144 may not be formed in the vertical pillar 140. The vertical pillar 140 may include a semiconductor material. For example, the vertical pillar 140 may be a pattern including one of poly-crystalline, amorphous, or single-crystalline semiconductor materials. In certain embodiments, the vertical channel pattern 140 may include at least one of silicon (Si), germanium (Ge), silicon germanium (SiGe), gallium arsenic (GaAs), indium gallium arsenic (InGaAs), aluminum gallium arsenic (AlGaAs), or mixtures thereof. The vertical pillar 140 may be formed of an undoped semiconductor material or a doped semiconductor material having the same conductivity type as the horizontal active layer 100. The vertical pillar 140 may be formed using an ALD process, a CVD process, or an epitaxial growth process.

The insulating gap-filling patterns 144 may be formed to fill the vertical holes 124 provided with the vertical pillar 140. The insulating gap-filling pattern 144 may include a silicon oxide layer or a silicon nitride layer. Before the formation of the insulating gap-filling pattern 144, a hydrogen annealing process may be further performed to cure crystal defects, which may be produced in the vertical channel pattern 140.

As another example, the vertical pillars 140 of the vertical structures 200 may be used as vertical-pillar-shaped electrodes. Referring to FIG. 14C, the vertical structures 200 may include the vertical pillar 140 and the memory pattern 130. The vertical pillar 140 may be a vertical-pillar-shaped electrode connected to the horizontal active layer 100. Further, the vertical structures 200 may include the insulating gap-filling pattern 144.

The memory pattern 130 and the vertical pillar 140 may be sequentially provided on an inner side surface of the vertical hole 124. The vertical pillar 140 may include at least one conductive material. For example, the vertical pillar 140 may be formed of or include at least one of doped semiconductor materials, metals, conductive metal nitrides, silicides, or nano structures (e.g., carbon nanotube). The memory pattern 130 may be provided between the insulating structure 300 and the vertical pillar 140. The memory pattern 130 may be a variable resistive pattern. For example, the memory pattern 130 may be formed of or include at least one of materials exhibiting a variable resistance property.

As an example, the memory pattern 130 may include a material (for example, a phase-changeable material), whose electrical resistance can be changed using thermal energy applied thereto. Here, the thermal energy may be generated by an electric current passing through an electrode adjacent to the memory pattern 130. The phase-changeable material may include at least one of antimony (Sb), tellurium (Te), or selenium (Se). For example, the phase-changeable material may include a chalcogenide formed of tellurium (Te) having about 20-80 atomic percent concentration, antimony (Sb) having about 5-50 atomic percent concentration, and germanium (Ge) having the remaining concentration. In addition, the phase-changeable material may further include at least one of N, O, C, Bi, In, B, Sn, Si, Ti, Al, Ni, Fe, Dy, or La as an impurity.

As another example, the memory pattern 130 may be configured to have a layered structure whose electrical resistance can be changed using a spin transferring phenomenon of an electric current flowing therethrough. The memory pattern 130 may be a layered structure exhibiting a magneto-resistance property and may be configured to include at least one ferromagnetic material and/or at least one antiferromagnetic material.

As other example, the memory pattern 130 may include at least one of perovskite compounds or transition metal oxides. For example, the memory pattern 130 may be formed of or include at least one of niobium oxide, titanium oxide, nickel oxide, zirconium oxide, vanadium oxide, PCMO((Pr, Ca)MnO$_3$), strontium-titanium oxide, barium-strontium-titanium oxide, strontium-zirconium oxide, barium-zirconium oxide, or barium-strontium-zirconium oxide. The insulating gap-filling pattern 144 may be formed to fill the vertical holes 124 provided with the vertical pillar electrode pattern 140.

Conductive pads 126 may be formed on the vertical structures 200, respectively. The conductive pads 126 may be formed of or include a conductive material. The conductive pad 126 may be provided in the form of a pattern doped with impurities. In example embodiments, end portions of the vertical structures 200 in contact with the conductive pad 126 may serve as drain regions.

Figure 15:
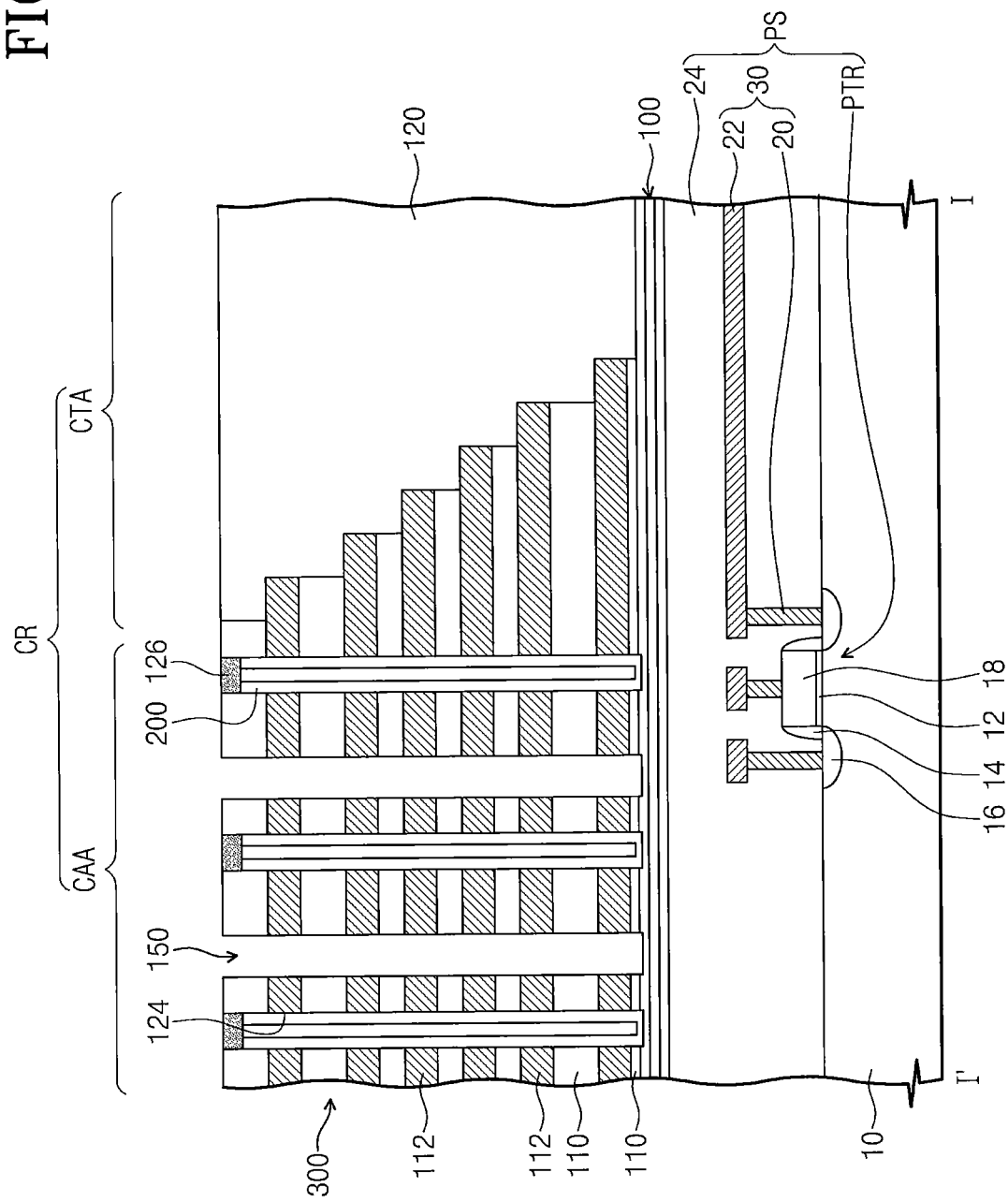

Referring to FIG. 15, a trench 150 may be formed in the insulating structure 300 and on the cell array region CAA. The formation of the trench 150 may include patterning the insulating structure 300 to expose the third active semiconductor layer 106 of the horizontal active layer 100. For example, the trench 150 may be formed to extend parallel to the first direction D1, and thus, as shown in FIG. 1, the insulating structure 300 may be divided into a plurality of portions in the second direction D2. Accordingly, as shown in FIG. 1, the vertical structures 200 may constitute a plurality of groups, each of which includes a plurality of vertical structures 200 arranged parallel to the first direction D1. In example embodiments, each group of the vertical structures 200 may be disposed between a pair of the trenches 150 adjacent thereto. Each group of the vertical structures 200 may include one or more rows of the vertical structures 200 arranged parallel to the first direction D1. In certain embodiments, the trench 150 may be formed to have a slanted side surface.

Figure 16:
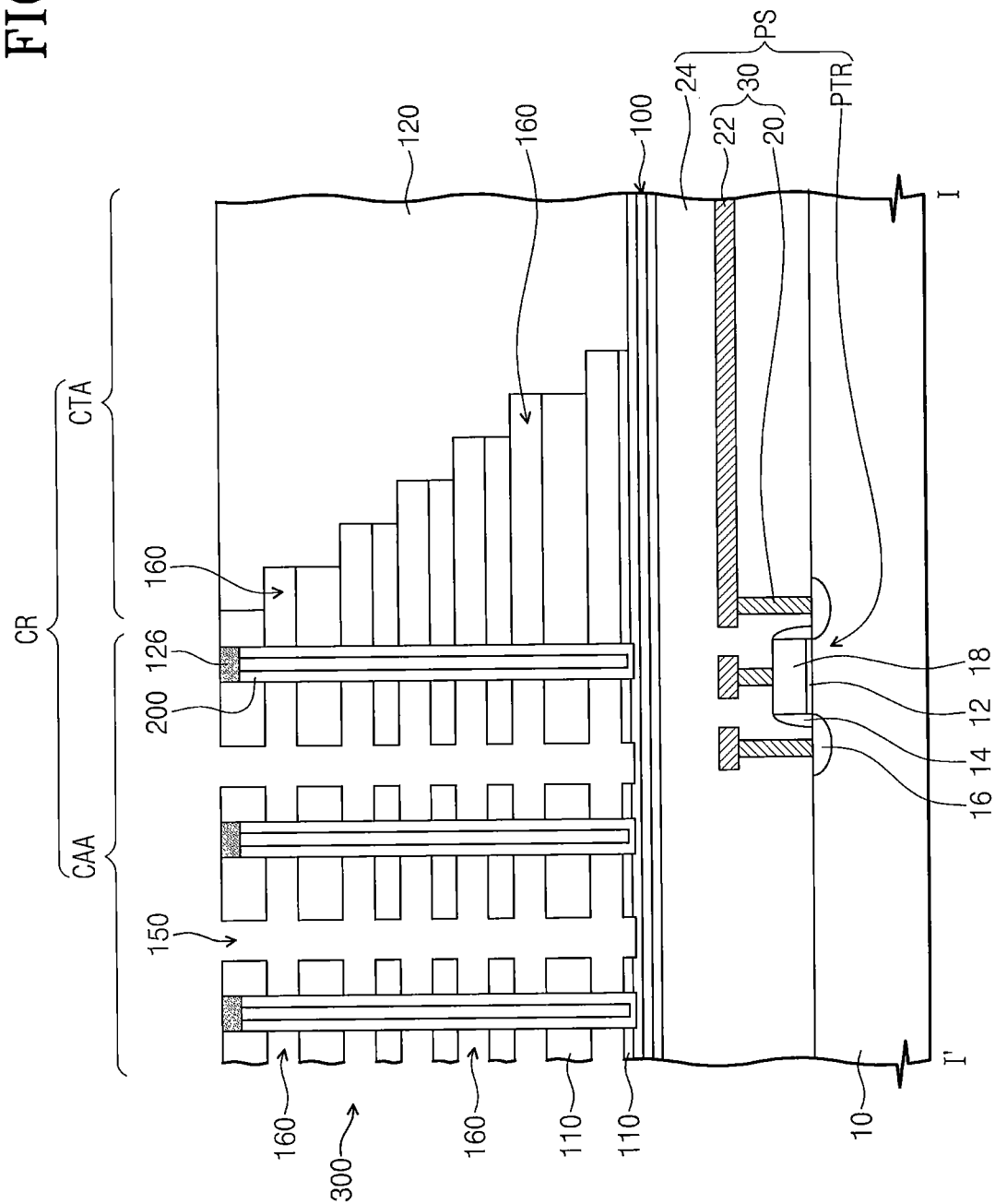

Referring to FIG. 16, openings 160 may be formed in the insulating structure 300 and on the cell array region CAA and the connection region CTA. For example, the openings 160 may be formed by removing the sacrificial layers 112 from the insulating structure 300 through the trench 150. For example, the formation of the openings 160 may include selectively removing the sacrificial layers 112 with an isotropic etching technique. The openings 160 may be formed to expose the sidewall of the vertical structure 200.

Figure 17:
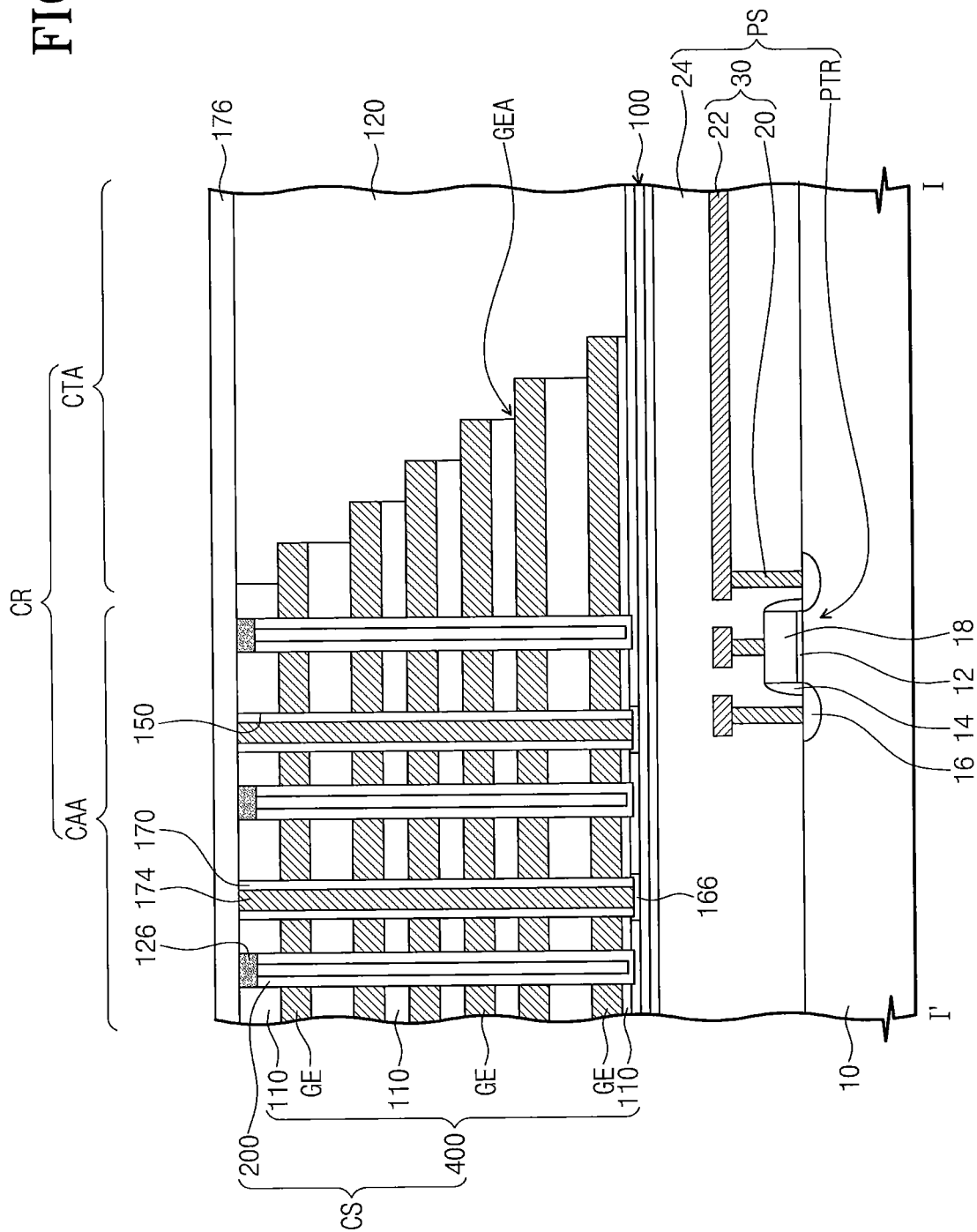

Referring to FIG. 17, the cell array structure CS may be formed on the cell array region CAA. The cell array structure CS may include the stacks 400, the vertical structures 200, and the common source region 166. Each of the stacks 400 may include the electrodes GE vertically stacked on the cell array region CAA, and the vertical structures 200 may be formed to penetrate the stacks 400.

The formation of the electrodes GE may include depositing a conductive layer to fill the openings 160 and then patterning the conductive layer. The patterning of the conductive layer may be performed to remove the conductive layer from the trench 150. As a result of the removal of the conductive layer from the trench, the conductive layer may be vertically separated to form the electrodes GE remaining in the openings 160. In example embodiments, as shown in FIG. 3A, before the deposition of the conductive layer, the second blocking insulating layer 138 may be formed in the opening 160. For example, the second blocking insulating layer 138 may be formed to cover the top, bottom, and side surfaces of the electrodes GE and be in contact with the first blocking insulating layer 132 of the memory pattern 130. In other embodiments, as shown in FIG. 3B, the electrodes GE may be in direct contact with the memory pattern 130.

The electrodes GE may extend from the cell array region CAA to the connection region CTA and may have the pad portions GEA positioned on the connection region CTA. The pad portions GEA of the electrodes GE may be formed to have a stepwise structure. For example, horizontal lengths of the electrodes GE may decrease in an upward vertical direction away from the horizontal active layer 100.

That is, the stacks 400 may include the insulating layer 110 and the electrodes GE that are alternatingly and repeatedly stacked on the horizontal active layer 100 in the vertical direction. As shown in FIG. 1, the stacks 400 may extend parallel to the first direction D1 and may be separated from each other in the second direction D2. The vertical structures 200 may be formed to vertically penetrate the stacks 400, and thus, the electrodes GE may surround the vertical structures 200. Each of the stacks 400 may have a stepwise sidewall profile on the connection region CTA.

The common source region 166 may be formed in the horizontal active layer 100. For example, the common source region 166 may be formed in a portion of the horizontal active layer 100 exposed by the trench 150. The formation of the common source region 166 may include doping the third active semiconductor layer 106 of the horizontal active layer 100 exposed by the trench 150 with impurities. The doping of the third active semiconductor layer 106 may be performed using dopants (e.g., phosphorus (P) or arsenic (As)), and, thus, the common source region 166 may be formed to have the second conductivity type (e.g., n-type). In the common source region 166, the dopant concentration may range from about $1 \times 10^{19}$ ions/cm$^3$ to about $1 \times 10^{21}$ ions/cm$^3$.

The common source plug 174 and the insulating isolation spacer 170 may be formed on the common source region 166. The common source plug 174 and the insulating isolation spacer 170 may be formed to fill the trench 150. The insulating isolation spacer 170 may be provided to protect side surfaces of the electrodes GE and separate the electrodes GE electrically from the common source plug 174. The insulating isolation spacer 170 may be formed of at least one of silicon oxide, silicon nitride, silicon oxynitride, or low-k materials. The common source plug 174 may be formed to extend parallel to the common source region 166 or the first direction D1. The common source plug 174 may include a metallic material (e.g., tungsten, copper or aluminum) In addition, the common source plug 174 may further include a barrier metal layer. For example, the barrier metal layer for the common source plug 174 may be formed of or include at least one of transition metal (e.g., titanium or tantalum) or conductive metal nitride (e.g., titanium nitride or tantalum nitride).

The capping insulating layer 176 may be formed on the upper mold insulating layer 120 and the stack 400. The capping insulating layer 176 may be formed of, for example, an oxide layer or a nitride layer.

Figure 18:
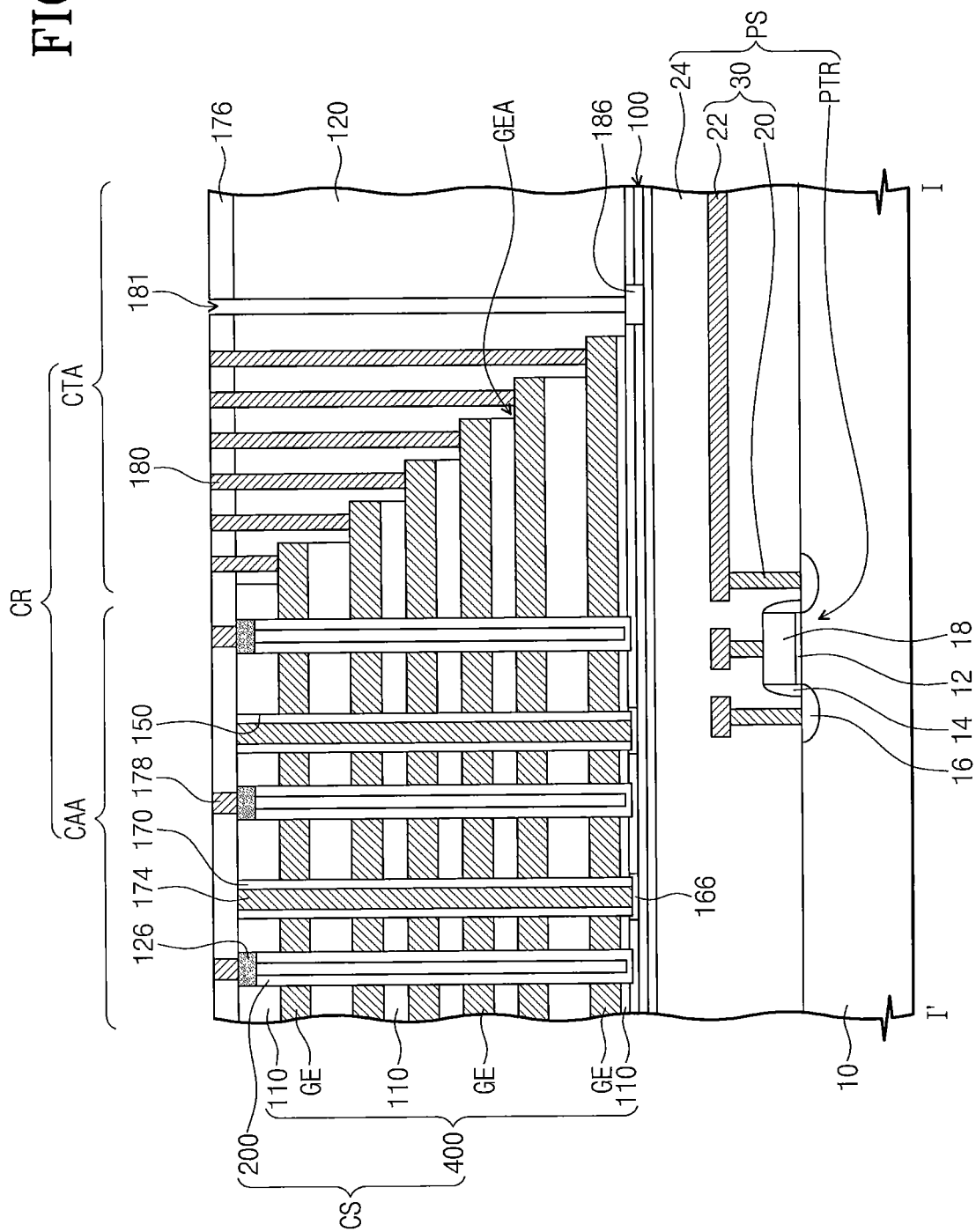

Referring to FIG. 18, the bit line contacts 178 may be formed on the cell array region CAA, and the first contacts 180 and the pick-up region 186 may be formed on the connection region CTA. The bit line contacts 178 may be connected to the vertical structures 200, the first contacts 180 may be connected to the electrodes GE, and the pick-up region 186 may be formed in the horizontal active layer 100.

The bit line contacts 178 may be formed to penetrate the capping insulating layer 176 and may be connected to the conductive pads 126, respectively.

The first contacts 180 may be formed to penetrate the capping insulating layer 176 and the upper mold insulating layer 120 and may be connected to the pad portions GEA of the electrodes GE, respectively. Vertical lengths of the first contacts 180 may increase in a direction away from the cell array region CAA. The first contacts 180 may constitute a part of the cell interconnection structure.

The bit line contact 178 and the first contact 180 may include a metallic material (e.g., tungsten, copper, or aluminum). In addition, the bit line contact 178 and the first contact 180 may be formed to include a barrier metal layer, which may be formed of or include at least one of transition metals (e.g., titanium or tantalum) or conductive metal nitrides (e.g., titanium nitride or tantalum nitride).

The pick-up region 186 may be formed on the connection region CTA and around the cell array structure CS. As shown in FIG. 1, the pick-up region 186 may be disposed to be adjacent to both sides of the stack 400, when viewed in the first direction D1. For example, the pick-up region 186 may be disposed adjacent to the pad portions GEA of the electrodes GE of the stack 400. The pick-up region 186 may include a plurality of regions spaced apart from each other in the second direction D2. As shown in FIG. 4A, the pick-up region 186 may be formed in the second and third active semiconductor layers 104 and 106 and may be in contact with the first active semiconductor layer 102. The pick-up region 186 may be highly doped with impurities and may have the same conductivity type (e.g., p-type) as the first active semiconductor layer 102. For example, the pick-up region 186 may be formed to have a doping concentration of p-type impurities (e.g., boron (B)) ranging from about $1\times10^{19}$ ions/cm$^3$ to about $1\times10^{21}$ ions/cm$^3$. In some embodiments, the formation of the pick-up region 186 may include forming a pick-up hole 181 penetrating the capping insulating layer 176 and the upper mold insulating layer 182 and injecting p-type impurities (e.g., B or $BF_2$) into the horizontal active layer 100.

In example embodiments, as shown in FIG. 4B, the pick-up diffusion barrier region 188 may be formed around the pick-up region 186. The pick-up diffusion barrier region 188 may be formed in the third active semiconductor layer 106 to surround at least a portion of the side surface of the pick-up region 186 and may be in contact with the second active semiconductor layer 104. The pick-up diffusion barrier region 188 may reduce or prevent the impurities (e.g., boron (B)) in the pick-up region 186 from being diffused into the third active semiconductor layer 106. Further, the pick-up diffusion barrier region 188 may reduce or prevent the impurities in the pick-up region 186 from being diffused into a neighboring one of the common source regions 166. In example embodiments, the pick-up region 186 may be formed by injecting carbon atoms into the third active semiconductor layer 106 through the pick-up hole 181. The pick-up region 186 may be formed to have the same or about the same carbon concentration as that of the second active semiconductor layer 104.

Figure 19:
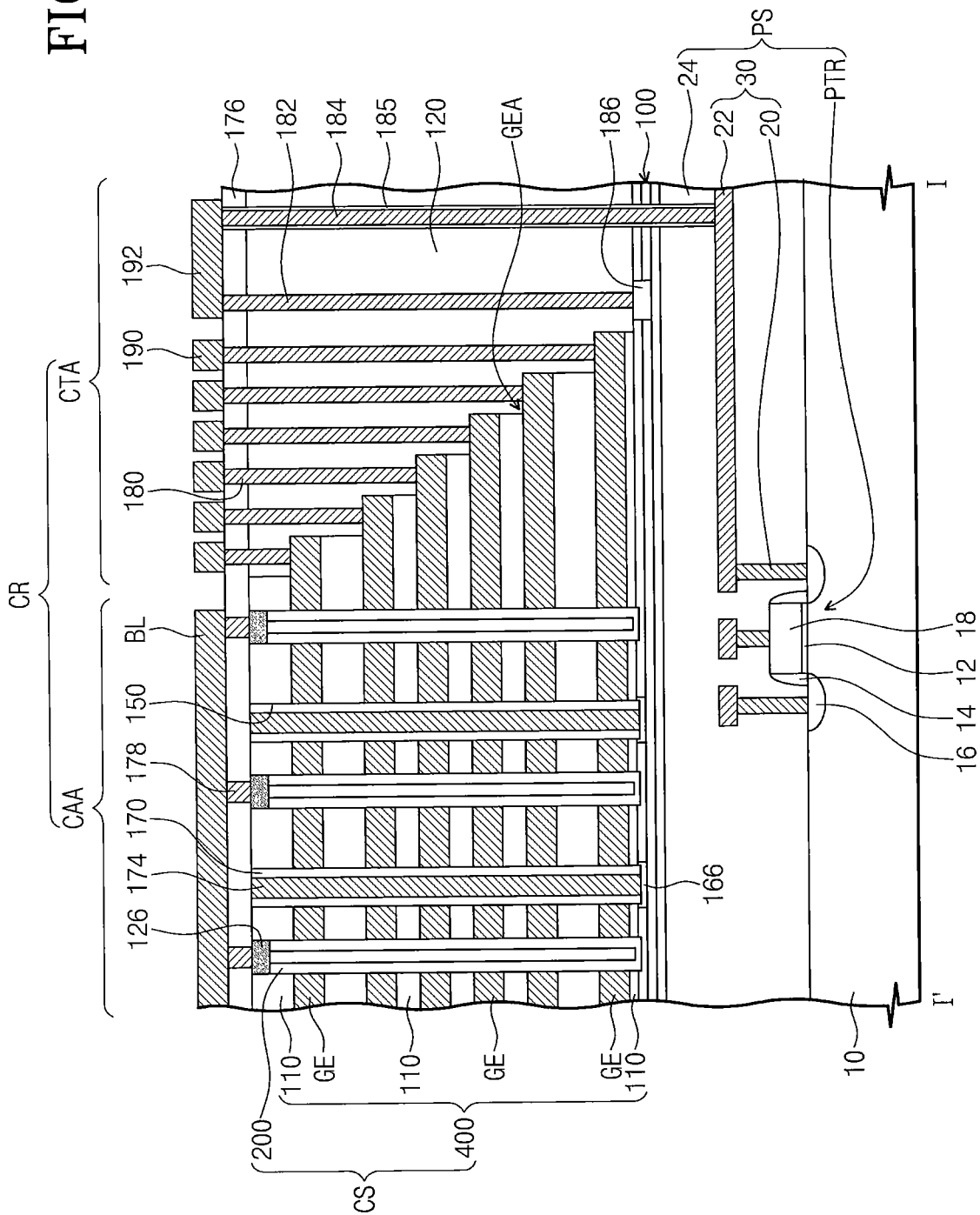

Referring to FIG. 19, the bit lines BL may be formed on the cell array region CAA, and the cell interconnection structure may be formed on the connection region CTA. The bit lines BL may be electrically connected to the vertical structures 200, and the cell interconnection structure may be electrically connected to the peripheral circuit structure PS.

The bit lines BL may be formed on the capping insulating layer 176 and may be electrically connected to the bit line contacts 178. The bit lines BL may be electrically connected to the vertical structures 200 via the bit line contacts 178.

The cell interconnection structure may include the first to third contacts 180, 182, and 184 and the first and second upper interconnection lines 190 and 192.

The second contact 182 may be formed to penetrate the capping insulating layer 176 and the upper mold insulating layer 120 and may be electrically connected to the horizontal active layer 100. For example, the second contact 182 may be formed to fill the pick-up hole 181, thereby being coupled to the pick-up region 186. Because the pick-up region 186 is coupled to the first active semiconductor layer 102 of the horizontal active layer 100, a voltage applied to the second contact 182 may be effectively delivered to the first active semiconductor layer 102. In some embodiments, as shown in FIG. 4C, the pick-up region 186 may not be formed in the horizontal active layer 100, and the second contact 182 may be formed to penetrate the second and third active semiconductor layers 104 and 106 and may be directly coupled to the first active semiconductor layer 102.

The third contact 184 may be formed to penetrate the capping insulating layer 176, the upper mold insulating layer 120, the horizontal active layer 100, and the lower mold insulating layer 24 and may be connected to the peripheral interconnection line 22. The peripheral circuit structure PS and the cell array structure CS may be electrically connected to each other through the third contact 184. The insulating spacer 185 may be formed to surround the third contact 184.

The first interconnection line 180 may be formed on the capping insulating layer 176 and may be connected to the first contacts 180. The second upper interconnection line 192 may be formed on the capping insulating layer 176 and may be connected to the second and third contacts 182 and 184. As shown, the third contact 184 may be connected to the second upper interconnection line 192, but example embodiments of the inventive concepts may not be limited thereto. For example, the third contact 184 may be connected to the bit line BL or the first upper interconnection line 190.

The second and third contacts 182 and 184 may be formed to include a metallic material (e.g., tungsten, copper, or aluminum). In addition, the second contact and third contacts 182 and 184 may be formed to include a barrier metal layer. For example, the barrier metal layer for the second and third contacts 182 and 184 may be formed of or include at least one of transition metals (e.g., titanium or tantalum) or conductive metal nitrides (e.g., titanium nitride or tantalum nitride). The bit line BL and the first and second upper interconnection lines 190 and 192 may be formed of or include a metallic material (e.g., aluminum or copper).

FIGS. 20 through 23 are sectional views taken along line I-I' of FIG. 1 to exemplarily illustrate some intermediate steps of a fabrication process for fabricating the three-dimensional semiconductor memory device of FIG. 5.

In the fabrication process according to the present embodiment, fabrication steps from the peripheral circuit structure PS to the vertical holes 124 may be substantially the same as those of the fabrication process described with reference to FIGS. 10 through 13, and thus, a detailed explanation thereof is omitted below to avoid redundancy.

Figure 20:
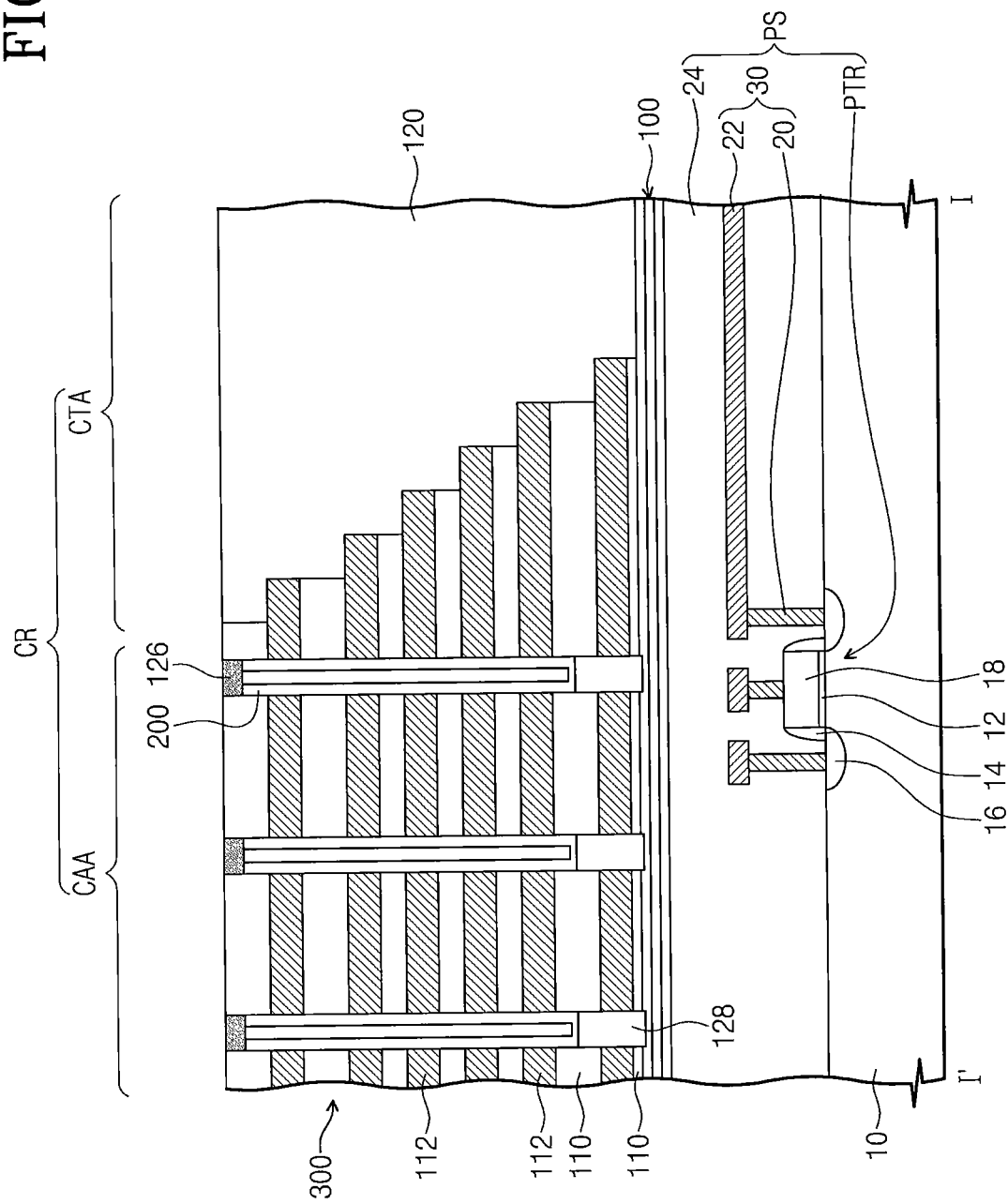
FIGS. 20 through 23 are sectional views taken along line I-I' of FIG. 1 to exemplarily illustrate some intermediate steps of a fabrication process for fabricating the three-dimensional semiconductor memory device of FIG. 5.

Referring to FIG. 20, the first semiconductor patterns 128 may be formed in the vertical holes 124, respectively. The first semiconductor patterns 128 may include at least one of silicon (Si), germanium (Ge), silicon germanium (SiGe), gallium arsenic (GaAs), indium gallium arsenic (InGaAs), aluminum gallium arsenic (AlGaAs), or mixtures thereof. The first semiconductor pattern 128 may be formed to have a pillar-shaped structure vertically extending from the horizontal active layer 100 and having a top surface higher than that of the lowermost one of the electrodes GE relative to the substrate 10. Further, the top surface of the first semiconductor pattern 128 may be lower than that of the second lowermost one of the insulating layers 110. The first semiconductor pattern 128 may be formed by an epitaxial process using the third active semiconductor layer 106 of the horizontal active layer 100 as a seed layer and may be formed to fill a lower portion of the vertical hole 124. Here, the third active semiconductor layer 106 may be an undoped semiconductor layer, and the first semiconductor pattern 128 may be formed to have a poly-crystalline structure, whose grain size is larger than that of a layer formed using a chemical vapor deposition technique. Further, the first semiconductor patterns 128 provided on the cell region CR may be formed to have substantially the same shape and thickness. In some embodiments, the first semiconductor pattern 128 may be formed of a single-crystalline semiconductor material (e.g., single-crystalline silicon)

The first semiconductor pattern 128 may be used as a channel region of the ground selection transistor GST, which is controlled by the lowermost one of the electrodes GE. In this case, to adjust a threshold voltage of the ground selection transistor GST, the first semiconductor pattern 128 may be doped with impurities (e.g., boron (B)).

The vertical structure 200 may be formed on the first semiconductor pattern 128. In example embodiments, the memory pattern 130, the vertical pillar 140, and the insulating gap-filling pattern 144 may be sequentially formed on the first semiconductor pattern 128. That is, an inner side surface of the vertical hole 124 may be sequentially covered with the memory pattern 130, the vertical pillar 140, and the insulating gap-filling pattern 144. As shown in FIG. 14B, the memory pattern 130 may be formed to include the first blocking insulating layer 132, the charge storing layer 134, and the tunnel insulating layer 136. The vertical pillar (i.e., vertical channel pattern) 140 may be connected to the first semiconductor pattern 128.

In example embodiments, as shown in FIG. 14C, the memory pattern 130, the vertical pillar (i.e., vertical pillar electrode pattern) 140, and the insulating gap-filling pattern 144 may be formed to sequentially cover the inner side surface of the vertical hole 124 on the first semiconductor pattern 128. The vertical pillar (i.e., vertical pillar electrode pattern) 140 may be formed in such a way that it is connected to the first semiconductor pattern 128.

Figure 21:
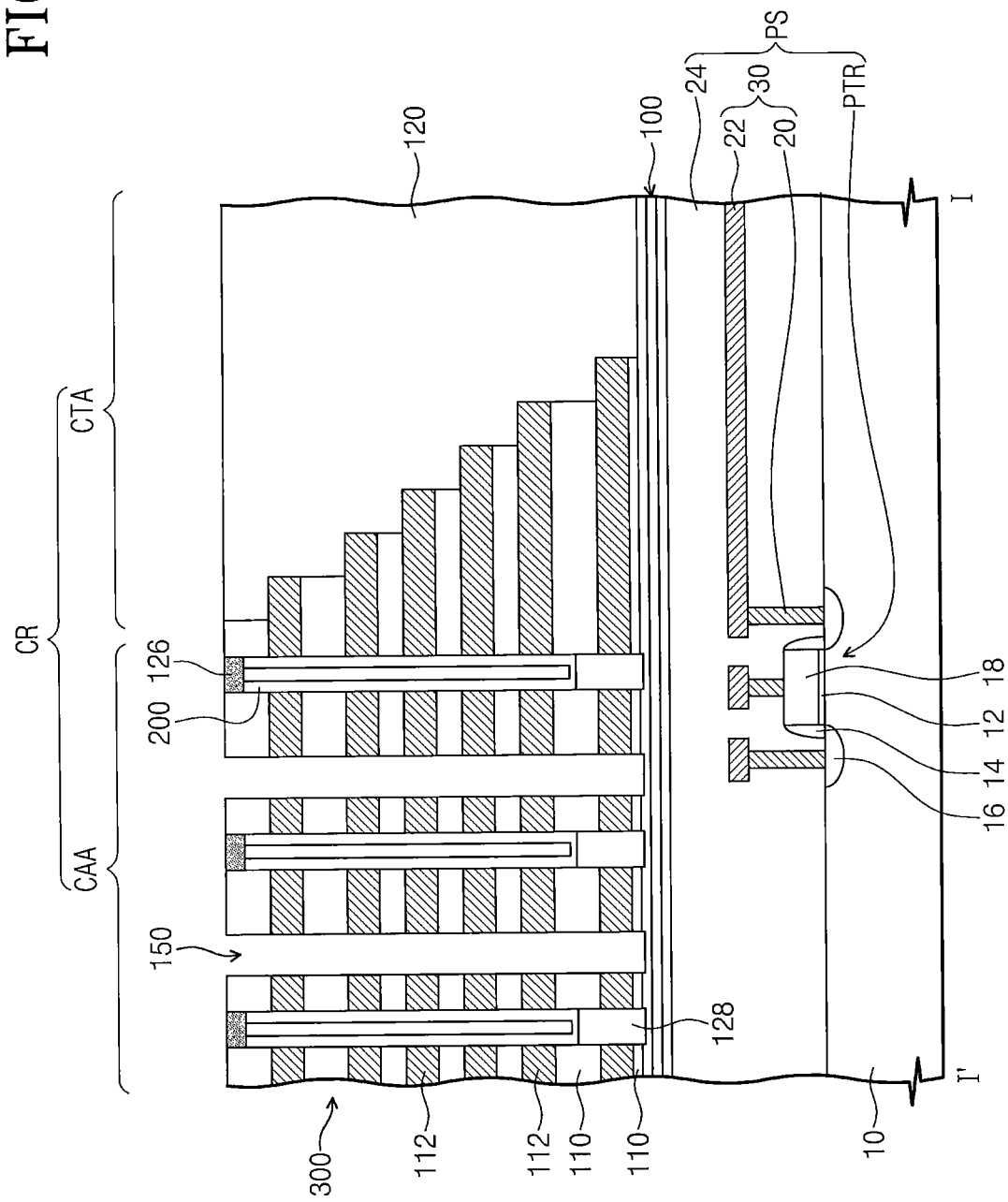
Figure 22:
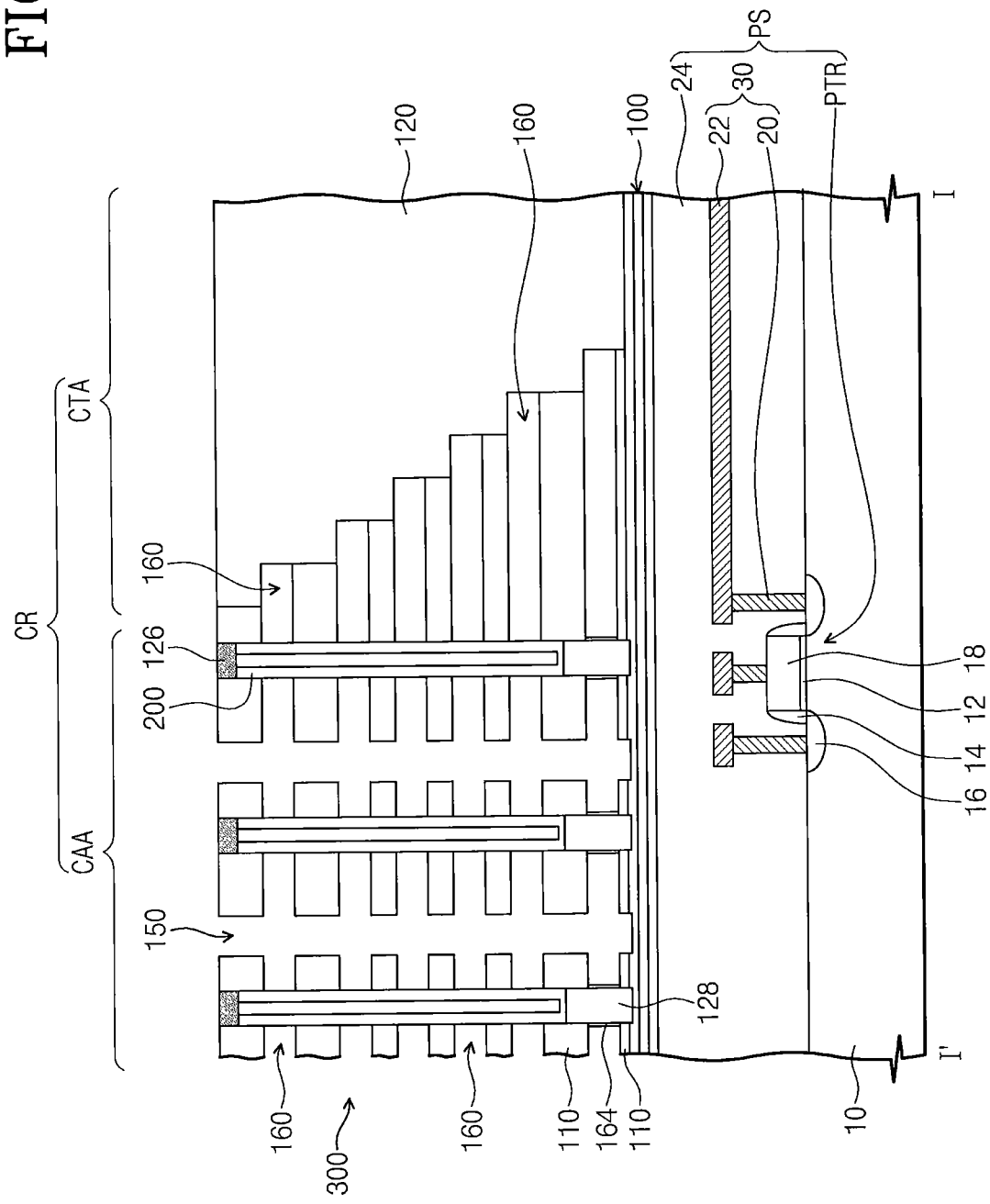

Referring to FIGS. 21 and 22, the trenches 150 and the openings 160 may be formed in the insulating structure 300. The trenches 150 may be formed to penetrate the insulating structure 300, and the openings 160 may be formed by selectively removing the sacrificial layers 112 from the insulating structure 300. The trenches 150 and the openings 160 may be formed using the same method as that of the previous embodiments described with reference to FIGS. 15 and 16.

The electrode insulating layer 164 may be formed on a sidewall of the first semiconductor pattern 128 exposed by the opening 160. The electrode insulating layer 164 may be formed of, for example, oxide. The electrode insulating layer 164 may be formed to be thinner than the peripheral gate insulating layer 12.

Figure 23:
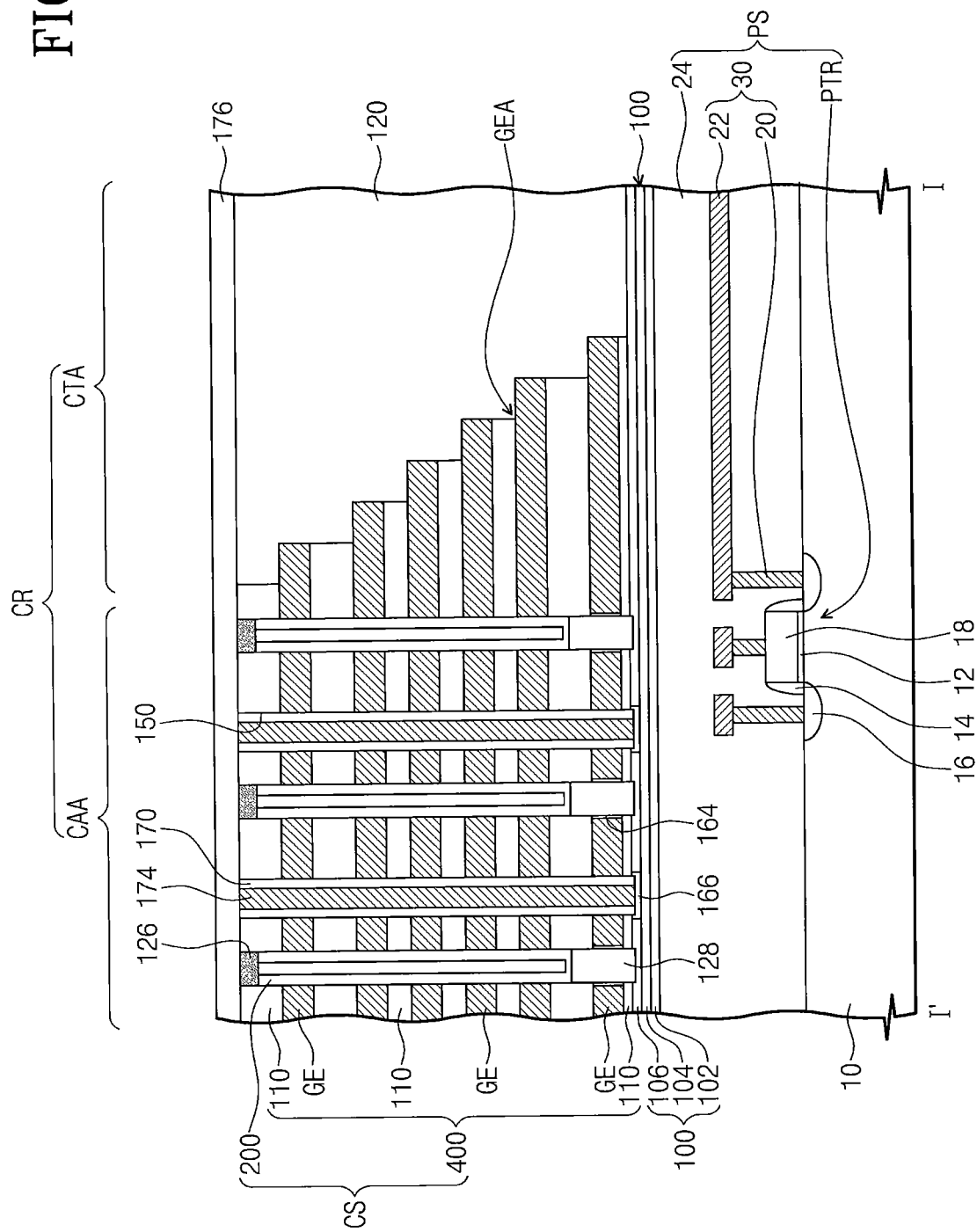

Referring to FIG. 23, the electrodes GE, the vertical structures 200, and the common source region 166 may be formed on the cell array region CAA. The electrodes GE may be formed to fill the openings 160, respectively, and each of the vertical structures 200 may be formed to penetrate the electrodes GE. The electrodes GE may extend from the cell array region CAA to the connection region CTA and may have the pad portions GEA positioned on the connection region CTA. The pad portions GEA of the electrodes GE may be formed to have a stepwise sidewall profile. The electrodes GE and the insulating layers 110 may be alternatingly and repeatedly stacked to constitute the stack 400. Furthermore, the stack 400, the vertical structures 200, and the common source region 166 may constitute the cell array structure CS. The vertical structures 200 may be formed to vertically penetrate the stacks 400, and, thus, the electrodes GE may surround the vertical structures 200. Each of the stacks 400 may have a stepwise sidewall profile on the connection region CTA. In addition, the insulating isolation spacer 170 and the common source plug 174 may be formed in each of the trenches 150.

The electrodes GE, the stack 400, the cell array structure CS, the common source region 166, the insulating isolation spacer 170, and the common source plug 174 may be formed using the same method as that of the previous embodiments described with reference to FIG. 17.

The capping insulating layer 176 may be formed on the stack 400 and the upper mold insulating layer 120.

Thereafter, as shown in FIG. 5, the bit line contacts 178 and the bit lines BL may be formed on the cell array region CAA, and the first to third contacts 180, 182, and 184, the first and second upper interconnection lines 190 and 192, and the pick-up region 186 may be formed on the connection region CTA. They may be formed using the same method as that of the previous embodiments described with reference to FIGS. 18 and 19.

Figure 24:
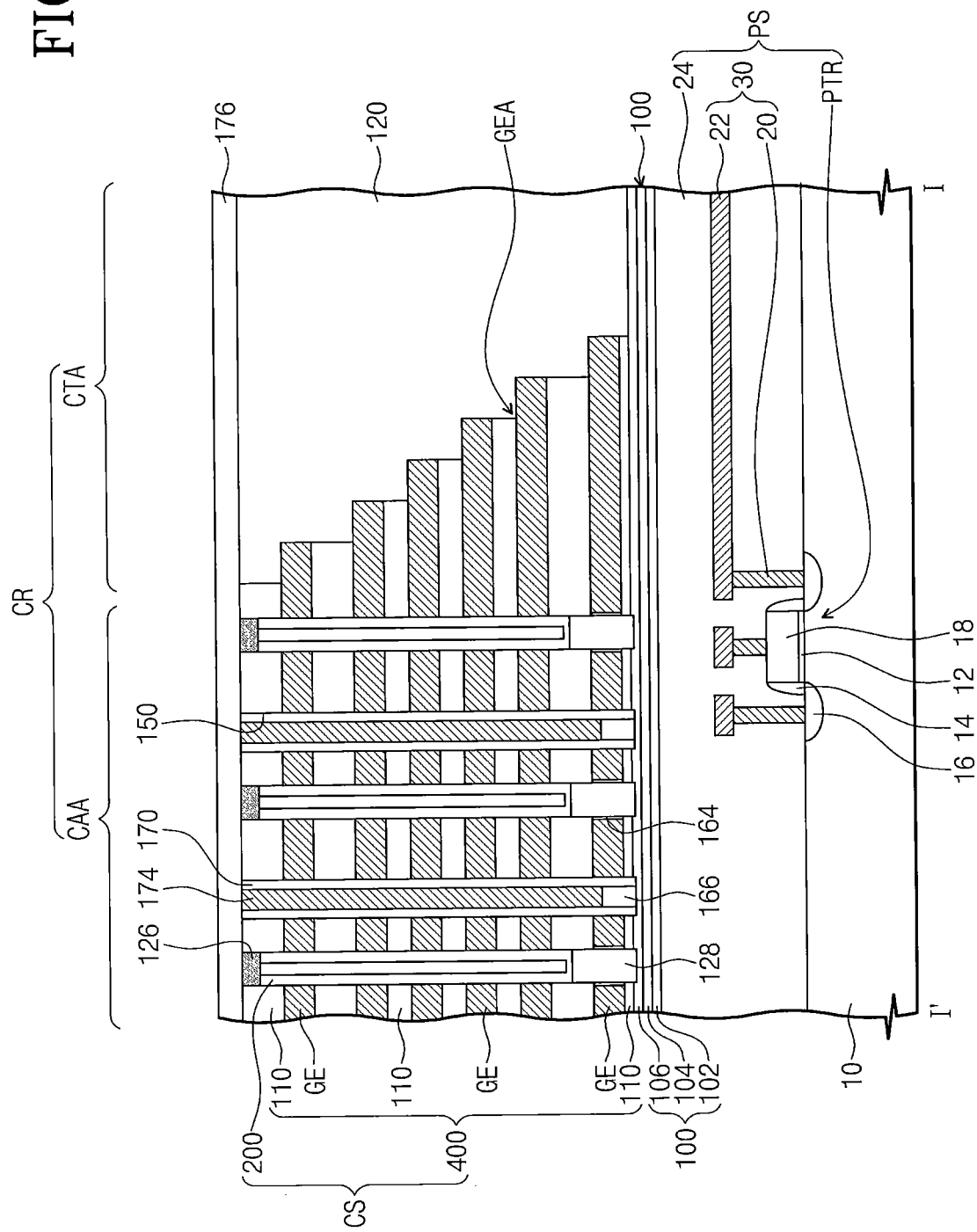
FIG. 24 is a sectional view taken along line I-I' of FIG. 1 to exemplarily illustrate some intermediate steps of a fabrication process for fabricating the three-dimensional semiconductor memory device of FIG. 6.

FIG. 24 is a sectional view taken along line I-II of FIG. 1 to exemplarily illustrate some intermediate steps of a fabrication process for fabricating the three-dimensional semiconductor memory device of FIG. 6.

In the fabrication process according to the present embodiment, fabrication steps from the peripheral circuit structure PS to the openings 160 may be substantially the same as those of the fabrication process described with reference to FIGS. 10 through 13 and 20 through 22, and thus, a detailed explanation thereof is omitted below to avoid redundancy.

Referring to FIG. 24, the electrodes GE, the vertical structures 200, and the common source region 166 may be formed on the cell array region CAA. The electrodes GE may be formed to fill the openings 160, respectively, and each of the vertical structures 200 may be formed to penetrate the electrodes GE. The electrodes GE and the insulating layers 110 may be alternatingly and repeatedly stacked to constitute the stack 400, and the stack 400, the vertical structures 200, and the common source region 166 may constitute the cell array structure CS. The electrodes GE may be formed using the same method as that of the previous embodiments described with reference to FIG. 17.

The insulating isolation spacer 170 may be formed on an inner side surface of the trench 150. The common source region 166 may be formed in a lower portion of the trench 150. For example, the common source region 166 may be formed in the lower portion of the trench 150 provided with the insulating isolation spacer 170. The common source region 166 may be the second semiconductor pattern. For example, the common source region 166 may include at least one of silicon (Si), germanium (Ge), silicon germanium (SiGe), gallium arsenic (GaAs), indium gallium arsenic (InGaAs), aluminum gallium arsenic (AlGaAs), or mixtures thereof.

The common source region 166 may be an epitaxial pattern that is formed by an epitaxial growth process using the third active semiconductor layer 106 of the horizontal active layer 100 as a seed layer. In example embodiments, the common source region 166 may be formed to have a polycrystalline structure. As an example, the common source region 166 may be a poly silicon pattern. In other example embodiments, the common source region 166 may be formed of a single-crystalline semiconductor material (e.g., a single-crystalline silicon layer).

Because the common source region 166 is formed on the horizontal active layer 100, a length of an impurity diffusion path between the first active semiconductor layer 102 and the common source region 166 can be increased, and thus, it is possible to more effectively reduce or prevent the junction leakage current from occurring. The common source region 166 may contain n-type impurities (e.g., arsenic (As) or phosphorus (P)), and in the common source region 166, the dopant concentration may range from about $1\times10^{19}$ ions/cm$^3$ to about $1\times10^{21}$ ions/cm$^3$. The common source region 166 may be doped in an in-situ manner during the epitaxial growth process or may be doped by an ion implantation process after the epitaxial growth process.

The common source plug 174 may be formed on and be connected to the common source region 166. The common source region 166 may extend parallel to the first direction D1. The common source plug 174 may extend parallel to the common source region 166 or the first direction D1 or may be in contact with a portion of the common source region 166.

Thereafter, as shown in FIG. 6, the bit line contact 178 and the bit line BL may be formed on the cell array region CAA, and the first to third contacts 180, 182, and 184, the first and second upper interconnection lines 190 and 192, and the pick-up region 186 may be formed on the connection region CTA. They may be formed using the same method as that of the previous embodiments described with reference to FIGS. 18 and 19.

Figure 25A:
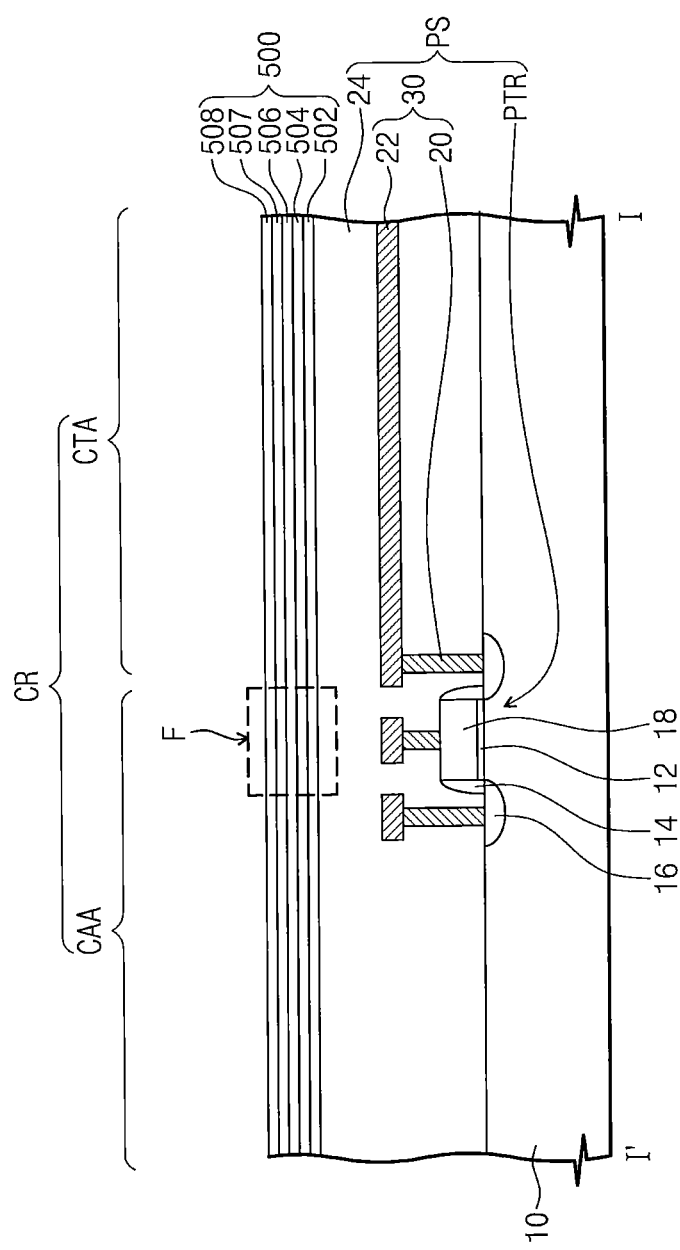
Figure 25B:
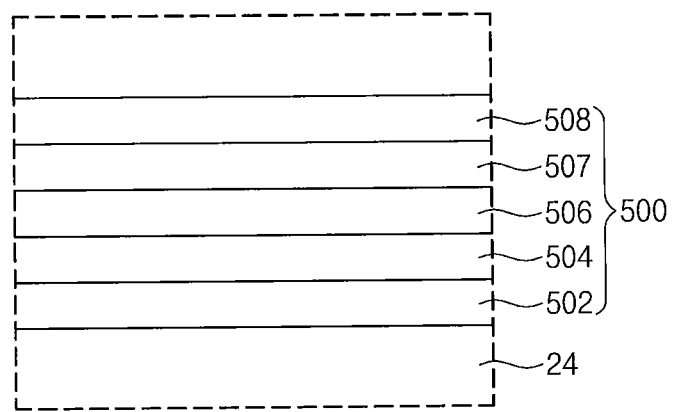
FIGS. 25B and 26B are enlarged views illustrating a portion F of FIG. 25A and a portion G of FIG. 26A, respectively.
Figure 26B:
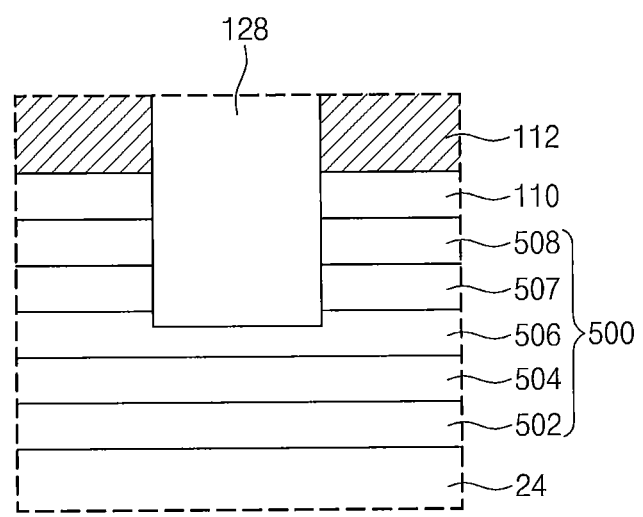

FIGS. 25A, 26A, 27 and 28 are sectional views taken along line I-I' of FIG. 1 to exemplarily illustrate some intermediate steps of a fabrication process for fabricating the three-dimensional semiconductor memory device of FIG. 7, and FIGS. 25B and 26B are enlarged views illustrating a portion F of FIG. 25A and a portion G of FIG. 26A, respectively.

Hereinafter, for concise description, an element or step previously described with reference to FIGS. 10 through 19 may be identified by a similar or identical reference number without repeating an overlapping description thereof.

Referring to FIGS. 25A and 25B, the horizontal active layer 500 may be formed on the substrate 10 provided with the peripheral circuit structure PS. For example, the horizontal active layer 500 may be formed on the lower mold insulating layer 24 covering the peripheral circuit structure PS. The horizontal active layer 500 may be formed on the cell array region CAA and the connection region CTA of the substrate 10. The horizontal active layer 500 may include the first active semiconductor layer 502, the second active semiconductor layer 504, the third active semiconductor layer 506, the buffer insulating layer 507, and the fourth active semiconductor layer 508 that are sequentially formed on the lower mold insulating layer 24. According to the present embodiment, the first to third active semiconductor layers 502, 504, and 506 may be formed to have substantially the same material and structure as the first to third active semiconductor layers 102, 104, and 106 of the horizontal active layer 100 described with reference to FIGS. 11A and 11B, except that the third active semiconductor layer 506 is formed of an undoped semiconductor material. Further, the first to third active semiconductor layers 502, 504, and 506 may be formed using the same method as that for forming the first to third active semiconductor layers 102, 104, and 106.

The buffer insulating layer 507 may be formed on the third active semiconductor layer 506. The buffer insulating layer 507 may be formed using a CVD or ALD process. The buffer insulating layer 507 may be formed of an oxide layer, a nitride layer, or an oxynitride layer. In some embodiments, the buffer insulating layer 507 may be formed to have a thickness ranging from about 10 nm to about 200 nm.

The fourth active semiconductor layer 508 may be formed on the buffer insulating layer 507. The fourth active semiconductor layer 508 may be formed to have a thickness ranging from about 100 nm to about 200 nm. Thicknesses of the third and fourth active semiconductor layers 506 and 508 may be equal to or different from each other. For example, the fourth active semiconductor layer 508 may be thicker than the third active semiconductor layer 506. The fourth active semiconductor layer 508 may be doped with, for example, p-type impurities (e.g., boron (B)). For example, the fourth active semiconductor layer 508 may be lightly doped to have a doping concentration ranging from about $1\times10^{15}$ ions/cm$^3$ to about $1\times10^{18}$ ions/cm$^3$. In example embodiments, the fourth active semiconductor layer 508 may be a boron-doped polysilicon layer, which is formed by a CVD process using a boron-containing gas and a silicon-containing gas or by injecting ions of B or $BF_2$ into a polysilicon layer. In some embodiments, the fourth active semiconductor layer 508 may not be doped with impurities. For example, the fourth active semiconductor layer 508 may be an undoped polysilicon layer. In example embodiments, the fourth active semiconductor layer 508 may be formed by a chemical vapor deposition (CVD) process, which is performed at a temperature of about 400° C.-600° C. and under a pressure of about 1 Torr-4 Torr using a silicon source gas (e.g., $SiH_4$ or $Si_2H_6$) and a low-concentration boron source gas (e.g., $BCl_3$ or $B_2H_6$). Alternatively, the fourth active semiconductor layer 508 may be formed by a chemical vapor deposition (CVD) process, which is performed at a temperature of about 400° C.-600° C. and under a pressure of about 1 Torr-4 Torr using only the silicon source gas (e.g., $SiH_4$ or $Si_2H_6$).

In some embodiments, the fourth active semiconductor layer 508 may be a single-crystalline silicon layer.

Referring to FIGS. 26A and 26B, the insulating layers 110 and the sacrificial layers 112 may be alternatingly and repeatedly formed on the horizontal active layer 500, thereby forming the insulating structure 300 on the cell array region CAA and the connection region CTA. The insulating structure 300 may be formed to have the stepwise sidewall profile on the connection region CTA. In some embodiments, the horizontal active layer 500 may be formed to have an end portion on the connection region CTA.

The vertical holes 124 may be formed to penetrate the insulating structure 300 on the cell array region CAA. The vertical holes 124 may be formed to penetrate the fourth active semiconductor layer 508 and the buffer insulating layer 507 and expose the third active semiconductor layer 506. As shown in FIG. 26B, the third active semiconductor layer 506 may be partially recessed by the vertical holes 124.

The first semiconductor pattern 128 may be formed in a lower portion of each vertical hole 124, and the vertical structure 200 may be formed on the first semiconductor pattern 128. The first semiconductor pattern 128 may extend upwardly from the third active semiconductor layer 506 and may have a top surface higher than that of the lowermost one of the sacrificial layers 112 relative to the substrate 10. The first semiconductor pattern 128 may be formed by an epitaxial growth process. In example embodiments, the first semiconductor pattern 128 may be formed to have a polycrystalline structure, but example embodiments of the inventive concepts may not be limited thereto. For example, the first semiconductor pattern 128 may be formed to have a single-crystalline structure. The first semiconductor pattern 128 may include at least one of, for example, silicon (Si), germanium (Ge), silicon germanium (SiGe), gallium arsenic (GaAs), indium gallium arsenic (InGaAs), aluminum gallium arsenic (AlGaAs), or mixtures thereof. According to the present embodiments, the first semiconductor pattern 128 may be used as a channel region of the ground selection transistor GST, which is controlled by the lowermost one of the electrodes GE. In this case, to adjust a threshold voltage of the ground selection transistor GST, the first semiconductor pattern 128 may be doped with impurities (e.g., boron (B)).

In example embodiments, as described with reference to FIG. 14B, the vertical structure 200 may include the memory pattern 130 covering the inner side surface of the vertical hole 124, the vertical pillar 140 serving as the vertical channel pattern, and the insulating gap-filling pattern 144. Here, the memory pattern 130 may include the first blocking insulating layer 132, the charge storing layer 134, and the tunnel insulating layer 136, which are sequentially formed on the inner side surface of the vertical hole 124. The vertical channel pattern 140 may be in direct contact with and be electrically connected to the first semiconductor pattern 128.

In other example embodiments, as described with reference to FIG. 14C, the vertical structure 200 may include the memory pattern 130, the vertical pillar 140 serving as the vertical-pillar-shaped electrode, and the insulating gap-filling pattern 144, which are sequentially formed on the inner side surface of the vertical hole 124. The vertical pillar 140 serving as the vertical-pillar-shaped electrode may be in direct contact with and be electrically connected to the first semiconductor pattern 128.

The conductive pads 126 may be formed on the vertical structures 200, respectively. The upper mold insulating layer 120 may be formed adjacent to the sidewall of the insulating structure 300. The upper mold insulating layer 120 may be formed on the horizontal active layer 500 to cover the stepwise sidewall of the insulating structure 300. In some embodiments, the upper mold insulating layer 120 may be formed on the lower mold insulating layer 24 to cover the end portions of the horizontal active layer 100.

Figure 27:
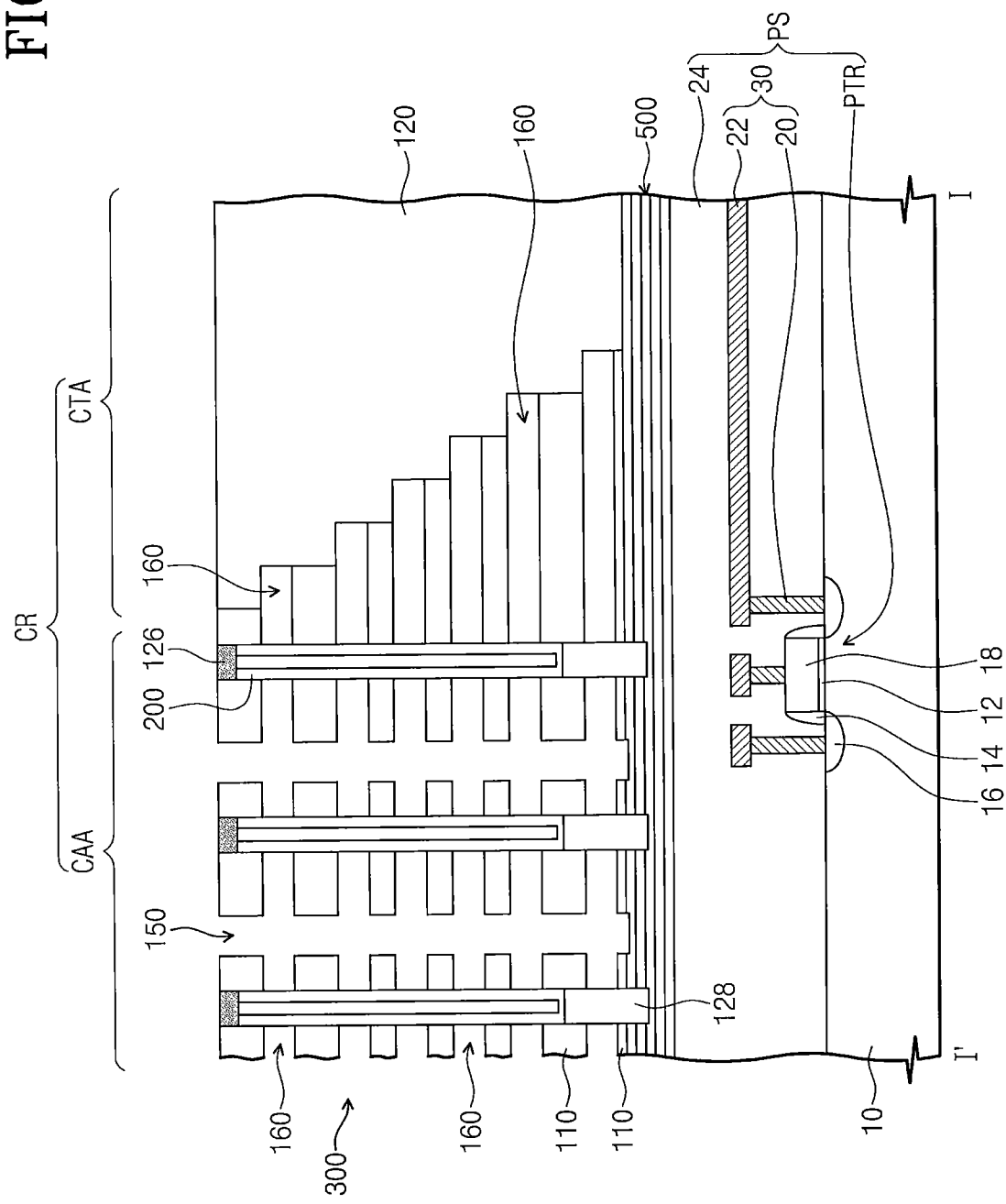

Referring to FIG. 27, the trenches 150 may be formed on the cell array region CAA to penetrate the insulating structure 300. The trenches 150 may be formed to expose the fourth horizontal semiconductor layer 508. The fourth active semiconductor layer 508 may be partially recessed during the formation of the trenches 150. The sacrificial layers 112 exposed by the trenches 150 may be removed to form the openings 160 on the cell array region CAA and the connection region CTA.

Figure 28:
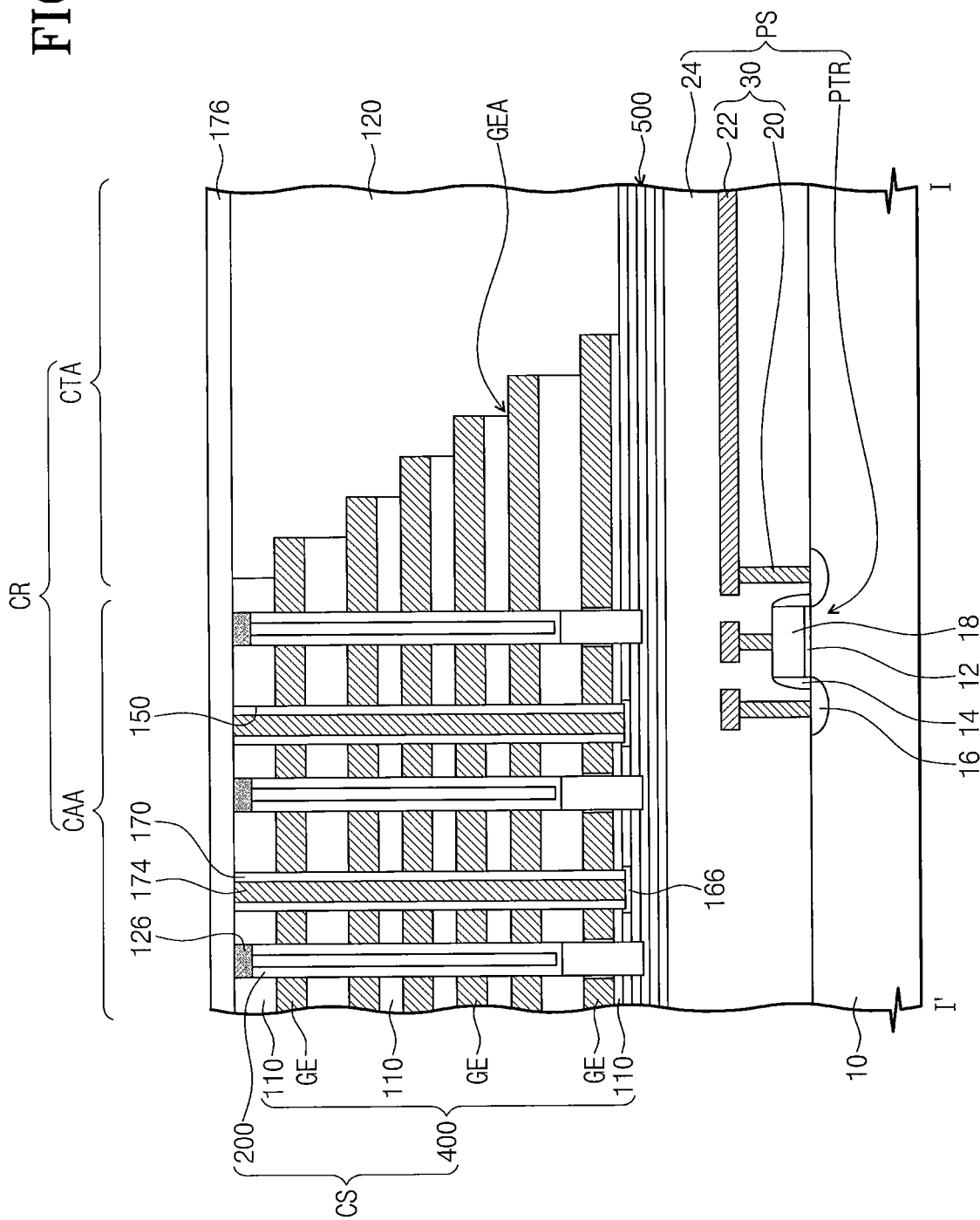

Referring to FIG. 28, the electrodes GE may be formed on the cell region CR. The electrodes GE may constitute a portion of the cell array structure CS that is provided on the cell array region CAA. For example, the cell array structure CS may include the stacks 400, the vertical structures 200 penetrating the stacks 400, and the common source region 166, and each of the stacks 400 may include the electrodes GE provided in the openings 160, respectively. In addition, the insulating isolation spacer 170 and the common source plug 174 may be formed in each of the trenches 150. The capping insulating layer 176 may be formed on the upper mold insulating layer 120 and the stack 400. The electrodes GE and the stacks 400 may be formed using the same method as that of the previous embodiments described with reference to FIG. 17. The common source region 166 may be formed in the fourth active semiconductor layer 508 exposed by the trench 150. The common source region 166 may contain n-type impurities (e.g., arsenic (As) or phosphorus (P)) of high concentration. In the common source region 166, the dopant concentration may range from about $1 \times 10^{19}$ ions/cm$^3$ to about $1 \times 10^{21}$ ions/cm$^3$. The common source region 166 may extend parallel to the first direction D1, as shown in FIG. 1. The insulating isolation spacer 170 may be formed to separate the electrodes GE electrically from the common source plug 174. The common source plug 174 may be connected to the common source region 166 and may extend parallel to the first direction D1. The electrode insulating layer 164 may be formed on the sidewall of the first semiconductor pattern 128 and may separate the electrode GE and the first semiconductor pattern 128. In some embodiments, as shown in FIG. 3A, the second blocking insulating layer 138 may be formed to conformally cover top, bottom, and side surfaces of the electrode GE.

Thereafter, as shown in FIG. 7, the bit line contacts 178 and the bit lines BL may be formed on the cell array region CAA, and the first and third contacts 180 and 184, the first and second upper interconnection lines 190 and 192, and the pick-up region 186 may be formed on the connection region CTA. They may be formed using the same method as that of the previous embodiments described with reference to FIGS. 18 and 19.

On the connection region CTA, the pick-up region 186 may be formed in the second and third active semiconductor layers 504 and 506 and may be coupled to the first active semiconductor layer 502. As shown in FIG. 1, the pick-up region 186 may be formed to be adjacent to both side walls of the stack 400, when viewed in the first direction D1. In some embodiments, a plurality of pick-up regions 186 may be provided to be spaced apart from each other in the second direction D2. The second contacts 182 may be formed to penetrate the capping insulating layer 176, the upper mold insulating layer 120, the fourth active semiconductor layer 508, and the buffer insulating layer 507, and may be electrically connected to the pick-up region 186. In example embodiments, the pick-up diffusion barrier region 188 may be formed to partially cover a side surface of the pick-up region 186. As shown in FIG. 4B, the pick-up diffusion barrier region 188 may be formed in the third active semiconductor layer 506 to surround at least a portion of the side surface of the pick-up region 186. In example embodiments, as shown in FIG. 4C, the pick-up region 186 may not be formed on or in the horizontal active layer 500. For example, the second contact 182 may be formed to penetrate the second to fourth active semiconductor layer 504, 506, and 508 and the buffer insulating layer 507 and may be directly coupled to the first active semiconductor layer 502.

Figure 29:
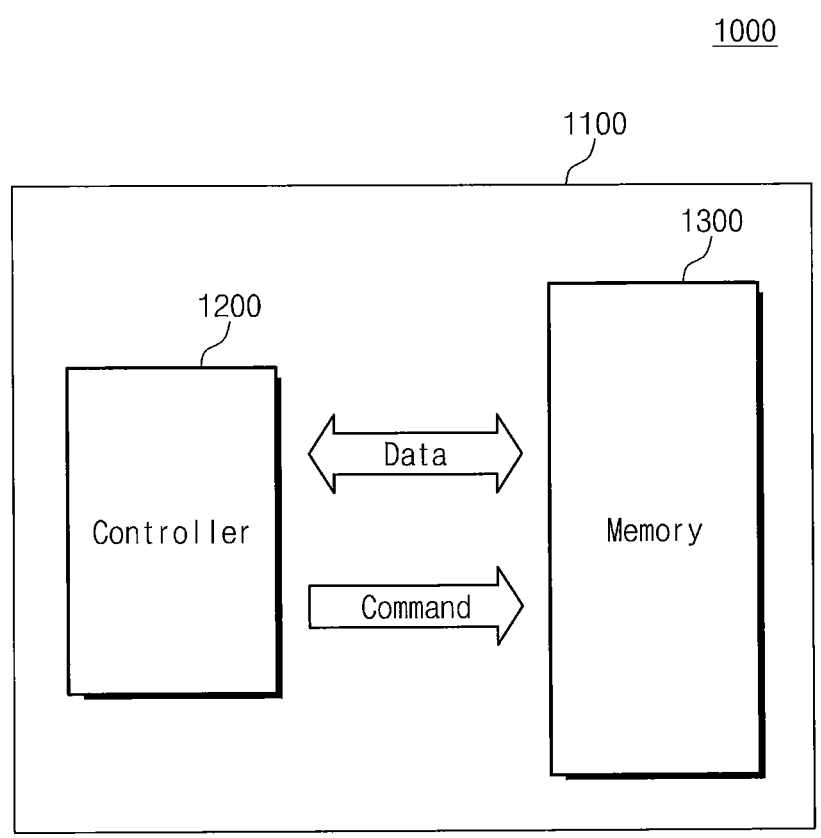
FIG. 29 is a schematic block diagram illustrating an example of memory systems including a three-dimensional semiconductor memory device according to example embodiments of the inventive concept.

FIG. 29 is a schematic block diagram illustrating an example of memory systems including a three-dimensional semiconductor memory device according to example embodiments of the inventive concept.

Referring to FIG. 29, a memory system 1000 may be configured to store data in at least one semiconductor device. For example, the memory system 1000 may be provided in the form of a memory card or a solid state drive (SSD). The memory system 1000 may include a controller 1200 and a memory device 1300 provided in a housing 1100. The memory system 1000 may be configured to allow electrical signals to be exchanged between the controller 1200 and the memory device 1300. For example, an operation of exchanging data between the memory device 1300 and the controller 1200 may be executed in response to commands from the controller 1200. In other words, the memory system 1000 may be configured to store data in the memory device 1300 or send data stored in the memory device 1300 to the outside thereof. The memory device 1300 may include one or more of the three-dimensional semiconductor memory devices according to example embodiments of the inventive concept.

Figure 30:
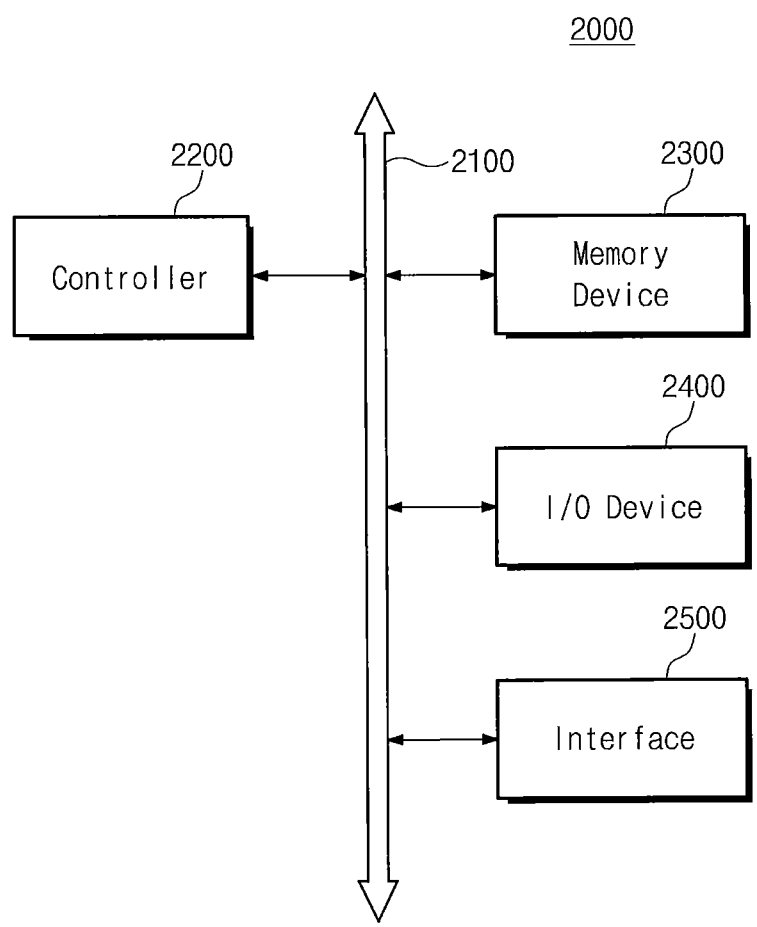
FIG. 30 is a schematic block diagram illustrating an example of electronic systems including a three-dimensional semiconductor memory device according to example embodiments of the inventive concept.

FIG. 30 is a schematic block diagram illustrating an example of electronic systems including a three-dimensional semiconductor memory device according to example embodiments of the inventive concept.

Referring to FIG. 30, an electronic system 2000 may include a controller 2200, a memory device 2300, and an input-output unit 2400. The controller 2200, the memory device 2300, and the input-output unit 2400 may be electrically coupled or connected to each other via a bus 2100. The bus 2100 may correspond to a path through which electrical signals or data are transmitted. The controller 2200 may include at least one of a microprocessor, a digital signal processor, a microcontroller, or a logic device. The logic device may have a similar function to any one of the microprocessor, the digital signal processor and the microcontroller. The input-output unit 2400 may include at least one of a keypad, a keyboard, or a display device. The memory device 2300 may store data and/or commands executed by the controller 2200. The memory device 2300 may include a volatile memory device and/or a nonvolatile memory device. For example, the memory device 2300 may include a FLASH memory device. Alternatively, the memory device 2300 may include a semiconductor disk drive (SSD) including, for example, at least one FLASH memory device, and in this case, the electronic system 2000 may stably store a large capacity of data. In certain embodiments, the memory device 2300 may include one or more three-dimensional semiconductor memory devices according to example embodiments of the inventive concept. The electronic system 2000 may further include an interface unit 2500 for transmitting or receiving data to or from a communication network through a wireless or wired way. For example, the interface unit 2500 may include an antenna for wireless communication or a transceiver for wired communication.

The three-dimensional semiconductor memory devices disclosed above may be encapsulated using various and diverse packaging techniques. For example, three-dimensional semiconductor memory devices according to the aforementioned embodiments may be encapsulated using any one of a package on package (POP) technique, a ball grid array (BGA) technique, a chip scale package (CSP) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a system in package (SIP) technique, a multi-chip package (MCP) technique, a wafer-level fabricated package (WFP) technique and a wafer-level processed stack package (WSP) technique. The package in which the three-dimensional semiconductor memory device according to one of the above embodiments is mounted may further include at least one semiconductor device (e.g., a controller and/or a logic device) that controls the three-dimensional semiconductor memory device.

According to example embodiments of the inventive concept, a horizontal active layer and a cell array structure are sequentially stacked on a peripheral circuit structure. The cell array structure may include a vertical structure vertically extending from the horizontal active layer. The horizontal active layer may include a highly-doped semiconductor layer, an impurity diffusion barrier layer, and a lightly-doped semiconductor layer, and such a structure of the horizontal active layer makes it possible to prevent or reduce the likelihood of an erase voltage from being slowly delivered in a semiconductor memory device and reduce or prevent unintended diffusion of impurities and the consequent junction leakage current. Accordingly, it is possible to realize three-dimensional semiconductor memory devices with high reliability.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a three-dimensional semiconductor memory device, comprising:
    forming a peripheral circuit device and a peripheral interconnection structure on a substrate;
    forming a lower mold insulating layer to cover the peripheral circuit device and the peripheral interconnection structure;
    forming a horizontal active layer on the lower mold insulating layer, the horizontal active layer comprising first, second, and third active semiconductor layers sequentially stacked on the lower mold insulating layer;
    forming a cell array structure on the horizontal active layer;
    forming a pick-up region in the horizontal active layer and around the cell array structure, wherein the pick-up region is formed to have the first conductivity type; and
    forming a pick-up diffusion barrier region in the third active semiconductor layer to surround at least a portion of a side surface of the pick-up region, wherein the pick-up diffusion barrier region comprises carbon,
    wherein the first active semiconductor layer is doped with impurities to have a first conductivity type and a first concentration, the second active semiconductor layer comprises an impurity diffusion restraining material inhibiting diffusion of the impurities in the first active semiconductor layer into the second active semiconductor layer, and the third active semiconductor layer is doped with impurities to have the first conductivity type and a second concentration different from the first concentration, or is in an undoped state.

2. The method of claim 1, wherein the forming of the cell array structure comprises:
    forming a plurality of stacks arranged parallel to each other,
    forming vertical structures penetrating the stacks, and
    forming a common source region between ones of the stacks to extend parallel to the stacks.

3. The method of claim 1, wherein the second active semiconductor layer comprises carbon.

4. The method of claim 1, wherein the forming of the peripheral circuit device and the peripheral interconnection structure comprises:
    forming the peripheral circuit device on the substrate, the peripheral circuit device comprising a gate electrode and source/drain regions, and
    forming the peripheral interconnection structure on the substrate, the peripheral interconnection structure comprising a contact connected to the peripheral circuit device and an interconnection line connected to the contact.

5. The method of claim 1, further comprising forming a contact connected to the pick-up region.

6. The method of claim 1, further comprising sequentially forming a buffer insulating layer and a fourth active semiconductor layer on the third active semiconductor layer.

7. The method of claim 6, further comprising terming a semiconductor pattern penetrating the buffer insulating layer and the fourth active semiconductor layer and being in contact with the third active semiconductor layer.

8. The method of claim 6, wherein the cell array structure comprises a plurality of stacks arranged parallel to each other, vertical structures penetrating the stacks, and a common source region between the stacks to extend parallel to the stacks, and wherein the forming of the common source region comprises forming an impurity region in the fourth active semiconductor layer to have a second conductivity type.

9. A method of fabricating a three-dimensional semiconductor memory device, comprising:

forming a peripheral circuit device and a peripheral interconnection structure on a substrate;

forming a lower mold insulating layer to cover the peripheral circuit device and the peripheral interconnection structure;

forming a horizontal active layer on the lower mold insulating layer, the horizontal active layer comprising first, second, and third active semiconductor layers sequentially stacked on the lower mold insulating layer; and forming a cell array structure on the horizontal active layer, wherein the first active semiconductor layer is doped with impurities to have a first conductivity type and a first concentration, the second active semiconductor layer comprises an impurity diffusion restraining material inhibiting diffusion of the impurities in the first active semiconductor layer into the second active semiconductor layer, and the third active semiconductor layer is doped with impurities to have the first conductivity type and a second concentration different from the first concentration, or is in an undoped state, wherein a cell array comprises a plurality of stacks provided parallel to a first direction on the horizontal active layer, each of the stacks comprising a plurality of electrodes vertically stacked on the horizontal active layer, such that a topmost one of the first, second, and third active semiconductor layers of the horizontal active layer is between the substrate and lowermost electrodes of the plurality of electrodes.

10. The method of claim 9, wherein the forming of the horizontal active layer comprises:

forming the second active semiconductor layer, which is doped with carbon, directly on the first active semiconductor layer, and forming the third active semiconductor layer directly on the second active semiconductor layer.

11. The method of claim 10, further comprising sequentially thrilling a buffer insulating layer and a fourth active semiconductor layer on the third active semiconductor layer.

12. The method of claim 9, further comprising forming a pick-up region in the horizontal active layer, wherein the pick-up region is connected to a first contact and is formed to have the first conductivity type.

* * * * *